US012794475B2

(12) United States Patent
Fujita et al.

(10) Patent No.: US 12,794,475 B2
(45) Date of Patent: Nov. 10, 2026

(54) SEMICONDUCTOR DEVICE AND OPERATION METHOD OF THE SEMICONDUCTOR DEVICE

(71) Applicant: Semiconductor Energy Laboratory Co., Ltd., Kanagawa-ken (JP)

(72) Inventors: Masashi Fujita, Fuchu (JP); Yoshiyuki Kurokawa, Sagamihara (JP); Hiromichi Godo, Isehara (JP); Kazuaki Ohshima, Atsugi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 19/125,994

(22) PCT Filed: Oct. 27, 2023

(86) PCT No.: PCT/IB2023/060832
§ 371 (c)(1),
(2) Date: Apr. 30, 2025

(87) PCT Pub. No.: WO2024/095109
PCT Pub. Date: May 10, 2024

(65) Prior Publication Data

US 2026/0180580 A1 Jun. 25, 2026

(30) Foreign Application Priority Data

Nov. 4, 2022 (JP) ................................ 2022-177161
Jan. 20, 2023 (JP) ................................ 2023-007017

(51) Int. Cl.
*H03K 19/0185* (2006.01)
*G09G 3/20* (2006.01)
*H03K 3/356* (2006.01)

(52) U.S. Cl.
CPC ....... *H03K 19/018521* (2013.01); *G09G 3/20* (2013.01); *H03K 3/356017* (2013.01)

(58) Field of Classification Search
CPC ..... H03K 19/018521; H03K 3/356017; G09G 3/20
(Continued)

(56) References Cited

U.S. PATENT DOCUMENTS 6,140,686 A 10/2000 Mizuno et al.
6,157,361 A * 12/2000 Kubota ................ G09G 3/3674 327/333
(Continued)

FOREIGN PATENT DOCUMENTS

CN 111033438 A 4/2020
DE 112018004814 6/2020
(Continued)

OTHER PUBLICATIONS

International Search Report (Application No. PCT/IB2023/060832) Dated Jan. 23, 2024.
(Continued)

*Primary Examiner* — Arnold M Kinkead
(74) *Attorney, Agent, or Firm* — Husch Blackwell LLP

(57) ABSTRACT

A semiconductor device or the like with reduced power consumption is provided. A highly reliable semiconductor device or the like is provided. A semiconductor device or the like in which an increase in circuit layout area is inhibited is provided. A power-saving semiconductor device is provided. A semiconductor device or the like having excellent computing performance is provided. An output from a level shifter is supplied to a first buffer circuit. An output from the level shifter is supplied to a second buffer circuit through the first buffer circuit. By supplying an output from the first buffer circuit to a first register group, in each of a plurality
(Continued)

of registers in a first register group, data of a scan flip-flop is saved in a storage circuit. By supplying an output from the second buffer circuit to a second register group, in each of a plurality of registers in a second register group, the data of the scan flip-flop is saved in the storage circuit.

11 Claims, 27 Drawing Sheets

(58) Field of Classification Search
USPC .................... 326/68; 327/333, 112; 323/315
See application file for complete search history.

(56) References Cited

U.S. PATENT DOCUMENTS

| | | | |
|---|---|---|---|
| 6,404,232 | B1 | 6/2002 | Mizuno et al. |
| 6,906,551 | B2 | 6/2005 | Mizuno et al. |
| 7,112,999 | B2 | 9/2006 | Mizuno et al. |
| 7,397,282 | B2 | 7/2008 | Mizuno et al. |
| 7,518,404 | B2 | 4/2009 | Mizuno et al. |
| 8,193,833 | B2 | 6/2012 | Inukai |
| 8,575,985 | B2 | 11/2013 | Ohmaru et al. |
| 8,629,693 | B2 | 1/2014 | Inukai |
| 9,024,669 | B2 | 5/2015 | Ohmaru et al. |
| 9,330,759 | B2 | 5/2016 | Ohmaru et al. |
| 9,818,749 | B2 | 11/2017 | Ohmaru et al. |
| 9,882,578 | B1 | 1/2018 | Haneda |
| 10,122,377 | B2 | 11/2018 | Haneda |
| 10,234,891 | B2 | 3/2019 | Kamezawa et al. |
| 10,901,453 | B2 | 1/2021 | Kamezawa et al. |
| 11,275,993 | B2 | 3/2022 | Ishizu et al. |
| 11,868,877 | B2 | 1/2024 | Ishizu et al. |
| 12,229,661 | B2 | 2/2025 | Ishizu et al. |
| 12,243,482 | B2 | 3/2025 | Yamazaki et al. |
| 2013/0285049 | A1 | 10/2013 | Ohmaru et al. |
| 2014/0333365 | A1* | 11/2014 | Takahashi ...... H03K 19/018507 327/333 |
| 2016/0006433 | A1 | 1/2016 | Ishizu et al. |
| 2016/0173097 | A1* | 6/2016 | Inoue .................... G11C 11/403 327/333 |
| 2020/0250521 | A1 | 8/2020 | Ishizu et al. |

FOREIGN PATENT DOCUMENTS

| | | | |
|---|---|---|---|
| JP | 10-190444 | A | 7/1998 |
| JP | 2011-163983 | A | 8/2011 |
| JP | 2013-009297 | A | 1/2013 |
| JP | 2013-243351 | A | 12/2013 |
| JP | 2013-243353 | A | 12/2013 |
| JP | 2016-027701 | A | 2/2016 |
| JP | 2018-019118 | A | 2/2018 |
| JP | 2019-046199 | A | 3/2019 |
| JP | 2019-215881 | A | 12/2019 |
| KR | 2020-0050949 | A | 5/2020 |
| KR | 2023-0112706 | A | 7/2023 |
| WO | WO-2019/048982 | | 3/2019 |
| WO | WO-2022/118141 | | 6/2022 |

OTHER PUBLICATIONS

Written Opinion (Application No. PCT/IB2023/060832) Dated Jan. 23, 2024.

* cited by examiner

SEMICONDUCTOR DEVICE AND OPERATION METHOD OF THE SEMICONDUCTOR DEVICE

This application is a 371 of international application PCT/IB2023/060832 filed on Oct. 27, 2023, which is incorporated herein by reference.

TECHNICAL FIELD

One embodiment of the present invention relates to a semiconductor device and the like.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a semiconductor device, a display device, a light-emitting device, a power storage device, a storage device (memory device), an operation method thereof, a driving method thereof, and a manufacturing method thereof.

Note that in this specification and the like, a semiconductor device refers to a device that utilizes semiconductor characteristics, and means a circuit including a semiconductor element (a transistor, a diode, a photodiode, or the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. In some cases, a storage device, a display device, a light-emitting device, a lighting device, an electronic device, and the like themselves are semiconductor devices and also include a semiconductor device.

BACKGROUND ART

The technical development of a semiconductor device that can retain charge corresponding to data by combining a transistor including an oxide semiconductor in a semiconductor layer where a channel is formed (also referred to as an "OS transistor") and a transistor including silicon in a semiconductor layer where a channel is formed (also referred to as a "Si transistor") has been progressed.

Patent Document 1 discloses an example of a CPU (Central Processing Unit) in which power consumption is reduced by power gating. Patent Document 2 to Patent Document 4 each have proposed a semiconductor device using a standard cell including a Si transistor and an OS transistor.

REFERENCES

Patent Documents

[Patent Document 1] Japanese Published Patent Application No. 2013-9297
[Patent Document 2] Japanese Published Patent Application No. 2013-243351
[Patent Document 3] Japanese Published Patent Application No. 2013-243353

[Patent Document 4] Japanese Published Patent Application No. 2016-27701

SUMMARY OF THE INVENTION

Problems to be Solved by the Invention

One object of one embodiment of the present invention is to provide a novel semiconductor device or the like. Another object is to provide a semiconductor device or the like with reduced power consumption. Another object is to provide a highly reliable semiconductor device or the like. Another object is to provide a semiconductor device or the like that can inhibit an increase in circuit layout area. Another object is to provide a power-saving semiconductor device or the like. Another object is to provide a semiconductor device or the like that is excellent in computing performance.

Another object of one embodiment of the present invention is to provide a method for operating a novel semiconductor device or the like, a semiconductor device or the like with reduced power consumption, a highly reliable semiconductor device or the like, a semiconductor device or the like that can inhibit an increase in circuit layout area, a power-saving semiconductor device or the like, or a semiconductor device or the like having excellent computing performance.

Another object of one embodiment of the present invention is to provide a novel storage device.

Another object of one embodiment of the present invention is to provide a method for operating a novel storage device.

Note that the objects of one embodiment of the present invention are not limited to the objects listed above. The objects listed above do not preclude the existence of other objects. Note that the other objects are objects that are not described in this section and are described below. The objects that are not described in this section are derived from the description of the specification, the drawings, and the like and can be extracted as appropriate from the description by those skilled in the art. Note that one embodiment of the present invention is to achieve at least one of the objects listed above and/or the other objects.

Means for Solving the Problems (1) One embodiment of the present invention is a semiconductor device including a level shifter, a signal adjustment portion, a first register group including a plurality of first registers, and a second register group including a plurality of second registers. The signal adjustment portion includes a first buffer circuit and a second buffer circuit. Each of the plurality of first registers includes a first scan flip-flop and a first storage circuit. Each of the plurality of second registers includes a second scan flip-flop and a second storage circuit. An output terminal of the level shifter is electrically connected to an input terminal of the first buffer circuit. An output terminal of the first buffer circuit is electrically connected to an input terminal of the second buffer circuit and the first register group. An output terminal of the second buffer circuit is electrically connected to the second register group. The level shifter has a function of boosting a first signal to generate a second signal and a function of outputting the second signal. The first buffer circuit has a function of generating and outputting a third signal using the second signal. The first register group has a function of saving, in the first storage circuit, first data retained in the first scan flip-flop in each of the plurality of first registers using the third signal. The second buffer circuit has a function of generating and outputting a fourth signal using the third signal. The second register group has a function of saving, in the second storage circuit, second data retained in the second scan flip-flop in each of the plurality of second registers using the fourth signal.

(2) In one embodiment described in (1), in each of the plurality of first registers, the first storage circuit preferably includes a first transistor containing an oxide semiconductor in a semiconductor layer. In each of the plurality of second registers, the second storage circuit preferably includes a second transistor containing an oxide semiconductor in a semiconductor layer. The output terminal of the first buffer circuit is preferably electrically connected to a gate of the first transistor in each of the plurality of first registers. The output terminal of the second buffer circuit is preferably electrically connected to a gate of the second transistor in each of the plurality of second registers.

(3) Another embodiment of the present invention is a method for operating a semiconductor device. The semiconductor device includes a power management unit, a signal adjustment portion, and a register group including a plurality of registers. The signal adjustment portion includes a buffer circuit, a first transistor, and a second transistor. Each of the plurality of registers includes a scan flip-flop and a storage circuit. The method for operating the semiconductor device includes a first step of turning on the first transistor and starting power supply to the buffer circuit; a second step of outputting a first signal to the register group by the power management unit through the buffer circuit and saving, in the storage circuit, data retained in the scan flip-flop in each of the plurality of registers; a third step of turning on the second transistor and supplying a second signal that is a low-potential level, in each of the plurality of registers included in the register group, to the storage circuit; and a fourth step of turning off the first transistor and stopping power supply to the buffer circuit.

(4) In one embodiment described in (3), in each of the plurality of registers, the storage circuit preferably includes a third transistor containing an oxide semiconductor in a semiconductor layer, and in the third step, in each of the plurality of registers, the second signal is preferably supplied to a gate of the third transistor included in the storage circuit.

(5) In one embodiment described in (3), one of a source and a drain of the second transistor is preferably electrically connected to an output terminal of the buffer circuit. In the first step to the fourth step, the other of the source and the drain of the second transistor is preferably supplied with a potential that is a low-potential level.

(6) Another embodiment of the present invention is a method for operating a semiconductor device. The semiconductor device includes a power management unit, a signal adjustment portion, and a register group including a plurality of registers. The signal adjustment portion includes a buffer circuit, a first transistor, and a second transistor. Each of the plurality of registers includes a scan flip-flop and a storage circuit. The method for operating the semiconductor device includes a first step of turning on the first transistor and starting power supply to the buffer circuit; a second step of outputting a first signal to the register group through the buffer circuit by the power management unit and saving, in the storage circuit, data retained in the scan flip-flop in each of the plurality of registers included in the register group; a third step of turning on the second transistor and supplying a second signal that is a low-potential level, in each of the plurality of registers included in the register group, to the storage circuit; a fourth step of turning off the first transistor and stopping power supply to the buffer circuit; a fifth step of turning on the first transistor and starting power supply to the buffer circuit; a sixth step of turning off the second transistor; a seventh step of outputting a third signal to the register group through the buffer circuit by the power management unit and reading out the data saved in the storage circuit to the scan flip-flop in each of the plurality of registers included in the register group, and an eighth step of turning off the first transistor and stopping power supply to the buffer circuit.

(7) In one embodiment described in (6), in each of the plurality of registers included in the register group, the storage circuit preferably includes a third transistor containing an oxide semiconductor in a semiconductor layer, a fourth transistor containing an oxide semiconductor in a semiconductor layer, and a capacitor. One electrode of the capacitor is preferably electrically connected to one of a source and a drain of the third transistor and one of a source and a drain of the fourth transistor. In the third step, the first signal is preferably supplied to a gate of the third transistor included in the storage circuit in each of the plurality of registers. In the seventh step, the third signal is preferably supplied to a gate of the fourth transistor included in the storage circuit in each of the plurality of registers included in the register group.

(8) In one embodiment described in (6), one of a source and a drain of the second transistor is preferably electrically connected to an output terminal of the buffer circuit. The other of the source and the drain of the second transistor is preferably supplied with a potential that is a low-potential level in the first step to the eighth step.

(9) Another embodiment of the present invention is a semiconductor device including a first layer and a second layer stacked over the first layer. The first layer includes a functional circuit including a first region, a first wiring including a region extending in a first direction, and a second wiring including a region extending in the first direction. The functional circuit includes a first transistor containing silicon in a semiconductor layer, a second transistor containing silicon in a semiconductor layer, and a third wiring. The first region is between the first wiring and the second wiring in a top view. The first transistor includes a first channel formation region and a first low-resistance region functioning as one of a source and a drain. The second transistor includes a second channel formation region. The first low-resistance region overlaps with the third wiring. One or more of the first channel formation region and the second channel formation region are in the first region. The second layer includes a storage circuit. The storage circuit includes a third transistor containing an oxide semiconductor in the semiconductor layer. The first layer or the second layer includes a fourth transistor. A gate of the first transistor is electically connected to a gate of the second transistor. The one of the source and the drain of the first transistor is electrically connected to the third wiring. One of a source and a drain of the second transistor is electrically connected to the second wiring. The other of the source and the drain of the first transistor, the other of the source and the drain of the second transistor, and a gate of the third transistor are electrically connected to one another. One of a source and a drain of the fourth transistor is electrically connected to the third wiring. A first high power supply potential is supplied to the first wiring, a low power supply potential is supplied to the second wiring, and a second high power supply potential higher than the first high power supply potential is supplied to the other of the source and the drain of the fourth transistor.

(10) In the structure described in (9), a first insulating layer is preferably over the first low-resistance region. The third wiring is preferably over the first insulating layer. The first low-resistance region is preferably electrically connected to the third wiring through a first plug provided in a first opening of the first insulating layer in a region overlapping with the third wiring.

(11) In the structure described in (9), it is preferable that the first layer include a second functional circuit, that the second functional circuit include a second region provided between the first wiring and the second wiring in the top view, that the first region and the second region be adjacent to each other in the top view, that the second functional circuit include an element region, and that the element region be electrically connected to the first wiring.

Effect of the Invention

One embodiment of the present invention can provide a novel semiconductor device or the like. A semiconductor device or the like with reduced power consumption can be provided. A highly reliable semiconductor device or the like can be provided. A semiconductor device or the like that can inhibit an increase in circuit layout area can be provided. A power-saving semiconductor device or the like can be provided. A semiconductor device or the like that is excellent in computing performance can be provided.

Another embodiment of the present invention can provide a method for operating a novel semiconductor device or the like, a semiconductor device or the like with reduced power consumption, a highly reliable semiconductor device or the like, a semiconductor device or the like that can inhibit an increase in circuit layout area, a power-saving semiconductor device or the like, or a semiconductor device or the like having excellent computing performance.

Another embodiment of the present invention can provide a novel storage device.

Another embodiment of the present invention can provide a method for operating a novel storage device.

Note that the description of these effects does not preclude the existence of other effects. One embodiment of the present invention does not necessarily have all these effects. Other effects will be apparent from the description of the specification, the drawings, the claims, and the like, and other effects can be derived from the description of the specification, the drawings, the claims, and the like.

MODE FOR CARRYING OUT THE INVENTION

Figure 1A:
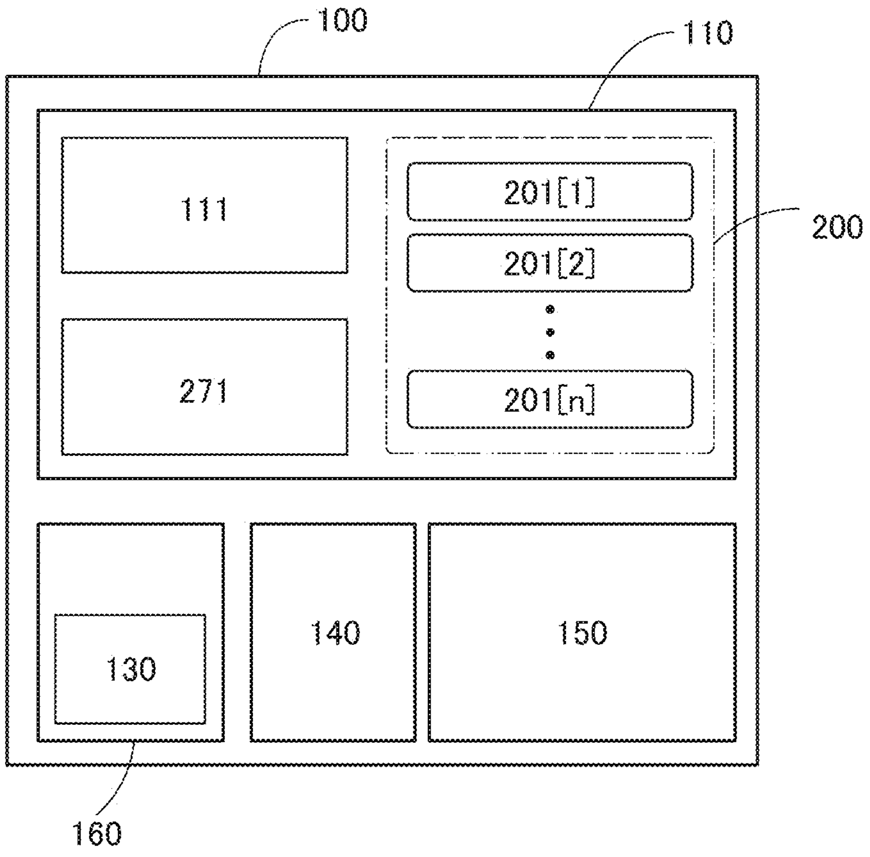
FIG. 1A is a diagram illustrating a structure example of a semiconductor device.

Embodiments will be described below with reference to the drawings. The embodiments can be implemented with many different modes, and it will be readily appreciated by those skilled in the art that modes and details can be changed in various ways without departing from the spirit and scope thereof. Thus, the present invention should not be interpreted as being limited to the following description of the embodiments.

In the drawings, the size, the layer thickness, or the region is sometimes exaggerated for clarity. Therefore, the size, the layer thickness, or the region is not limited to the illustrated scale. Note that the drawings schematically illustrate ideal examples, and embodiments of the present invention are not limited to shapes, values, and the like illustrated in the drawings.

Furthermore, especially in a plan view (also referred to as a "top view"), a perspective view, and the like, the illustration of some components might be omitted for easy understanding of the invention. The illustration of some hidden lines and the like might also be omitted.

Unless otherwise specified, a transistor described in this specification and the like is an enhancement-mode (a normally-off mode) field-effect transistor. In the case where a transistor described in this specification and the like is an n-channel transistor and unless otherwise specified, the threshold voltage (also referred to as "$V_{th}$") of the transistor is higher than 0 V. In the case where the transistor described in this specification and the like is a p-channel transistor and unless otherwise specified, the threshold voltage (also referred to as "$V_{th}$") of the transistor is lower than or equal to 0 V. Unless otherwise specified, a plurality of transistors having the same conductivity type have the same $V_{th}$.

Unless otherwise specified, on-state current in this specification and the like refers to drain current (also referred to as "Id") of a transistor in an on state (also referred to as a "conduction state"). Unless otherwise specified, an "on state" refers to a state where the voltage between a gate and a source (also referred to as "$V_g$" or "$V_{gs}$") is higher than or equal to threshold voltage in an n-channel transistor, and refers to a state where $V_g$ is lower than or equal to $V_{th}$ in a p-channel transistor. For example, the on-state current of an n-channel transistor sometimes refers to drain current that flows when $V_g$ is higher than or equal to $V_{th}$.

Unless otherwise specified, off-state current in this specification and the like refers to $I_d$ of a transistor in an off state (also referred to as a non-conduction state or a cutoff state). Unless otherwise specified, the off state of an n-channel transistor means that $V_g$ is lower than $V_{th}$ ($V_g$ is higher than $V_{th}$ in a p-channel transistor). In this specification and the like, leakage current sometimes expresses the same meaning as off-state current.

In this specification and the like, a metal oxide is an oxide of a metal in a broad sense. Metal oxides are classified into an oxide insulator, an oxide conductor (including a transparent oxide conductor), an oxide semiconductor (also simply referred to as OS), and the like. For example, in the case where a metal oxide is used for an active layer of a transistor, the metal oxide is referred to as an oxide semiconductor in some cases. That is, in the case where an OS transistor is stated, the OS transistor can also be referred to as a transistor including a metal oxide or an oxide semiconductor.

Ordinal numbers such as "first" and "second" in this specification and the like are used in order to avoid confusion among components and do not denote any priority or sequence such as the sequence of steps or the stacking sequence. A term without an ordinal number in this specification and the like may be provided with an ordinal number in the scope of claims in order to avoid confusion among components. An ordinal number provided in this specification and the like and an ordinal number provided in the scope of claims might be different from each other. Furthermore, even when a term is provided with an ordinal number in this specification and the like, the ordinal number might be omitted in the scope of claims and the like.

In this specification and the like, the terms such as "electrode", "wiring", and "terminal" do not limit the functions of such components. For example, an "electrode" is used as part of a "wiring" in some cases, and vice versa. Furthermore, the terms such as "electrode" and "wiring" can also mean that a plurality of "electrodes" and "wirings" are provided in an integrated manner. For example, a "terminal" is used as part of a "wiring" or an "electrode" in some cases, and vice versa. Furthermore, the term "terminal" also includes the case where a plurality of "electrodes", "wirings", "terminals", and the like are formed in an integrated manner, for example. Therefore, for example, an "electrode" can be part of a "wiring" or a "terminal", and a "terminal" can be part of a "wiring" or an "electrode". Moreover, terms such as "electrode", "wiring", and "terminal" can sometimes be replaced with a term such as "region" depending on the case.

In this specification and the like, supply of a signal refers to supply of a predetermined potential to a wiring or the like. Thus, the term "signal" can be replaced with a term such as "potential" in some cases. A term such as "potential" can be replaced with the term "signal" in some cases. The "signal" may be a variable potential or a fixed potential. For example, it may be a power supply potential.

Note that the term "film" and the term "layer" can be interchanged with each other depending on the case or the circumstances. For example, the term "conductive layer" can be changed into the term "conductive film" in some cases. As another example, the term "insulating film" can be changed into the term "insulating layer" in some cases.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. The term "capacitor", "parasitic capacitance", or "gate capacitance" can be replaced with the term "capacitance" in some cases. Conversely, the term "capacitance" can be replaced with the term "capacitor", "parasitic capacitance", or "gate capacitance" in some cases. In addition, a "capacitor" (including a "capacitor" with three or more terminals) includes an insulator and a pair of conductors between which the insulator is sandwiched. Thus, the term "pair of conductors" of "capacitor" can be replaced with "pair of electrodes", "pair of conductive regions", "pair of regions", or "pair of terminals". In addition, the term "one of a pair of terminals" is referred to as "one terminal" or a "first terminal" in some cases. The term "the other of the pair of terminals" is referred to as "the other terminal" or a "second terminal" in some cases. Note that the electrostatic capacitance value can be higher than or equal to 0.05 fF and lower than or equal to 10 pF, for example. For another example, the electrostatic capacitance value may be higher than or equal to 1 pF and lower than or equal to 10 μF.

Functions of a "source" and a "drain" of a transistor are sometimes switched when a transistor of opposite polarity is used or when the direction of current flow is changed in circuit operation, for example. Therefore, the terms "source" and "drain" can be used interchangeably in this specification and the like.

In this specification and the like, a "gate" refers to part or the whole of a gate electrode and a gate wiring. A gate wiring refers to a wiring for electrically connecting at least one gate electrode of a transistor to another electrode or another wiring.

In this specification and the like, a "source" refers to part or the whole of a source region, a source electrode, and a source wiring. A source region refers to a region in a semiconductor layer, where the resistivity is lower than or equal to a given value. A source electrode refers to a conductive layer including part connected to a source region. A source wiring refers to a wiring for electrically connecting at least one source electrode of a transistor to another electrode or another wiring.

In this specification and the like, a "drain" refers to part or the whole of a drain region, a drain electrode, and a drain wiring. A drain region refers to a region in a semiconductor layer, where the resistivity is lower than or equal to a given value. A drain electrode refers to part of a conductive layer which is connected to a drain region. A drain wiring refers to a wiring for electrically connecting at least one drain electrode of a transistor to another electrode or another wiring.

In this specification and the like, the terms for describing positioning, such as "over", "under" "above", and "below", are sometimes used for convenience to describe the positional relation between components with reference to drawings. The positional relation between components is changed as appropriate in accordance with the direction in which the components are described. Thus, the positional relation is not limited to the terms described in the specification and the like, and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

Furthermore, the term "over" or "under" does not necessarily mean that a component is placed directly over or directly under and in direct contact with another component. For example, the expression "an electrode B over an insulating layer A" does not necessarily mean that the electrode B is formed on and in direct contact with the insulating layer A, and does not exclude the case where another component is provided between the insulating layer A and the electrode B.

The term "overlap", for example, in this specification and the like does not limit a state such as the stacking order of components. For example, the expression "the electrode B overlapping with the insulating layer A" does not necessarily mean the state where the electrode B is formed over the insulating layer A, and does not exclude the state where the electrode B is formed under the insulating layer A and the state where the electrode B is formed on the right side (or the left side) of the insulating layer A.

Each of the terms "adjacent" and "proximity" in this specification and the like does not necessarily mean that a component is directly in contact with another component. For example, the expression "the electrode B adjacent to the insulating layer A" does not necessarily mean that the electrode B is formed in direct contact with the insulating layer A and does not exclude the case where another component is provided between the insulating layer A and the electrode B.

In this specification and the like, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

In this specification and the like, the terms "identical", "the same", "equal", "uniform", and the like (including synonyms thereof) used in describing calculation values and measurement values contain an error of ±20 % unless otherwise specified.

In the drawings and the like related to this specification, arrows indicating the X direction, the Y direction, and the Z direction are illustrated in some cases. In this specification and the like, the "X direction" is a direction along the X-axis, and the forward direction and the reverse direction are not distinguished in some cases, unless otherwise specified. The same applies to the "Y direction" and the "Z direction". The X direction, the Y direction, and the Z direction are directions intersecting with one another. For example, the X direction, the Y direction, and the Z direction are directions orthogonal to one another. In this specification and the like, one of the X direction, the Y direction, and the Z direction is referred to as a "first direction" in some cases. Another one of the directions is referred to as a "second direction" in some cases. The remaining one of the directions is referred to as a "third direction" in some cases.

In this specification and the like, when a plurality of components are denoted by the same reference numerals, and in particular need to be distinguished from each other, an identification sign such as "A", "b", "_1", "[n]", or "[m, n]" is sometimes added to the reference numerals. For example, to distinguish a plurality of registers 201, the terms such as a register 201[1], a register 201[2], and a register 201[3] are used in some cases.

Embodiment 1

In this embodiment, structure examples of a semiconductor device of embodiments of the present invention will be described. FIG. 1A is a block diagram illustrating a structure example of a semiconductor device 100.

The semiconductor device 100 illustrated in FIG. 1A includes a CPU core 110, an input/output IF 140, a cache memory 150, and a state control portion 160. The CPU core 110 includes an arithmetic portion 111, a register group 200, and a signal adjustment portion 271. The state control portion 160 includes a PMU (Power Management Unit) 130.

The semiconductor device 100 may include a bus. The bus has a function of controlling transmission and reception of data between the CPU core 110, the PMU 130, the input/output IF 140, the cache memory 150, and the state control circuit 160, for example.

Note that the components of the semiconductor device 100 are not limited to the components illustrated in FIG. 1A and may include other components. Furthermore, some of the components illustrated in FIG. 1A may be omitted. One component may have a function of another component.

The input/output IF 140 has a function of controlling transmission and reception of data between an external device such as a main memory (not illustrated) and the semiconductor device 100. Data output from the external device is input to the semiconductor device 100 through the input/output IF 140. Data output from the semiconductor device 100 is input to the external device through the input/output IF 140.

The cache memory 150 has a function of storing frequently used instructions, data, and the like and reducing the frequency of access to the main memory to increase the operation speed of the semiconductor device 100.

The register group 200 has a function of temporarily storing data used by the CPU core 110. The CPU core 110 has a function of performing arithmetic processing in the arithmetic portion 111 in accordance with data retained in the register group 200. The arithmetic portion 111 has a function of performing a variety of arithmetic processing such as four arithmetic operations and logic operations. The arithmetic portion 111 can also be referred to as an ALU (Arithmetic Logic Unit). The CPU core 110 is referred to as a processor core in some cases. The CPU core 110 may have a single (single-core) structure or two or more (multicore: e.g., dual-core or many-core) structures in the semiconductor device 100.

The register group 200 includes a plurality of registers 201 (a register 201[1] to a register 201[*n*], with n being an integer greater than or equal to 2). Each of the registers 201 is referred to as the register 201[*k*] (k is an integer greater than or equal to 1 and less than or equal to n) in some cases. Note that the register 201 is a type of storage device and is also a type of semiconductor device.

As an example, the case where six registers 201 are included is described. The register 201[1] functions as a program counter, for example. The program counter has a function of storing a memory address in which an instruction to execute next is represented. The register 201[2] functions as an instruction register, for example. The instruction register has a function of storing an instruction read from the memory. The register 201[3] functions as a base register, for example. The base register has a function of storing the starting address of a program and data stored in the memory. The register 201[4] functions as an index register, for example. The index register has a function of storing the size of data. The register 201[5] functions as an accumulator, for example. The accumulator has a function of temporarily storing an arithmetic operation result executed in the arithmetic portion 111. The register 201[6] functions as a general-purpose register, for example. The general-purpose register is not limited to being used for a particular application and is used in various applications. For example, the register 201[6] may be used as an accumulator.

Note that the register 201 included in the register group 200 does not necessarily include all of these registers, and may include the register 201 other than these registers. In addition, some or all of these registers 201 may be included. For example, a plurality of registers 201[6] each functioning as a general-purpose register may be included.

The signal adjustment portion 271 has a function of performing one or more of amplification, modulation, and a change in potential level on a signal input to the CPU core 110. The signal adjustment portion 271 may also have a function of outputting a result of arithmetic operation using the signal input to the CPU core 110.

Figure 1B:
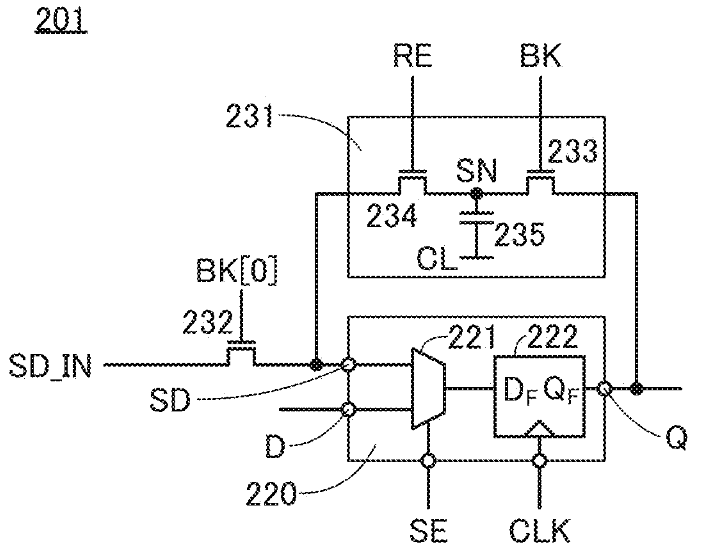
FIG. 1B is a diagram illustrating a structure example of a register.

FIG. 1B is a block diagram illustrating a structure example of the register 201. The register 201 includes a transistor 232, a scan flip-flop 220 (volatile register), and a storage circuit 231.

The scan flip-flop 220 includes a selector 221, a flip-flop 222, a terminal D, a terminal Q, and a terminal SD. The terminal D and the terminal SD are electrically connected to the selector 221, and a signal input to the terminal D and the terminal SD is supplied to the selector 221. The terminal Q is electrically connected to the flip-flop 222, and a signal output from the flip-flop 222 is supplied to the terminal Q. The storage circuit 231 includes a transistor 233, a transistor 234, and a capacitor 235.

The state control portion 160 includes the PMU 130. The PMU 130 is a circuit that outputs a control signal for switching between interrupt processing (also referred to as "excepting processing") and power gating in accordance with a signal such as an interrupt signal input from the outside or a sleep signal generated by the CPU core 110. The state control portion 160 generates, for example, a clock signal CLK, a variety of signals (a signal BK, a signal RE, and a signal SE), and signals that are the basis of these variety of signals (e.g., a signal REa and a signal BKa described later). The clock signal CLK and the variety of signals are input to the CPU core 110, the input/output IF 140, the cache memory 150, and the like. The variety of signals (the signal BK, the signal RE, and the signal SE) or the signals that are the basis of these variety of signals (e.g., the signal REa, the signal BKa, a signal REc, and a signal BKc described later) are generated in the PMU 130, for example.

The clock signal CLK may be generated in a region other than the state control portion 160, for example.

The signal BK is a signal controlling saving of data retained in the flip-flop 222 in the scan flip-flop 220 in the storage circuit 231. In this specification and the like, the signal BK can also be expressed as a signal that controls saving, storing, or backing up the data retained in the flip-flop 222 in the storage circuit 231.

The signal RE is a signal controlling the return of the data retained in the storage circuit 231 to the flip-flop 222. In this specification and the like, the signal RE can be expressed as a signal that controls loading, restoring, or recovering the data retained in the storage circuit 231 to the flip-flop 222.

The signal SE is a switch signal for the selector 221. The clock signal CLK is a signal that determines the operation timing of the flip-flop 222.

The register 201 has a function of retaining data input from the terminal D or data input from the terminal SD in the scan flip-flop 220 and outputting the data from the terminal Q in accordance with the clock signal CLK. Data in the scan flip-flop 220 output from the terminal Q is saved in the storage circuit 231 in accordance with the signal BK. Data in the storage circuit 231 is loaded into the scan flip-flop 220 from the terminal SD of the scan flip-flop 220 in accordance with the signal RE.

The selector 221 has a function of supplying one of the signal input to the terminal D or the terminal SD to the flip-flop 222 in accordance with the signal SE. Data supplied from the outside of the register 201 is input to the terminal D. Data input from the storage circuit 231 or scan test data supplied through a terminal SD_IN is input to the terminal SD. Here, the transistor 232 is provided between the terminal SD_IN and the terminal SD. The scan test data supplied through the terminal SD_IN is input to the terminal SD through the transistor 232. The conduction state or the non-conduction state of the transistor 232 is controlled by a signal BK[0].

Although the flip-flop 222 illustrated in FIG. 1B is a D flip-flop, the flip-flop 222 is not limited thereto. As the flip-flop 222, a flip-flop prepared in a standard circuit library can be used. A transistor included in the flip-flop 222 is a Si transistor which can constitute a CMOS circuit, and the flip-flop 222 can retain one piece of data by including a circuit such as an inverter loop. The flip-flop 222 retains data in an input terminal $D_F$ and outputs the retained data to the terminal Q through an output terminal $Q_F$ in accordance with the clock signal CLK.

The storage circuit 231 is connected to the terminal Q and the terminal SD. In the storage circuit 231, a terminal electrically connected to the terminal Q is referred to as an input terminal, and a terminal electrically connected to the terminal SD is referred to as an output terminal. The output terminal $Q_F$ of the flip-flop 222 is electrically connected to an input terminal of the storage circuit 231, and the input terminal $D_F$ of the flip-flop 222 is electrically connected to an output terminal of the storage circuit 231 through the terminal SD and the selector 221.

In the storage circuit 231, the transistor 233 is provided between one electrode of the capacitor 235 and the terminal Q. The transistor 234 is provided between the one electrode of the capacitor 235 and the terminal SD. The other electrode of the capacitor 235 is connected to a wiring CL. A low power supply potential, a ground potential, or the like is supplied to the wiring CL, for example. In each of a plurality of storage circuits 231, one electrode of the capacitor 235 is illustrated as a node SN.

An OS transistor is preferably used as each of the transistor 233 and the transistor 234. Since the off-state current of the OS transistor is extremely low, charge retained in the node SN is not easily reduced, so that a voltage decrease of the node SN can be inhibited for a long time. In addition, electric power for retaining data (charge) written to the node SN is hardly needed. Thus, the storage circuit 231 can be regarded as a nonvolatile memory. Furthermore, the storage circuit 231 rewrites data by charging and discharging the capacitor 235; hence, there is no limitation on the number of rewriting operations in principle. In addition, data can be written to and read out at high speed with low energy.

A storage circuit formed using an OS transistor is also referred to as an "OS memory". Thus, the storage circuit 231 is an OS memory.

As each of the transistor 233 and the transistor 234, a transistor including a back gate may be used. By supplying a constant voltage to the back gate, $V_{th}$ of the transistor can be controlled.

In the storage circuit 231, the transistor function as a switch. In the case where an n-channel transistor is used, when a signal supplied to a gate is set to a high level (hereinafter also referred to as "H"), a conduction state (on state) can be established between a source and a drain, and when the signal supplied to the gate is set to a low level (hereinafter also referred to as "L"), a non-conduction state (off state) can be established between the source and the drain. The selector 221 selects a signal of the terminal SD by setting the signal SE to one of H and L, and selects a signal of the terminal D by setting the signal SE to the other. For example, the selector 221 selects the signal of the terminal SD by setting the signal SE to a high level, and selects the signal of the terminal D by setting the signal SE to a low level.

For example, when the signal BK="H" is set in the storage circuit 231, data retained in the flip-flop 222 can be written to the node SN in the storage circuit 231. Furthermore, when RE="H" and SE="H" are set, the data in the node SN of the storage circuit 231 can be written back to the flip-flop 222.

It is highly preferable that all of the transistors in the storage circuit 231 be OS transistors. An OS transistor is a type of thin film transistor and can be formed to be stacked using an existing thin film formation technique. When the storage circuit 231 is formed using OS transistors, the storage circuit 231 can be stacked over the scan flip-flop 220 formed using a CMOS circuit using a Si transistor.

An OS transistor can be suitably used as the transistor 232. The use of an OS transistor can reduce leakage current. When the leakage current of the transistor 232 increases, the accuracy of data retained in the storage circuit 231 might be decreased at the time of returning to the flip-flop 222. A transistor including a back gate may be used as the transistor 232. By supplying a constant voltage to the back gate, Vth of the transistor can be controlled.

Structure Example 1

Figure 2A:
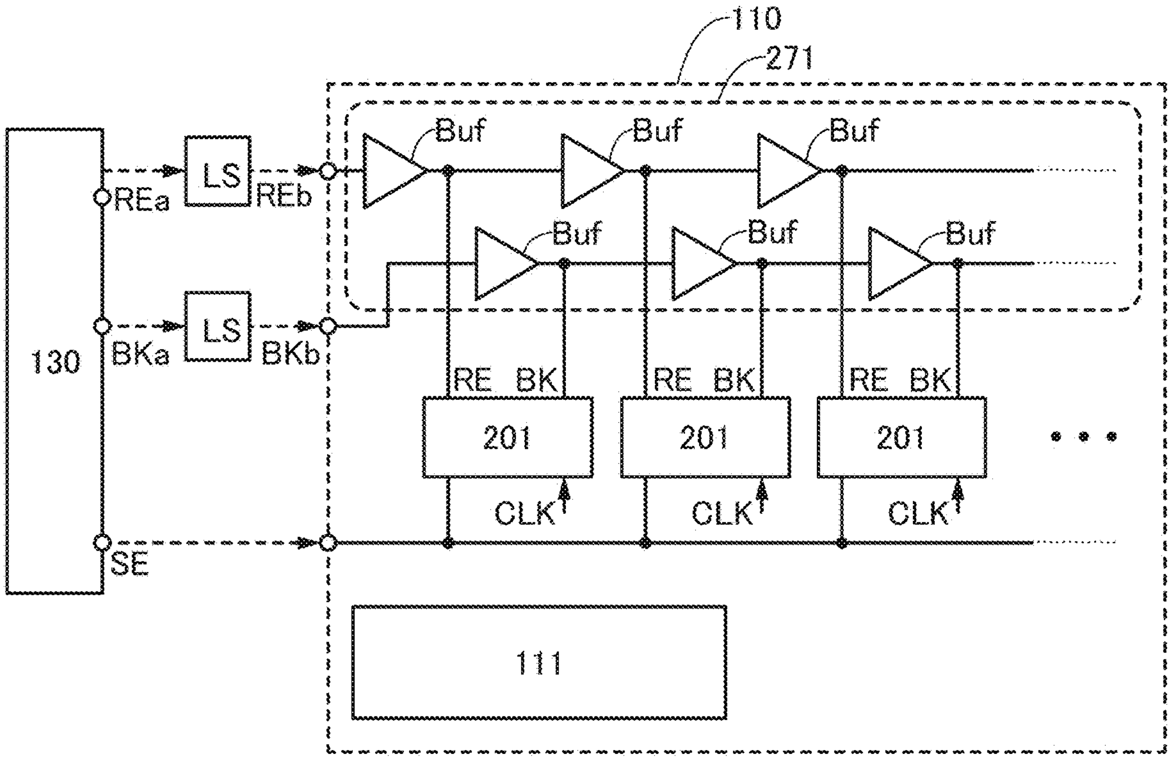
FIG. 2A and FIG. 2B are diagrams each illustrating an example of a structure included in the semiconductor device.

FIG. 2A illustrates an example of a structure including the PMU 130 and the CPU core 110. The structure illustrated in FIG. 2A includes a level shifter LS. The level shifter LS is included in the state control portion 160, for example.

The PMU 130 has a function of outputting a signal to be the signal RE, a signal to be the signal BK, and a signal to be the signal SE and supplying them to the CPU core 110. Note that these signals are supplied through the signal adjustment portion 271, for example.

In FIG. 2A, the signal REa and the signal BKa are supplied from the PMU 130 to the level shifters LS, and then the signal REa and the signal BKa are supplied to the CPU core 110 as a signal REb and a signal BKb, respectively, through the level shifters LS. The level shifter LS has a function of boosting the H-level potential of the signal and generating a signal with a desired potential, for example.

Although FIG. 2A illustrates an example in which the H-level potential of the signal is boosted by the level shifter LS and then input to a buffer circuit Buf, the L-level potential of the signal may be lowered by the level shifter LS and then input to the buffer circuit Buf. Both boosting the H-level potential of the signal and lowering the L-level potential of the signal may be performed to be input to the buffer circuit Buf.

As the L-level potential of the signal lowered by the level shifter LS, a negative potential may be used, for example. Thus, a signal that is a low-potential level of the signal RE and the signal BK supplied to the register 201 can be a negative potential. The signal RE and the signal BK are supplied to a gate of the transistor 234 and a gate of the transistor 233, respectively. When the gates have a negative potential, the off-state current can be further reduced as compared with the case where the gates have a potential of 0, for example, and thus the retention characteristics of the scan flip-flop 220 can be further increased. In particular, in the case where OS transistors are used as the transistors, the off-state current can be extremely low when the gates are set to a negative potential.

The signal REa and the signal BKa are supplied as the signal REb and the signal BKb, respectively, to the CPU core 110 through the level shifters LS. The signal REb and the signal BKb are signals resulting from changing the potential levels of the signal REa and the signal BKa, respectively, and here, are preferably signals with increased voltage, for example. In addition, the signal SE is supplied from the PMU 130 to the CPU core 110.

Since the OS transistor has an extremely low off-state current, the use of the OS transistor enables the storage circuit 231 to function as a nonvolatile memory. The threshold voltage of the OS transistor is preferably higher than 0 V, in which case the characteristics of a low off-state current of the OS transistor can be suitably utilized for the storage circuit 231. When the signal REb and the signal BKb are high-voltage signals, for example, each of the voltages of the signal BK and the signal RE supplied to the gates of the transistor 233 and the transistor 234, which are OS transistors, is sufficiently higher than the sum of the high-potential level (H-level) signal voltage output from an output terminal Q of the flip-flop 222 and the threshold voltage of the OS transistor, whereby the H-level signal voltage output from the output terminal Q can be inhibited from being lowered by the OS transistor. Thus, writing to the node SN can be performed without decreasing the H-level signal voltage from the output terminal Q of the flip-flop 222. Accordingly, the operation speed of the semiconductor device of one embodiment of the present invention is expected to be increased. In addition, the semiconductor device of one embodiment of the present invention can be expected to have improved data retention characteristics and stable circuit operation.

The CPU core 110 includes the plurality of registers 201. The signal RE, the signal BK, the signal SE, and the clock signal CLK are supplied to each of the registers 201. In addition, input data is supplied to the terminal D of the register 201 included in each of the register groups 200, and scan test data is supplied to the terminal SD through the terminal SD_IN.

In the signal adjustment portion 271, the buffer circuit Buf is provided for each of the plurality of registers 201 included in the CPU core 110. The signal REb is input to the buffer circuit Buf, output as the signal RE from the buffer circuit Buf, and supplied to the register 201. The signal BKb is input to the buffer circuit Buf, output as the signal BK from the buffer circuit Buf, and supplied to the register 201.

Figure 2B:
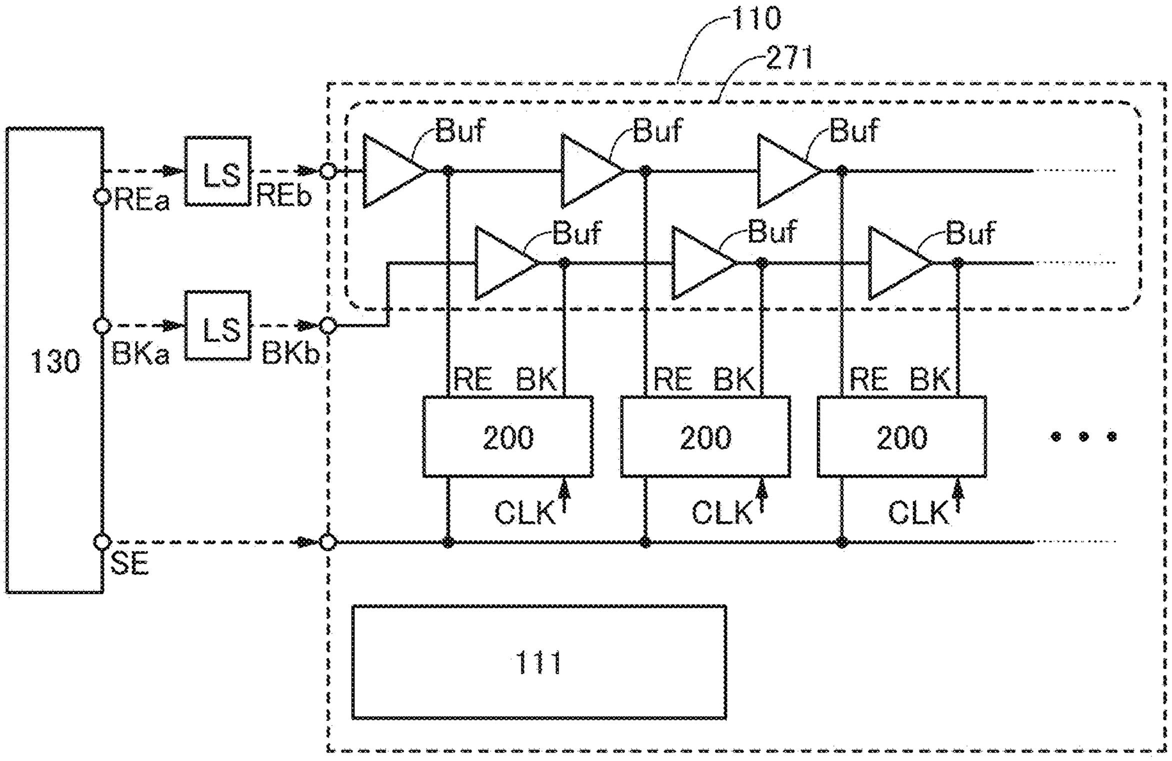

Alternatively, as illustrated in FIG. 2B, a structure may be employed where the CPU core 110 includes a plurality of register groups 200 including the plurality of registers 201 and the buffer circuit Buf is provided for each of the plurality of register groups 200. FIG. 2B illustrates a structure where the register 201 in FIG. 2A is replaced with the register group 200. The detailed structure of the register group 200 is described later.

The signal REb is input to the buffer circuit Buf, output as the signal RE from the buffer circuit Buf, and supplied to the register group 200. The signal BKb is input to the buffer circuit Buf, output as the signal BK from the buffer circuit Buf, and supplied to the register 201.

The buffer circuit Buf has a function of amplifying and outputting an input signal, for example. The buffer circuit Buf has a function of dividing load capacitance, for example.

Each of the signal RE and the signal BK supplied to the register 201 is supplied to a gate of the transistor. Thus, input capacitance is generated at the time of input. The input capacitance of the signal RE or the signal BK included in the register group 200 is the product of the number of registers 201 included in the register group 200 and the input capacitance of the signal RE or the signal BK included in one register 201.

The load capacitance can be divided by providing the buffer circuit Buf, for example. More specifically, for example, in the case where an output from the level shifter LS is supplied to each of the registers 201 not through the buffer circuit Buf, the load capacitance of the output from the level shifter LS is the sum of the input capacitances of all the registers 201 to which wirings connected to the output terminals are electrically connected, and a large load capacitance might be supplied, for example.

When the buffer circuit Buf is provided in front of the input of the register 201, the load capacitance of the output from the level shifter LS can be the input capacitance of the buffer circuit Buf, so that the load capacitance can be reduced. The load capacitance of the output of the buffer circuit Buf can be the sum of the input capacitance to the register 201 to which the output terminal is connected and the input capacitance of the buffer circuit Buf in the next stage. Note that in the actual operation of the circuit, parasitic capacitance of the circuit is generated in addition to the above.

The buffer circuit Buf has a function of shaping and outputting an input signal, for example. Specifically, for example, the transition time of the signal from an H level to a low-potential level (L level) and the transition time of the signal from an L level to an H level can be shortened, so that the signal distortion can be eliminated. Furthermore, by shortening the transition time, signal delay can be inhibited.

The signal REb supplied to the CPU core 110 is transmitted through a wiring or the like and supplied to each of the register groups 200. When the transmission distance from the input terminal of the CPU core 110 to the wiring is increased, attenuation at the potential level of the signal, the distortion of rising and falling of the signal, or the like might occur. In the case where signals are supplied to the plurality of registers 201 (the plurality of register groups 200) as illustrated in FIG. 2A and FIG. 2B, the farther the register 201 (the register group 200) is positioned, the longer the transmission distance from the input terminal to the wiring is, for example.

The buffer circuit Buf has a function of shaping an input signal. In addition, when a signal is supplied through the buffer circuit Buf, attenuation at the potential level of the signal can be inhibited. Moreover, rising and falling of the signal can be steep.

In the case where power gating is executed, the signal BK or the signal RE is supplied to the plurality of register groups 200 in the CPU core 110 at the same time in some cases. In the case where a large number of circuits are operated at the same time, a large amount of current flows instantaneously; thus, a reduction in power supply voltage, an increase in the ground potential, or the like occurs, which might cause a malfunction of the circuits. By supplying a signal to the register 201 (the register group 200) through the buffer circuit Buf, the timing of the signal input to the register 201 (the register group 200) can be controlled. When a signal input to each of the registers 201 (each of the register groups 200) is delayed, a large amount of current can be inhibited from flowing instantaneously, and a malfunction of a circuit can be prevented.

In FIG. 2A and FIG. 2B, the signal REb is supplied to a first register 201 (a first register group 200) through one buffer circuit Buf. Meanwhile, the signal REb is supplied to a second register 201 (a second register group 200) in the stage subsequent to the first register 201 (the first register group 200) through two buffer circuits Buf. Thus, in the case where the buffer circuits Buf have a function of delaying the input signal and outputting it, the signal RE supplied to the register 201 (the register group 200) in the subsequent stage can be a signal delayed compared to the signal in the previous stage, for example.

Note that in this specification and the like, the buffer circuit may include a circuit having a function of outputting a logic level by inversion, for example. For example, an inverter may be a kind of buffer circuit. Here, the inverter is a logic inverter element, for example.

As the buffer circuit Buf, an inverter chain in which a plurality of inverters are connected in series can be used.

Note that “signals are supplied at the same time” means that signals are supplied at the same time in an ideal state where signal delay is not caused, for example; in actual circuit operation, deviation of timing might occur at the time when signals are supplied.

In the case where the inverter chain is used as the buffer circuit Buf, the delay time from the time when a signal is input to the time when the signal is output can be adjusted by adjusting the number of stages of connected inverters, for example.

In the structure illustrated in FIG. 2B, the level shifter LS is not respectively provided for the plurality of register groups 200, and a signal output from one level shifter LS is supplied to the plurality of register groups 200. With such a structure, the number of level shifters LS can be reduced in the semiconductor device 100, so that power consumption can be reduced. Note that in the case where a plurality of level shifters LS are provided, adjustment of signals to be input to the level shifters LS is necessary in some cases. For example, timing adjustment of an input signal, shaping of a signal, or the like is necessary. In such a case, a signal is input through the buffer circuit to each of the level shifters LS, for example.

Structure Example 2

Figure 3:
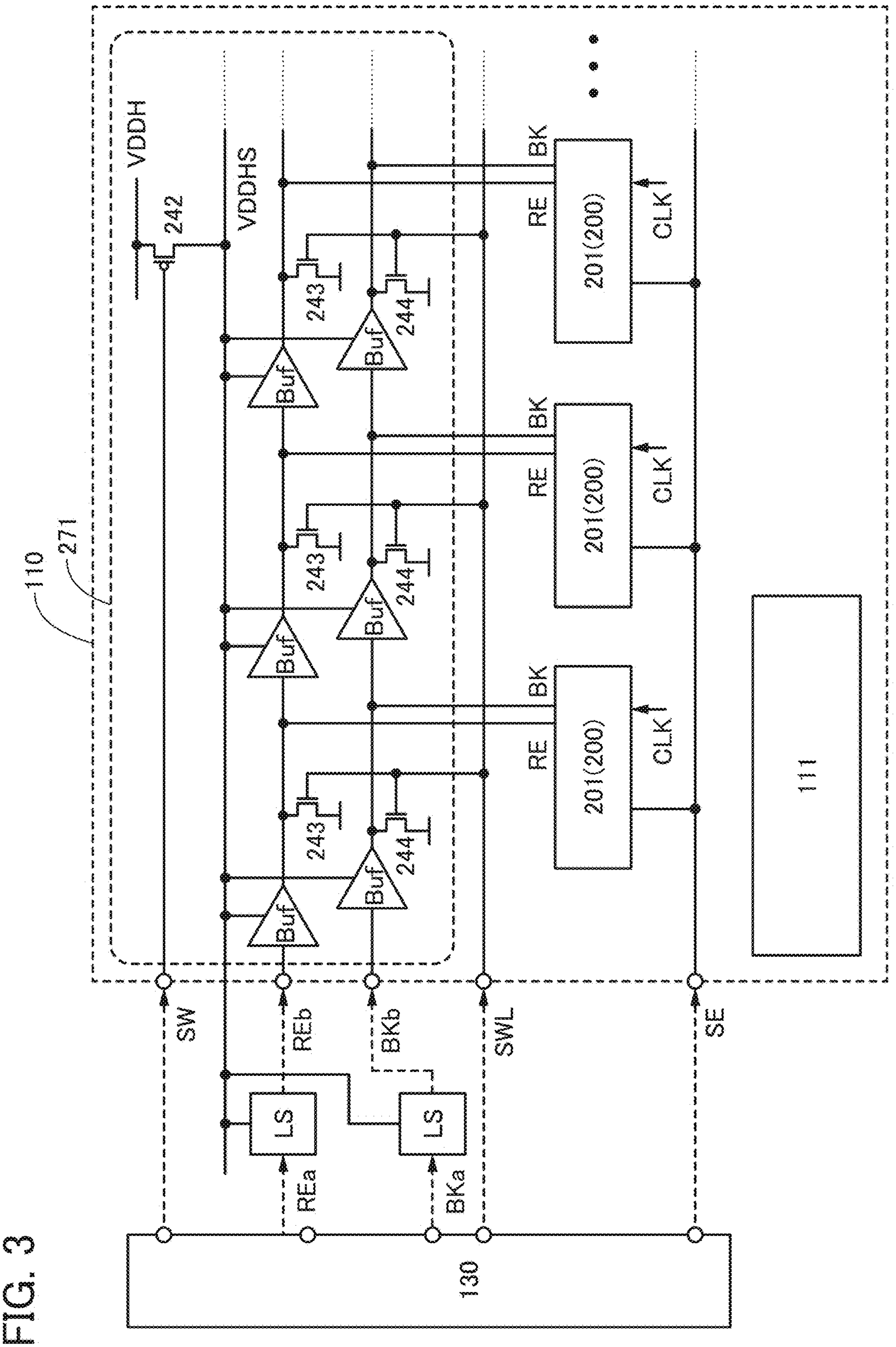
FIG. 3 is a diagram illustrating an example of a structure included in the semiconductor device.

A structure illustrated in FIG. 3 includes a transistor 242, a transistor 243, a transistor 244, and the like in addition to the structure illustrated in FIG. 2A. A signal SWL and a signal SW are supplied from the PMU 130 to the CPU core 110. In FIG. 3, the register group 200 can be used instead of the register 201 as shown in parentheses.

As the transistor 242, either an n-channel transistor or a p-channel transistor may be used. As described later, a high power supply potential is supplied to the transistor 242; thus, a p-channel transistor can be suitably used here. When a p-channel transistor is used as the transistor 242, the absolute value of the potential difference between the gate and the source can be increased in the case where the transistor operates, and thus the transistor can be suitably operated as a switch. A Si transistor or an OS transistor may be used as the transistor 242; in the case where the transistor 242 is a p-channel transistor, a Si transistor is used, for example.

Either an n-channel transistor or a p-channel transistor may be used as each of the transistor 243 and the transistor 244. Here, an n-channel transistor is used, for example. A Si transistor or an OS transistor may be used as each of the transistor 243 and the transistor 244. When an n-channel transistor is used as each of the transistor 243 and the transistor 244, the absolute value of the potential difference between the gate and the source can be increased when the transistors operate, and thus the transistors can be suitably operated as switches.

In the structure illustrated in FIG. 3, power supply to the buffer circuit Buf included in the signal adjustment portion 271 and the level shifter LS can be stopped. Thus, power consumption can be further reduced as compared with the structure in FIG. 2A.

Here, an example of a power supply potential used in the semiconductor device of one embodiment of the present invention is described. In the semiconductor device of one embodiment of the present invention, a high power supply potential VDD, a low power supply potential VSS (a ground potential can also be used as the low power supply potential), a second high power supply potential VDDH, or the like can be used. The second high power supply potential VDDH is a power supply potential higher than the high power supply potential VDD. Each of the high power supply potential VDD and the second high power supply potential VDDH can be used as an H-level potential of the signal. The low power supply potential VSS can be used as an L-level potential of the signal.

A gate of the transistor 242 is electrically connected to at least one of a wiring and a terminal to which the signal SW is supplied. The signal SW functions as a signal for switching the on/off state of the transistor 242. One of a source and a drain of the transistor 242 is electrically connected to at least one of a wiring and a terminal to which the second high power supply potential VDDH is supplied. The other of the source and the drain of the transistor 242 is electrically connected to the buffer circuit Buf included in the signal adjustment portion 271 and the level shifter LS.

A power supply potential VDDHS is a power supply potential supplied to the buffer circuit Buf included in the signal adjustment portion 271 and the level shifter LS, and when the transistor 242 is turned on, a potential corresponding to the second high power supply potential VDDH is supplied as the power supply potential VDDHS, and power source of the buffer circuit Buf included in the signal adjustment portion 271 and the level shifter LS is turned on. When the transistor 242 is turned off, power supply to the buffer circuit Buf included in the signal adjustment portion 271 and the level shifter LS is stopped.

The transistor 243 and the transistor 244 are respectively provided to correspond to one register 201 (or one register group 200). The signal SWL is supplied to each of gates of the transistor 243 and the transistor 244.

One of a source and a drain of the transistor 243 is electrically connected to an output terminal of the buffer circuit Buf to which the signal RE is output, and the other of the source and the drain of the transistor 243 is electrically connected to at least one of a wiring and a terminal to which the low power supply potential VSS is supplied.

One of a source and a drain of the transistor 244 is electrically connected to an output terminal of the buffer circuit Buf to which the signal BK is output, and the other of the source and the drain of the transistor 244 is electrically connected to a wiring to which the low power supply potential VSS is supplied.

In a period during which power supply to the buffer circuit Buf is stopped, the potential of the output terminal of the buffer circuit Buf is not controlled, so that the potential of the output terminal is unstable in some cases. When the transistor 243 is turned on, the signal RE supplied to the register 201 (or the register group 200) can be set to an L level. When the transistor 244 is turned on, the signal BK supplied to the register group 200 can be set to L.

Figure 4:
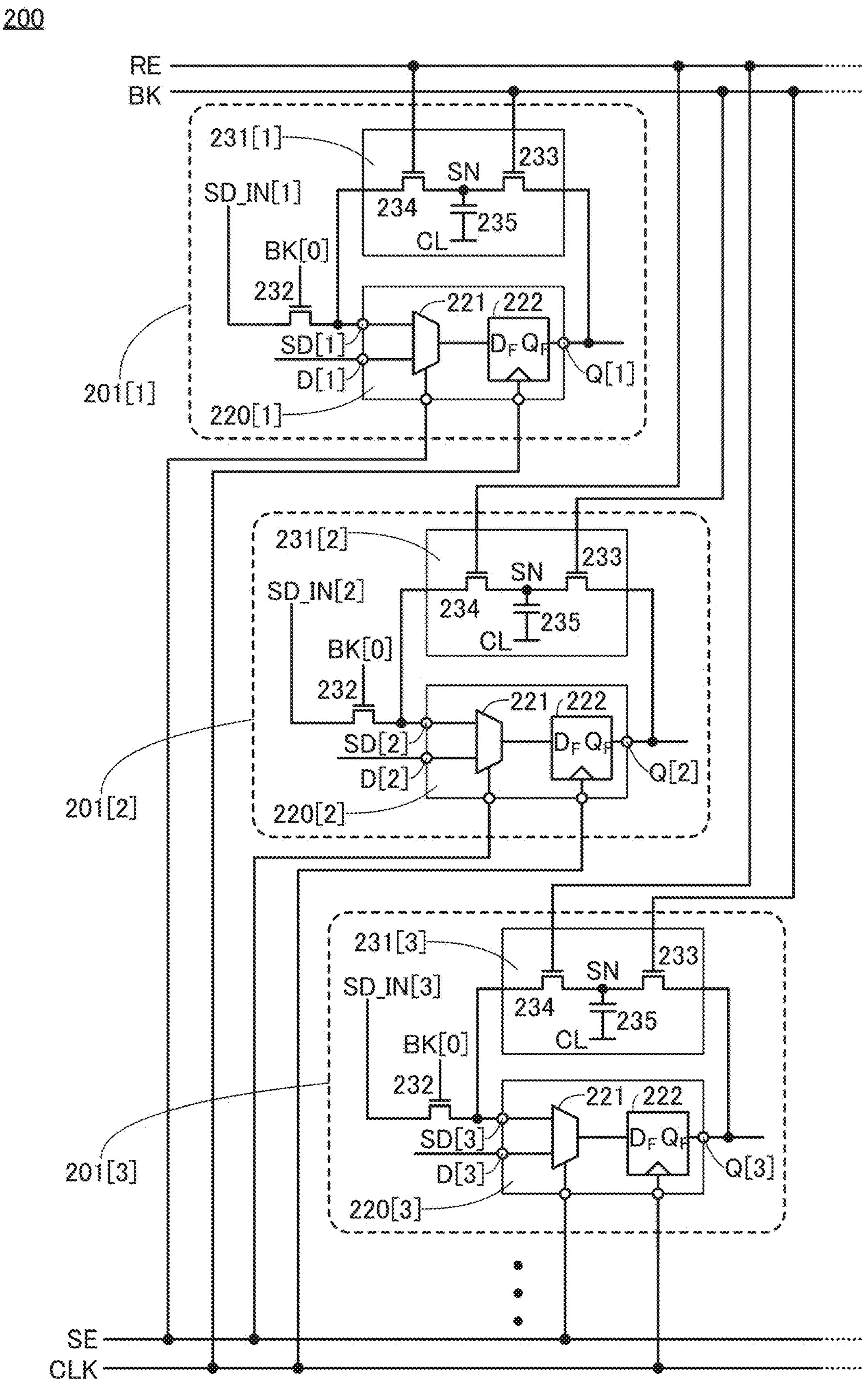
FIG. 4 is a diagram illustrating a structure example of a register group.
Figure 5:
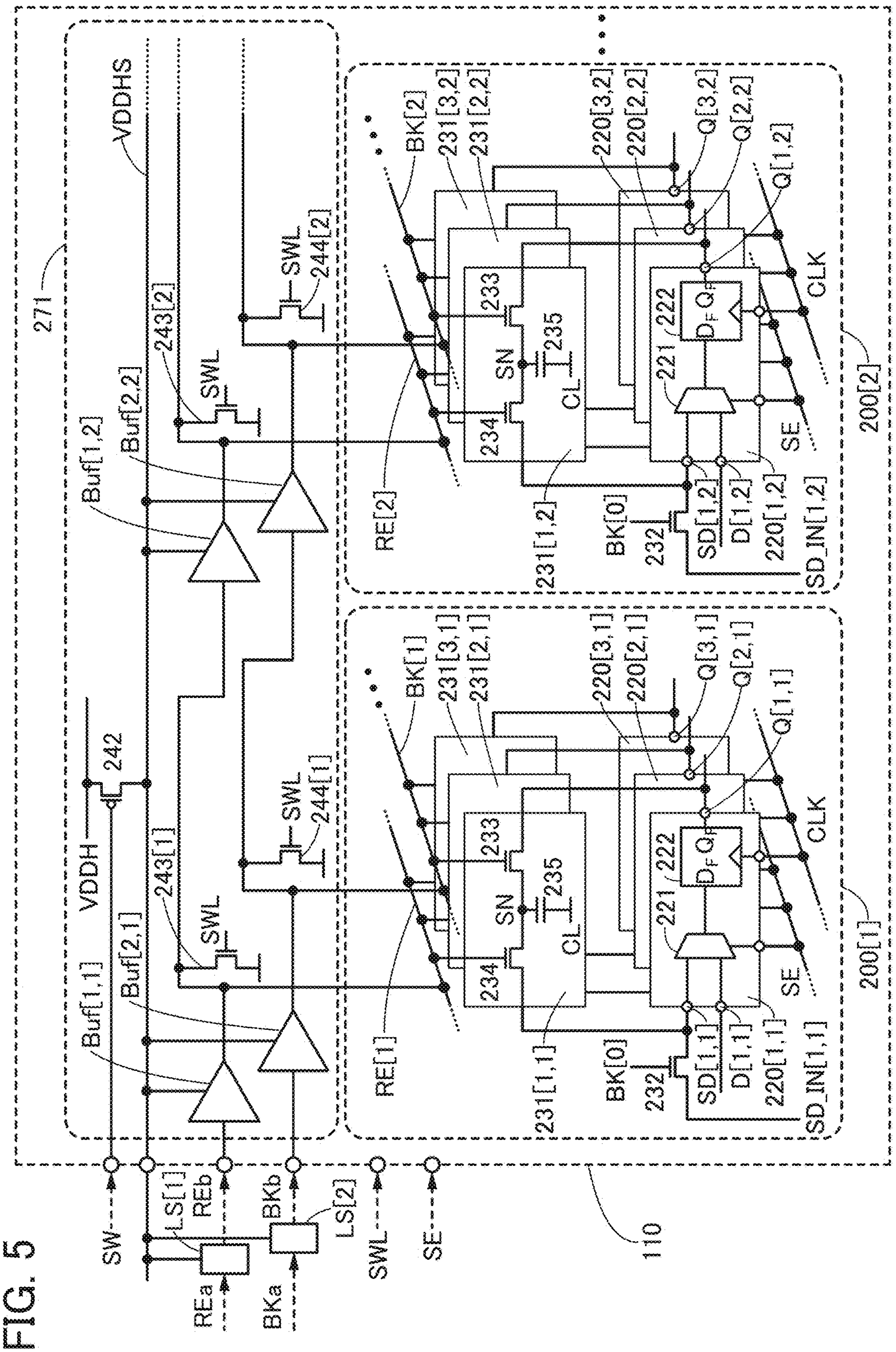
FIG. 5 is a diagram illustrating an example of a structure included in the semiconductor device.

FIG. 4 illustrates an example of a circuit diagram of the register group 200. FIG. 5 is a block diagram in which the register 201 illustrated in FIG. 3 is replaced with the register group 200 illustrated in FIG. 4. In FIG. 5, the first register group 200 and the second register group 200 are referred to as a register group 200[1] and a register group 200[2], respectively.

The signal RE and the signal BK supplied to the register group 200[1] are denoted as a signal RE[1] and a signal BK[1], respectively, and the signal RE and the signal BK supplied to the register group 200[2] are denoted as a signal RE[2] and a signal BK[2], respectively. Both the operations of the signal RE[1] and the signal RE[2] are synchronized with the signal REb supplied to the CPU core 110. Both the operations of the signal BK[1] and the signal BK[2] are synchronized with the operation of the signal BKb supplied to the CPU core 110.

In FIG. 5, the level shifter LS that outputs the signal REb to the CPU core 110 is denoted as a level shifter LS[1]. The level shifter LS that outputs the signal BKb to the CPU core 110 is denoted as a level shifter LS[2].

The buffer circuit Buf to which the signal REb is input from the input terminal is denoted as a buffer circuit Buf[1, 1]. The buffer circuit Buf to which the signal BKb is input from the input terminal is denoted as a buffer circuit Buf[2, 1]. The buffer circuit Buf supplied with an output from the output terminal of the buffer circuit Buf[1,1] is denoted as a buffer circuit Buf[1,2], and the buffer circuit Buf supplied with an output from the output terminal of the buffer circuit Buf[2,1] is denoted as a buffer circuit Buf[2,2].

An output terminal of the level shifter LS[1] is electrically connected to an input terminal of the buffer circuit Buf[1,1]. An output terminal of the level shifter LS[2] is electrically connected to an input terminal of the buffer circuit Buf[2,1].

The output terminal of the buffer circuit Buf[1,1] is electrically connected to the register group 200[1], and the signal RE[1] is supplied from the output terminal to the register group 200[1]. The output terminal of the buffer circuit Buf[1,1] is also electrically connected to an input terminal of the buffer circuit Buf[1,2].

The output terminal of the buffer circuit Buf[2,1] is electrically connected to the register group 200[1], and the signal BK[1] is supplied from the output terminal to the register group 200[1]. The output terminal of the buffer circuit Buf[2,1] is also electrically connected to an input terminal of the buffer circuit Buf[2,2].

An output terminal of the buffer circuit Buf[1,2] is electrically connected to the register group 200[2], and the signal RE[2] is supplied from the output terminal to the register group 200[2].

An output terminal of the buffer circuit Buf[2,2] is electrically connected to the register group 200[2], and the signal BK[2] is supplied from the output terminal to the register group 200[2].

In FIG. 5, the transistor 243 in which one of a source and a drain is connected to the output terminal of the buffer circuit Buf[1,1] is denoted as a transistor 243[1], the transistor 244 in which one of a source and a drain is connected to the output terminal of the buffer circuit Buf[2,1] is denoted as a transistor 244[1], the transistor 243 in which the one of the source and the drain is connected to the output terminal of the buffer circuit Buf[1,2] is denoted as a transistor 243[2], and the transistor 244 in which the one of the source and the drain is connected to the output terminal of the buffer circuit Buf[2,2] is denoted as a transistor 244[2].

Structure Example 3

Figure 6:
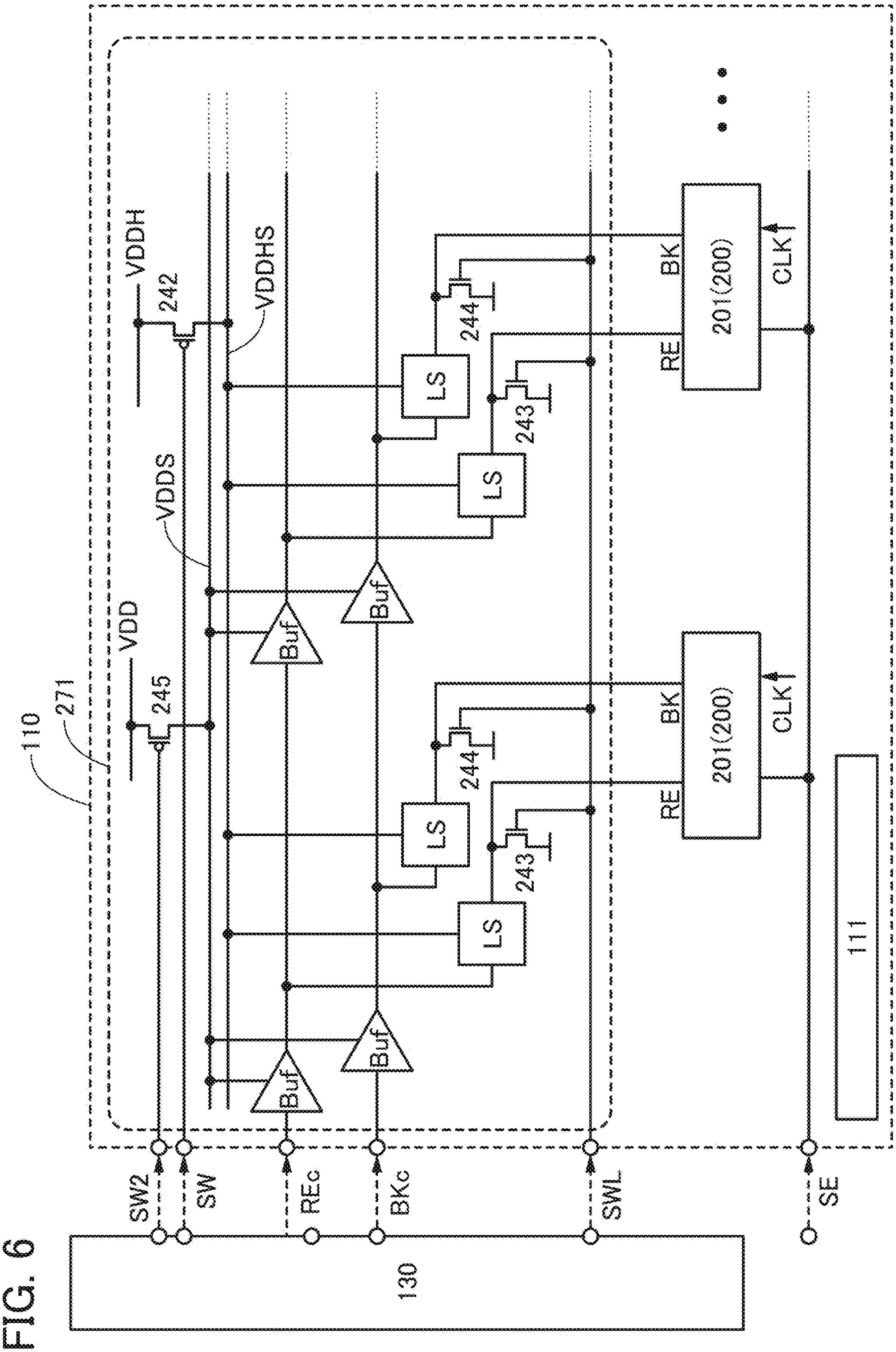
FIG. 6 is a diagram illustrating an example of a structure included in the semiconductor device.

As illustrated in FIG. 6, the level shifter LS may be provided for each of the plurality of registers 201 included in the CPU core 110. As shown in parentheses in FIG. 6, the register group 200 can be used instead of the register 201. That is, the CPU core 110 may include the plurality of register groups 200, and the level shifter LS may be provided for each of the register groups 200.

The structure illustrated in FIG. 6 is different from that in FIG. 3 in the structure of the signal adjustment portion 271. In the structure illustrated in FIG. 6, the level shifter LS is not provided between the PMU 130 and the CPU core 110, and the signal REc and the signal BKc output from the PMU 130 are supplied to the CPU core 110 not through the level shifter LS.

In the signal adjustment portion 271 illustrated in FIG. 6, the level shifter LS and the buffer circuit Buf are provided for each of the plurality of registers 201 included in the CPU core 110. The signal REc is input to the buffer circuit Buf, supplied from the buffer circuit Buf to the level shifter LS, and supplied as the signal RE to the register 201 through the level shifter LS. The signal BKc is input to the buffer circuit Buf, supplied from the buffer circuit Buf to the level shifter LS, and supplied as the signal BK to the register 201 through the level shifter LS.

FIG. 6 illustrates an example where a transistor 245 controls switching of the supply of a power supply potential VDDS as the power source of the buffer circuit Buf. A gate of the transistor 245 is electrically connected to at least one of a wiring and a terminal to which a signal SW2 is supplied, one of a source and a drain of the transistor 245 is electrically connected to at least one of a wiring and a terminal to which the high power supply potential VDD is supplied, and the other of the source and the drain of the transistor 245 has a function of supplying power to the buffer circuit Buf and is electrically connected to each of a plurality of buffer circuits. The transistor 242 can be referred to for the transistor 245.

In FIG. 6, one of a source and a drain of the transistor 243 is electrically connected to the output terminal of the level shifter LS to which the signal RE is output, and the other of the source and the drain of the transistor 243 is electrically connected to at least one of a wiring and a terminal to which the low power supply potential VSS is supplied. One of a source and a drain of the transistor 244 is electrically connected to the output terminal of the level shifter LS to which the signal BK is output, and the other of the source and the drain of the transistor 244 is electrically connected to at least one of a wiring and a terminal to which the low power supply potential VSS is supplied.

Providing the level shifter LS for each of the registers 201 as illustrated in FIG. 6 increases the number of level shifters LS. Thus, power consumption is sometimes higher than that in the structure illustrated in FIG. 3. However, even in the structure illustrated in FIG. 6, when the transistor 242 is turned off using the signal SW in a period during which the operation of the level shifter LS is not needed, power supply to the level shifter LS can be stopped and power consumption can be reduced.

In the case where the level shifter LS is provided for each of the registers 201 as illustrated in FIG. 6, the circuit scale of each level shifter LS can be reduced in some cases as compared with the structure illustrated in FIG. 3.

Figure 7:
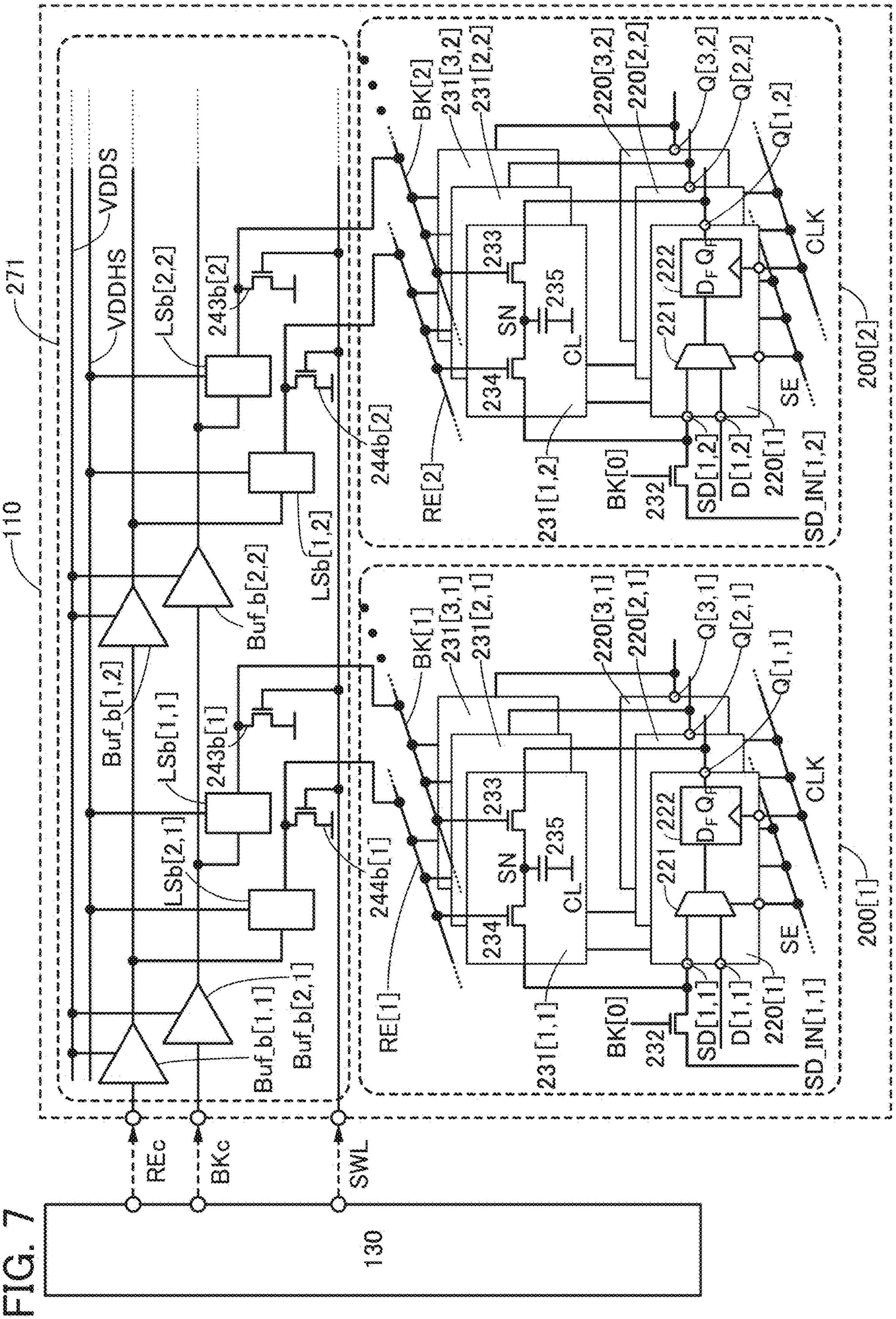
FIG. 7 is a diagram illustrating an example of a structure included in the semiconductor device.

FIG. 7 illustrates a structure in which the register 201 in FIG. 6 is replaced with the register group 200 illustrated in FIG. 4. Note that some components, such as the transistor 242 and the transistor 245, are omitted in FIG. 7, for example.

In FIG. 7, the buffer circuit Buf to which the signal REc is input from the input terminal is denoted as a buffer circuit Buf_b[1,1]. The buffer circuit Buf to which the signal BKc is input from the input terminal is denoted as a buffer circuit Buf_b[2,1].

The level shifter LS supplied with an output from an output terminal of the buffer circuit Buf_b[1,1] is denoted as a level shifter LSb[1,1], the buffer circuit Buf supplied with an output from an output terminal of the level shifter LSb[1,1] is denoted as the buffer circuit Buf[1,2], and the level shifter LS supplied with an output from the buffer circuit Buf[1,2] is denoted as a level shifter LSb[1,2].

The level shifter LS supplied with an output from an output terminal of the buffer circuit Buf_b[2,1] is denoted as a level shifter LSb[2,1], the buffer circuit Buf supplied with an output from an output terminal of the level shifter LSb[2,1] is denoted as the buffer circuit Buf[2,2], and the level shifter LS supplied with an output from the buffer circuit Buf[2,2] is denoted as a level shifter LSb[2,2].

The output terminal of the level shifter LSb[1,1] is electrically connected to the register group 200[1], and the signal RE[1] is supplied from the output terminal to the register group 200[1]. The output terminal of the level shifter LSb[2,1] is electrically connected to the register group 200[1], and the signal BK[1] is supplied from the output terminal to the register group 200[1]. An output terminal of the level shifter LSb[1,2] is electrically connected to the register group 200[2], and the signal RE[2] is supplied from the output terminal to the register group 200[2]. An output terminal of the level shifter LSb[2,2] is electrically connected to the register group 200[2], and the signal BK[2] is supplied from the output terminal to the register group 200[2].

In FIG. 7, the transistor 243 in which one of a source and a drain is connected to the output terminal of the level shifter LSb[1,1] is denoted as a transistor 243*b*[1], the transistor 244 in which one of a source and a drain is connected to the output terminal of the level shifter LSb[2,1] is denoted as a transistor 244*b*[1], the transistor 243 in which the one of the source and the drain is connected to the output terminal of the level shifter LSb[1,2] is denoted as a transistor 243*b*[2], and the transistor 244 in which the one of the source and the drain is connected to the output terminal of the level shifter LSb[2,2] is denoted as a transistor 244*b*[2].

Example of Stacked-Layer Structure

In the semiconductor device of one embodiment of the present invention, a layer 20 formed of a circuit including an OS transistor can be stacked over a layer 10 formed of a circuit including a Si transistor.

Figure 8A:
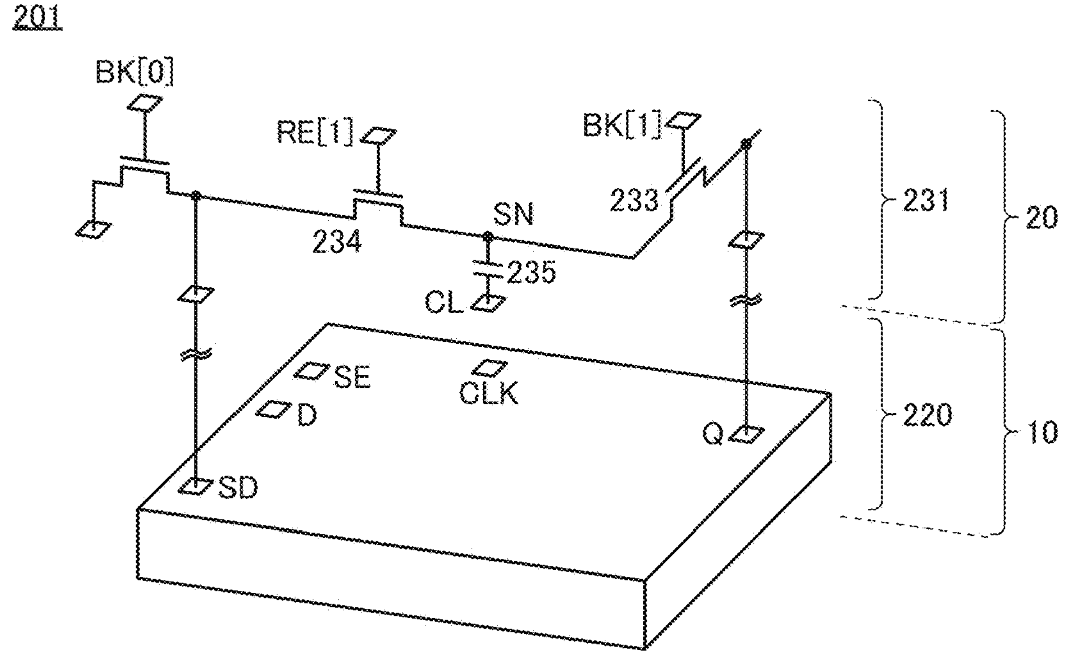
FIG. 8A is a diagram illustrating a structure example of the register.

FIG. 8A illustrates a structure example of the register 201 included in the semiconductor device of one embodiment of the present invention. As in the register 201 illustrated in FIG. 8A, the storage circuit 231 can be stacked over the scan flip-flop 220 formed of a CMOS circuit using a Si transistor.

With this structure, the plurality of storage circuits 231 can be provided within a region where the scan flip-flop 220 is formed; thus, even when the plurality of storage circuits 231 are incorporated, the area overhead of the register 201 can be substantially zero.

Figure 8B:
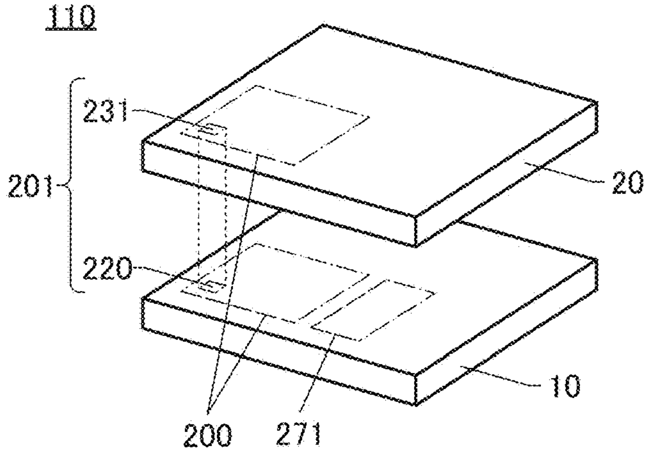
FIG. 8B and FIG. 8C are diagrams each illustrating a structure example of a CPU core.

FIG. 8B illustrates an example of a structure in which the CPU core 110 is provided in the layer 10 and the layer 20. In FIG. 8B, components included in the register group 200 are provided in each of the layer 10 and the layer 20. Specifically, the register group 200 includes the plurality of registers 201 provided in the layer 10 and the layer 20 as illustrated in FIG. 8A, for example. Although not illustrated, components included in the arithmetic portion 111 may be provided in the layer 10, in both the layer 10 and the layer 20, or in the layer 20.

FIG. 8B illustrates an example in which the layer 10 is provided with the signal adjustment portion 271. The signal adjustment portion 271 can be formed using a Si transistor, for example. Note that a region where the layer 10 is provided with the signal adjustment portion 271 may overlap with a region where the layer 20 is provided with the register 201.

Figure 8C:
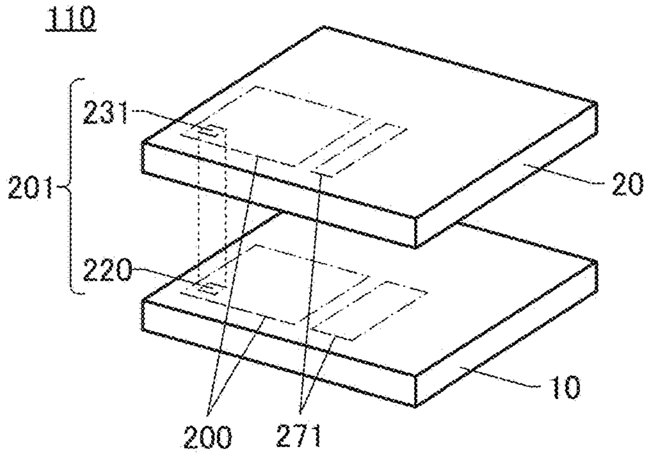

As illustrated in FIG. 8C, components included in the signal adjustment portion 271 may be provided in each of the layer 10 and the layer 20. For example, the OS transistor provided in the layer 20 can be used as each of the transistor 243 and the transistor 244. In the case where the transistor 242 is a p-channel transistor, the Si transistor provided in the layer 10 can be used as the transistor 242, for example. The buffer circuit Buf may be provided in the layer 10 or the layer 20. Alternatively, the buffer circuit Buf may be formed using a semiconductor element included in each of the layer 10 and the layer 20.

Although not illustrated in FIG. 8B and FIG. 8C, the level shifter LS having a function of changing the voltage level of the signal REa, the signal BKa, and the like output from the PMU 130 may be provided in the layer 10 or the layer 20. Alternatively, the level shifter LS may be formed by using a semiconductor element included in each of the layer 10 and the layer 20.

Operation Example 1 of Semiconductor Device

Figure 9A:
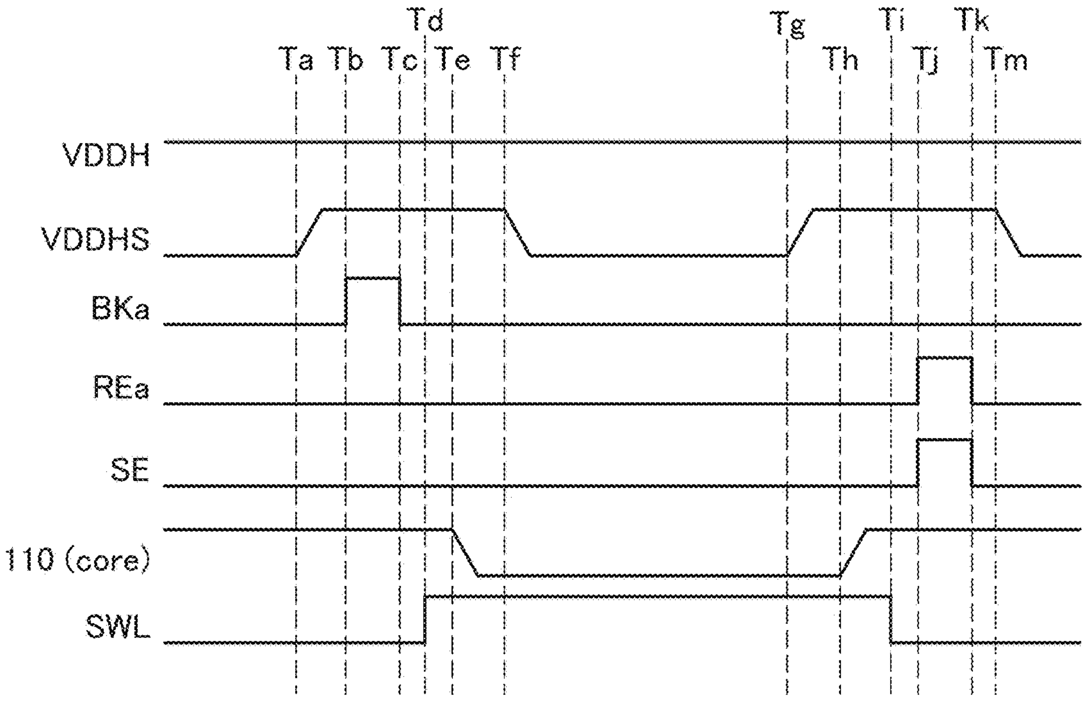
FIG. 9A and FIG. 9B are diagrams each showing an operation example of the semiconductor device.

An operation example of the structure illustrated in FIG. 5 is described with reference to FIG. 9A. FIG. 9A is a timing chart showing an operation example of the semiconductor device of one embodiment of the present invention, and the horizontal axis represents the passage of time. Moreover, 110 (core) corresponds to the operation of the CPU core 110.

When the transistor 242 is turned on at Time Ta, power supply to the level shifter LS and the buffer circuit Buf is started. At Time Ta, the signal SW supplied to the gate of the transistor 242 is set to a potential at which the transistor 242 is turned on, so that the power supply potential VDDHS increases from an L level to an H level. Here, the H level of the power supply potential VDDHS is the second high power supply potential VDDH, for example.

By switching the power supply potential VDDHS to the H level, power is supplied to the level shifter LS and the buffer circuit Buf.

Next, at Time Tb, a signal for performing power gating is supplied from the PMU 130 to the CPU core 110. Specifically, the signal REa and the signal SE remain at an L level, BKa is set to an H level, and then the signal BKa is set to an L level at Time Tc, whereby the data retained in the scan flip-flop 220 is saved in the storage circuit 231 in each of the plurality of registers 201 included in each of the plurality of register groups 200 included in the CPU core 110.

Here, in the case where the all the data in the plurality of register groups 200 included in the CPU core 110 is saved, the signal BKa is supplied to a large number of register groups 200 at Time Tb. In the case where a large number of circuits are operated at the same time, a large amount of current flows instantaneously; thus, a decrease in power supply voltage, an increase in the ground potential, and the like occur, which might cause a malfunction of the circuits. In the semiconductor device of one embodiment of the present invention, when a signal is supplied to the register group 200 through the buffer circuit Buf, signal delay, a change in signal waveform, and the like can be inhibited.

Note that in power gating, power supply may be stopped for the whole CPU core 110 or can be stopped for part of the CPU core 110.

Time Tc is, for example, time one clock after Time Tb. Data can be saved in one clock operation; thus, rapid data saving can be achieved.

Next, at Time Td, the signal SWL is set to a potential at which the transistor 243 and the transistor 244 are turned on. Here, the signal SWL is set to an H level. Thus, the transistor 243 and the transistor 244 in the signal adjustment portion 271 are turned on, and the signal RE and the signal BK supplied to each of the plurality of register groups 200 are set to an L level. When the transistor 243 and the transistor 244 are turned on, the signal RE and the signal BK can be retained at the L level even after power supply to the buffer circuit Buf is stopped.

Then, at Time Te, power supply to the CPU core 110 is stopped. Specifically, for example, power supply to the register group 200, the arithmetic portion 111, and the like is stopped.

Subsequently, at Time Tf, the signal SW supplied to the gate of the transistor 242 is set to a potential at which the transistor 242 is turned off, whereby the power supply potential VDDHS decreases from the H level to an L level. Thus, power supply to the level shifter LS and the buffer circuit Buf is stopped.

Then, at Time Tg, in the return of the CPU core 110 from power gating, first, the signal SW supplied to the gate of the transistor 242 is set to a potential at which the transistor 242 is turned on, so that the power supply potential VDDHS increases from the L level to an H level. Thus, power is supplied to the level shifter LS and the buffer circuit Buf.

Subsequently, at Time Th, the power that has been stopped in the CPU core 110 is supplied again.

Next, at Time Ti, the signal SWL is set to a potential at which the transistor 243 and the transistor 244 are turned off. Here, the signal SWL is set to an L level.

Then, at Time Tj, the signal BKa remains at the L level, the signal REa and the signal SE are set to an H level, and then the signal REa and the signal SE are set to an L level at Time Tk; thus, in the plurality of register groups 200 included in the CPU core 110, the data retained in the storage circuit 231 is loaded into the scan flip-flop 220 in each of the plurality of registers 201 included in the register group 200.

Next, at Time Tm, the signal SW supplied to the gate of the transistor 242 is set to the potential at which the transistor 242 is turned off, whereby the power supply potential VDDHS decreases from the H level to an L level. Thus, power supply to the level shifter LS and the buffer circuit Buf is stopped, and in a period during which data is not retained in the storage circuit 231 in the register 201, power consumption of the signal adjustment portion 271 can be reduced.

Operation Example 2 of Semiconductor Device

Figure 9B:
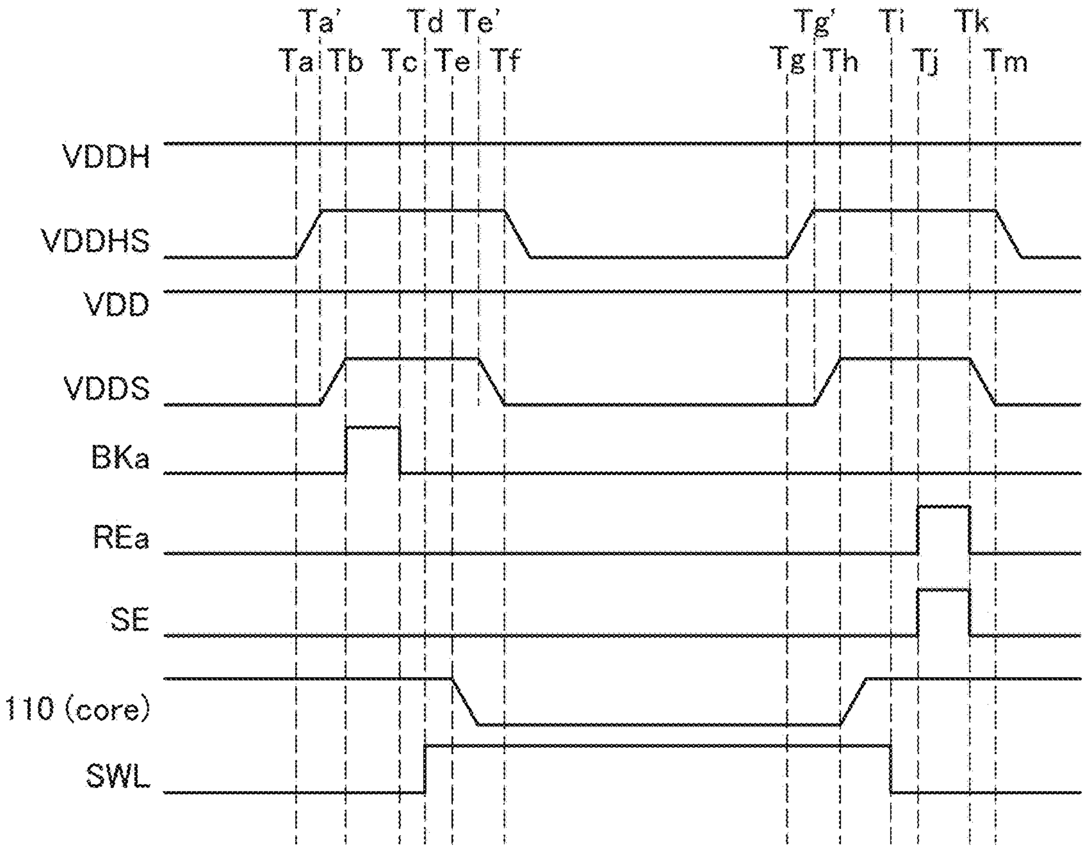

FIG. 9B illustrates an operation example of the structure illustrated in FIG. 7. FIG. 9B is a timing chart showing an operation example of the semiconductor device of one embodiment of the present invention, and the horizontal axis represents the passage of time. Moreover, 110 (core) corresponds to the operation of the CPU core 110.

FIG. 9B shows operations of the high power supply potential VDD and the power supply potential VDDS. FIG. 9A can be referred to for the operations of the second high power supply potential VDDH, the power supply potential VDDHS, the signal BKa, the signal REa, the signal SE, the CPU core 110, and the signal SWL shown in FIG. 9B.

At Time Ta' after Time Ta, the signal SW2 supplied to the gate of the transistor 245 is set to a potential at which the transistor 245 is turned on, whereby the power supply potential VDDHS increases from the L level to an H level. Time Ta' is, for example, time one clock after Time Ta.

At Time Te' after Time Te, the signal SW2 supplied to the gate of the transistor 245 is set to a potential at which the transistor 245 is turned off, whereby the power supply potential VDDS decreases from the H level to an L level. Thus, power supply to the buffer circuit Buf is stopped. Time Te' is, for example, time one clock before Time Tf.

At Time Tg' after Time Tg, the signal SW2 supplied to the gate of the transistor 245 is set to the potential at which the transistor 245 is turned on, whereby the power supply potential VDDHS increases from the L level to an H level. Time Tg' is, for example, time one clock after Time Tg.

At Time Tk, the signal SW2 supplied to the gate of the transistor 245 is set to the potential at which the transistor 245 is turned off, whereby the power supply potential VDDS decreases from the H level to an L level. Thus, power supply to the buffer circuit Buf is stopped. Here, Time Tk is, for example, time one clock before Time Tm.

The structure described in this embodiment can be used in an appropriate combination with the structures described in the other embodiments.

Embodiment 2

In this embodiment, structure examples of a functional circuit that can be used for the semiconductor device of one embodiment of the present invention will be described.

Figure 10A:
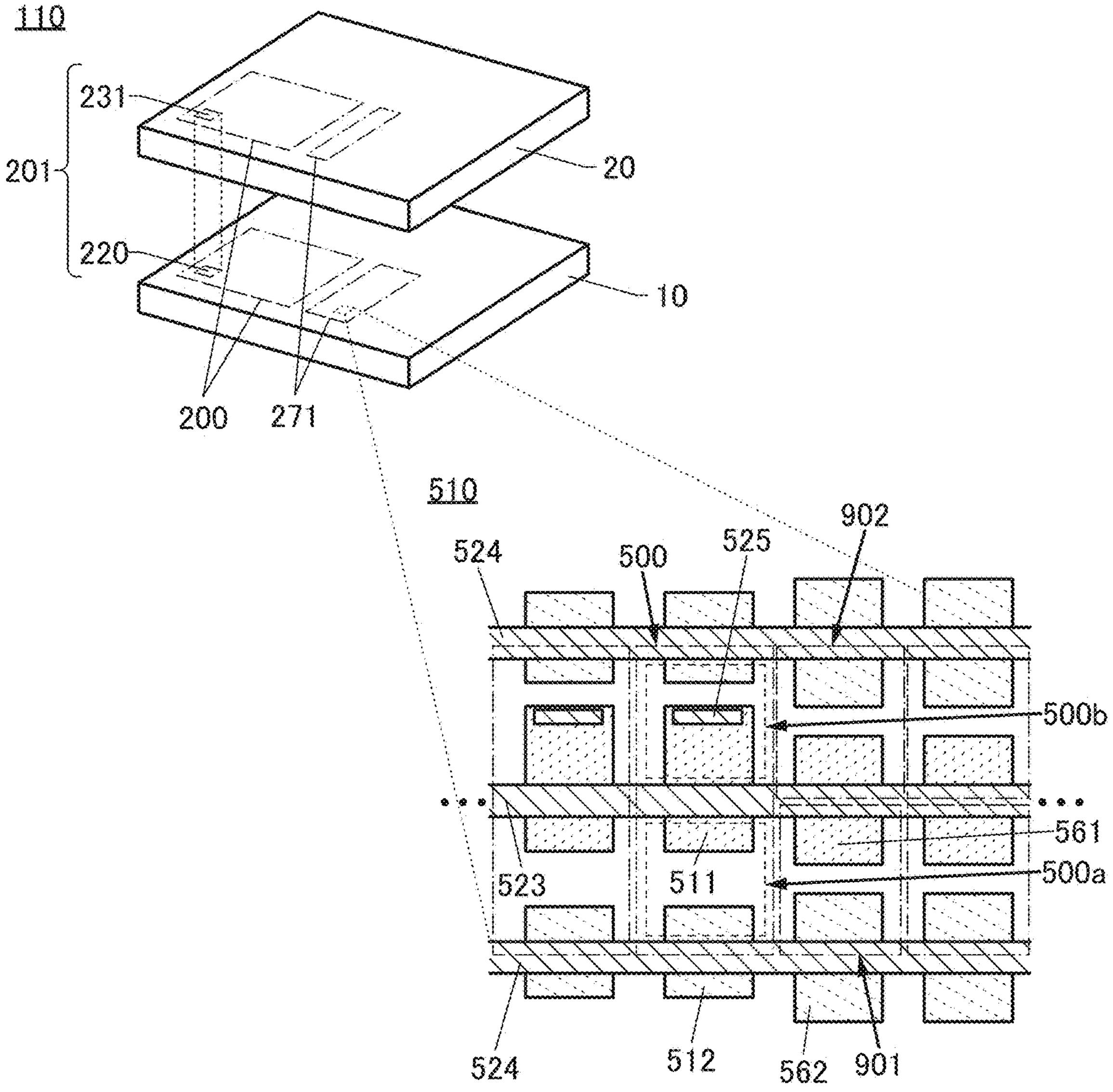
FIG. 10A is a diagram illustrating a structure example of the semiconductor device.

FIG. 10A illustrates a structure example of the CPU core 110 illustrated in FIG. 8C again, and also illustrates an enlarged view of a region of part of the layer 10 (hereinafter, a region 510).

The layer 10 illustrated in FIG. 8A to FIG. 8C and the like can be provided with a functional circuit of one embodiment of the present invention. Here, as a specific example, an example in which a functional circuit is provided in the region of the layer 10 of the signal adjustment portion 271 is described. Although FIG. 10A illustrates an example in which the region 510 is provided as a circuit region including a functional circuit 500 in the region of the layer 10 in the signal adjustment portion 271 illustrated in FIG. 8C, a circuit region including the functional circuit 500 may be provided in the signal adjustment portion 271 in the layer 10 illustrated in FIG. 8B. The circuit region including the functional circuit 500 is not limited to these examples, and a circuit region including the functional circuit 500 can be provided as appropriate in a circuit or the like included in the semiconductor device of one embodiment of the present invention.

As illustrated in FIG. 10A, a VDD wiring 523 and a VSS wiring 524 are alternately arranged in the region 510. The functional circuit 500 can be provided in the region 510. In the region 510, the functional circuit 500 is provided with a VDDHS wiring 525.

The VDD wiring 523 is a wiring including a region extending in one direction, for example, and the VSS wiring 524 is a wiring including a region extending in the same direction as the extending direction of the VDD wiring 523, for example. The functional circuit 500 includes a region 500*a* sandwiched between the VDD wiring 523 and the VSS wiring 524. In a top view illustrated in FIG. 10A, the functional circuit 500 includes the region 500*a* sandwiched between the VDD wiring 523 and the VSS wiring 524 positioned below the VDD wiring 523 in the top view. The VDD wiring 523 and the VSS wiring 524 are arranged in parallel to each other. In the top view illustrated in FIG. 10A, the VSS wiring 524 positioned below the VDD wiring 523 is provided at a position facing the VDD wiring 523 with the region 500*a* therebetween.

In the case where the VDD wiring 523 and the VSS wiring 524 are alternately arranged, the VDD wiring 523 is provided between the two VSS wirings 524 (a first VSS wiring 524 and a second VSS wiring 524). The functional circuit 500 includes the region 500*a* sandwiched between the VDD wiring and the first VSS wiring 524 and a region 500*b* sandwiched between the VDD wiring and the second VSS wiring 524. In the top view illustrated in FIG. 10A, the functional circuit 500 includes the region 500*b* sandwiched between the VDD wiring 523 and the VSS wiring 524 positioned above the VDD wiring 523 in the top view. In the top view illustrated in FIG. 10A, the VSS wiring 524 positioned above the VDD wiring 523 is provided at a position facing the VDD wiring 523 with the region 500*b* therebetween.

The VDD wiring 523 is a wiring to which the high power supply potential VDD is supplied. The VSS wiring 524 is a wiring to which the low power supply potential VSS is supplied. The VDDHS wiring 525 is a wiring to which the power supply potential VDDHS based on the second high power supply potential VDDH is supplied.

Figure 22:
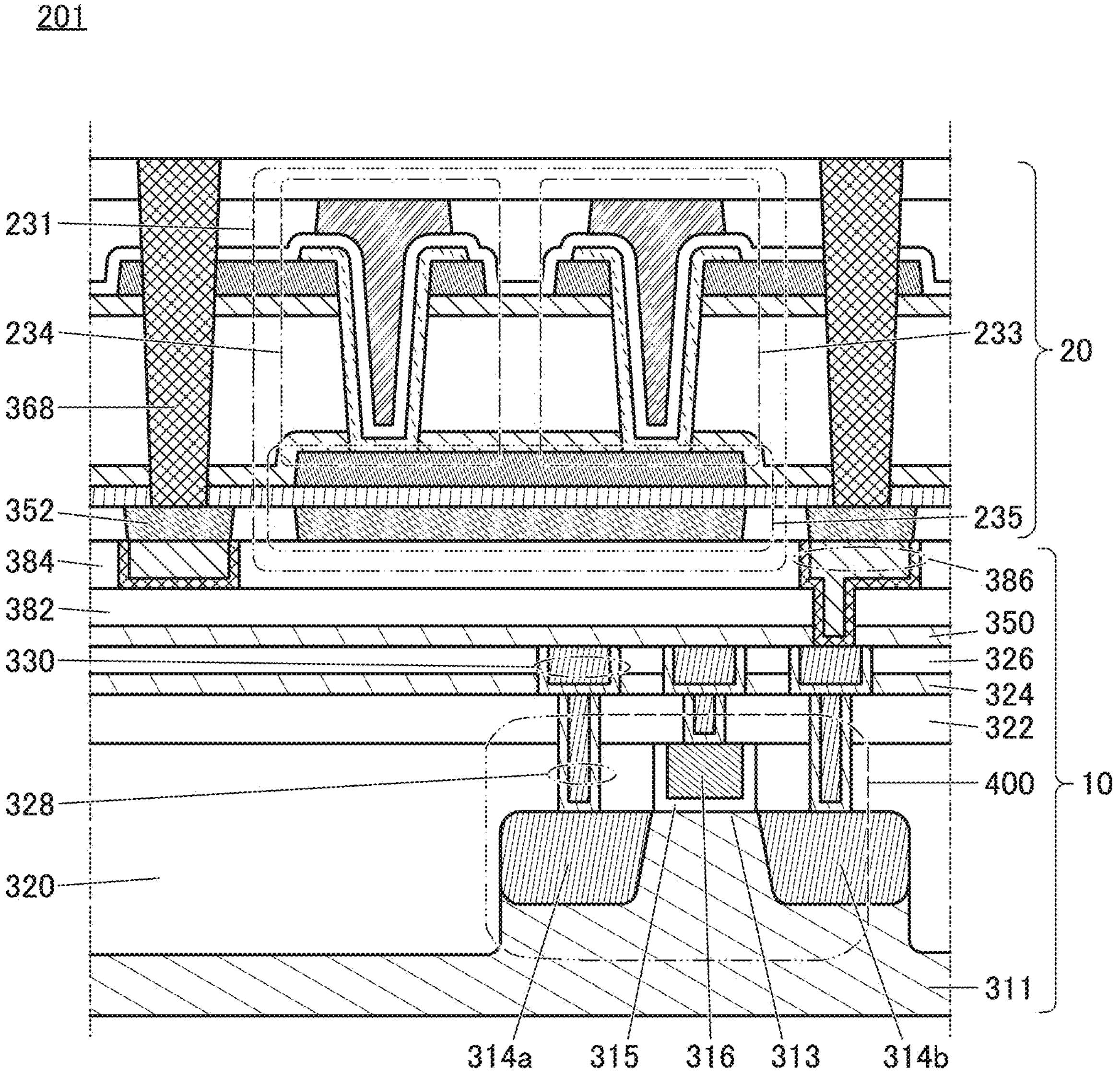
FIG. 22 is a diagram illustrating a structure example of the semiconductor device.

A standard cell can be favorably provided in a region where the VDD wiring 523 and the VSS wiring 524 are alternately arranged as illustrated in FIG. 10A. The standard cell can be formed by combining an element region provided in a semiconductor layer and a conductive layer functioning as a wiring, a plug, a terminal, an electrode, or the like, for example. The semiconductor layer can be electrically connected to the upper conductive layer through a plug or the like. The element region provided in the semiconductor layer includes an element such as a transistor, a capacitor, or a diode, for example. The element region includes a semiconductor region or a low-resistance region, for example. FIG. 22 described later can be referred to for the semiconductor region and the low-resistance region, for example.

The standard cell is a functional circuit having a specific function designed in advance. A semi-custom IC (integrated circuit) is a circuit formed using a standard cell library. With the use of the standard cell, a plurality of standard cells are arranged and connected to each other with a wiring or the like, whereby the semiconductor device can be designed easily in the circuit design of the semiconductor device.

The functional circuit 500 illustrated in FIG. 10A can be used as a standard cell. The functional circuit 500 illustrated in FIG. 10A includes an element region 511 and an element region 512.

In the region 510, another standard cell can be placed next to the functional circuit 500. FIG. 10A illustrates an example in which a functional circuit 901, a functional circuit 902, and the like are provided adjacent to the functional circuit 500. The functional circuit 901 and the functional circuit 902 are standard cells. The functional circuit 901 and the functional circuit 902 are functional circuits including an element region 561, an element region 562, and the like. Although the distance is shown between adjacent functional circuits for easy viewing in FIG. 10A and the like, in the case where standard cells are used as the functional circuits, the standard cells are preferably placed without any space therebetween, for example. In the case where element isolation between adjacent standard cells is necessary, an element isolation region is provided at a boundary portion between the standard cells, whereby the standard cells can be arranged without any space therebetween.

Figure 10B:
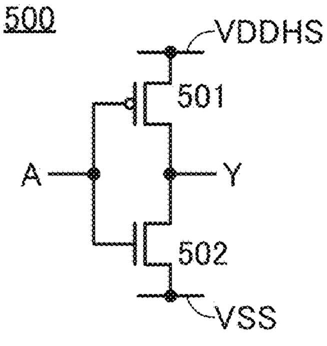
FIG. 10B and FIG. 10C are diagrams illustrating examples of circuits.

FIG. 10B is a circuit diagram of the functional circuit 500. The functional circuit 500 can function as an inverter. The functional circuit 500 includes an input terminal A and an output terminal Y.

Figure 12:
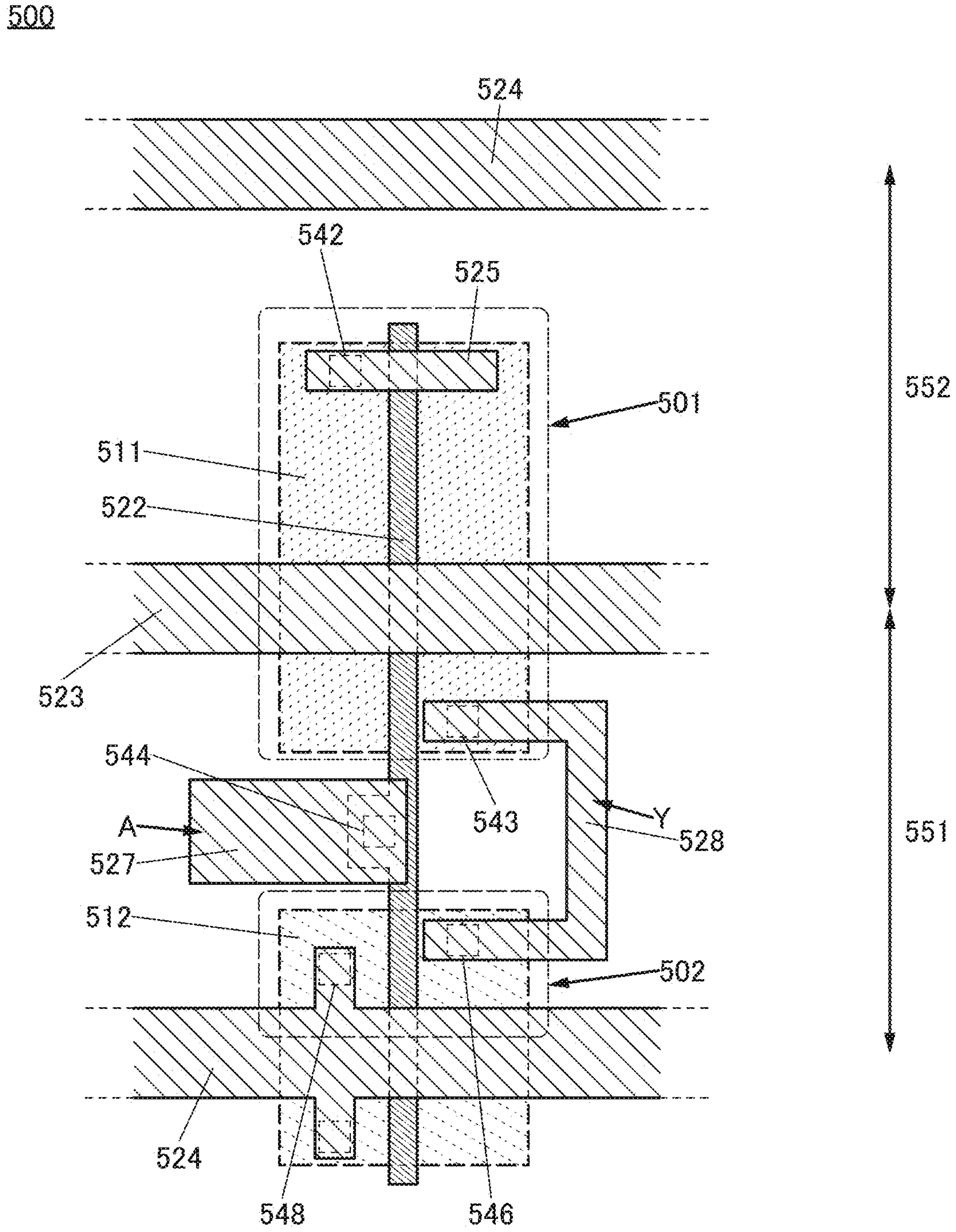
FIG. 12 is a diagram illustrating an example of a circuit layout.

FIG. 12 is a top view illustrating a layout of a circuit of one embodiment of the present invention, and is a specific example of FIG. 10A. In the top view illustrated in FIG. 12, wirings such as a wiring 522, a wiring 528, and a wiring 527 are illustrated in addition to the components illustrated in FIG. 10A. Note that in the semiconductor device of one embodiment of the present invention, the functional circuit 500 illustrated in FIG. 12 can be used as a standard cell. In FIG. 12, the wiring 527 functions as the input terminal A in the circuit diagram shown in FIG. 10B, for example. Alternatively, the wiring 527 is electrically connected to a conductive layer functioning as the input terminal A in the circuit diagram shown in FIG. 10B. The wiring 528 functions as the output terminal Y in the circuit diagram shown in FIG. 10B. Alternatively, the wiring 528 is electrically connected to a conductive layer functioning as the output terminal Y in the circuit diagram shown in FIG. 10B.

Figure 10C:
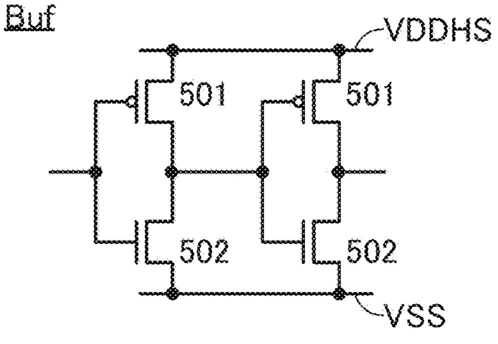

The functional circuit 500 illustrated in FIG. 10A and FIG. 12 can be used as the buffer circuit Buf described in the above embodiment, for example. For the buffer circuit Buf or the like described in the above embodiment, a structure where a plurality of functional circuits 500 illustrated in FIG. 10B and FIG. 12 are connected in series is preferably employed. By connecting an even number of functional circuits 500, a non-inverted signal of an input from the buffer circuit can be output. FIG. 10C is a circuit diagram of the buffer circuit Buf where the two functional circuits 500 are connected.

Figure 11:
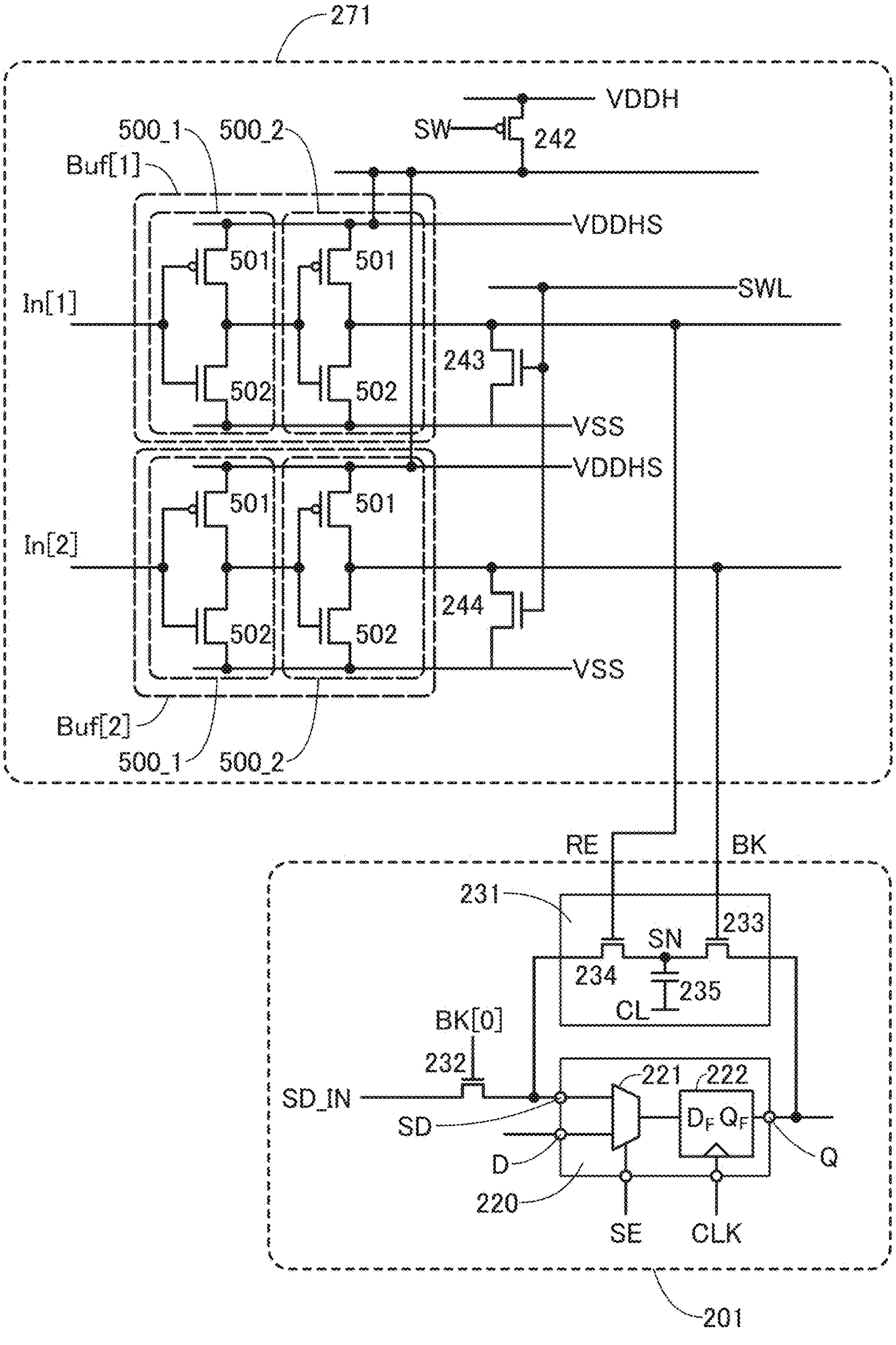
FIG. 11 is a diagram illustrating a structure example of the semiconductor device.

FIG. 11 illustrates a structure in which the buffer circuit Buf shown in FIG. 10C is applied to the CPU core 110 illustrated in FIG. 3. Note that some components are omitted in FIG. 11.

FIG. 11 illustrates the buffer circuit Buf that supplies the signal RE to the register 201 (denoted as a buffer circuit Buf[1] in FIG. 11) and the buffer circuit Buf that supplies the signal BK (denoted as a buffer circuit Buf[2] in FIG. 11). The buffer circuit Buf[1] and the buffer circuit Buf[2] each include the functional circuit 500 in the first stage (denoted as a functional circuit 500_1 in FIG. 11) and the functional circuit 500 in the second stage (denoted as a functional circuit 500_2 in FIG. 11).

One of the source and the drain of the transistor 242 is electrically connected to at least one of a wiring and a terminal to which the second high power supply potential VDDH is supplied.

In each of the functional circuits 500 (the functional circuit 500_1 and the functional circuit 500_2) illustrated in FIG. 11, one of a source and a drain of a transistor 501 is electrically connected to the other of the source and the drain of the transistor 242, and one of a source and a drain of a transistor 502 is electrically connected to at least one of a wiring and a terminal to which the low power supply potential VSS is supplied.

An output from the functional circuit 500_2 included in the buffer circuit Buf[1] is supplied as the signal RE to the transistor 234 included in the register 201. In the functional circuit 500_2 included in the buffer circuit Buf[1], the other of the source and the drain of the transistor 501 and the other of the source and the drain of the transistor 502 are electrically connected to a gate of the transistor 234 included in the register 201.

An output from the functional circuit 500_2 included in the buffer circuit Buf[2] is supplied as the signal BK to the transistor 233 included in the register 201. In the functional circuit 500_2 included in the buffer circuit Buf[2], the other of the source and the drain of the transistor 501 and the other of the source and the drain of the transistor 502 are electrically connected to a gate of the transistor 233 included in the register 201.

The functional circuit 500 illustrated in FIG. 12 includes the gate wiring 522, the VDD wiring 523, the VSS wiring 524, the VDDHS wiring 525, the wiring 527, and the wiring 528. FIG. 12 illustrates the element region 511 and the element region 512 in each of which a channel formation region, a low-resistance region, and the like of a transistor are provided. The element region 511 is a region where a p-channel transistor is provided, for example, and includes a p-type low-resistance region formed by addition of an impurity to a semiconductor layer, for example. The element region 512 is a region where an n-channel transistor is provided, for example, and includes an n-type low-resistance region formed by addition of an impurity to the semiconductor layer, for example.

The functional circuit 500 illustrated in FIG. 12 includes the transistor 501 and the transistor 502 that are provided between the VDD wiring 523 and the VSS wiring 524. A channel formation region, a low-resistance region, and the like of the transistor 501 can be provided in the element region 511. A channel formation region, a low-resistance region, and the like of the transistor 502 can be provided in the element region 512.

The gate wiring 522 has a function of gate electrodes of the transistor 501 and the transistor 502.

An opening 542 is an opening provided in an insulator between the VDDHS wiring 525 and the element region 511, and a plug or the like can be provided in the opening, for example. One of the source and the drain of the transistor 501 can be electrically connected to the VDDHS wiring 525 through the plug.

The VDDHS wiring 525 is preferably electrically connected to the transistor 242 described in the above embodiment. The VDDHS wiring 525 is electrically connected to one of a source and a drain of the transistor 242, for example. Although not illustrated in FIG. 12, for example, the VDDHS wiring 525 is electrically connected to a conductive layer such as an electrode or a wiring provided in an upper layer of the VDDHS wiring 525 through a plug or the like, and is electrically connected to the one of the source and the drain of the transistor 242 through the conductive layer.

An opening 548 is an opening provided in an insulator between the VSS wiring 524 and the element region 512, and a plug or the like can be provided in the opening, for example. One of the source and the drain of the transistor 502 can be electrically connected to the VSS wiring 524 through the plug.

An opening 543 is an opening provided in an insulator between the wiring 528 and the element region 511, and a plug or the like can be provided in the opening, for example. An opening 546 is an opening provided in an insulator between the wiring 528 and the element region 512, and a plug or the like can be provided in the opening, for example. The other of the source and the drain of the transistor 501 and the other of the source and the drain of the transistor 502 can be electrically connected to each other through the plug provided in the opening 543, the plug provided in the opening 546, and the wiring 528.

An opening 544 is an opening provided in an insulator between the gate wiring 522 and the wiring 527, and a plug or the like can be provided in the opening. The wiring 527 and the gate wiring 522 can be electrically connected to each other through the plug.

In the functional circuit 500, the functional circuit 500 is placed across two regions of a region 551 and a region 552 positioned adjacent to the region 551 in the top view. The region 551 is a region between the VSS wiring 524 and the VDD wiring 523 placed adjacent to the VSS wiring 524 in the top view, and the region 552 is a region between the VDD wiring 523 and the VSS wiring 524 placed adjacent to the VDD wiring 523 in the top view. In the functional circuit 500, a region provided in the region 551 is referred to as the region 500*a*, and a region provided in the region 552 is referred to as the region 500*b* (illustrated in FIG. 13 described later).

Figure 13:
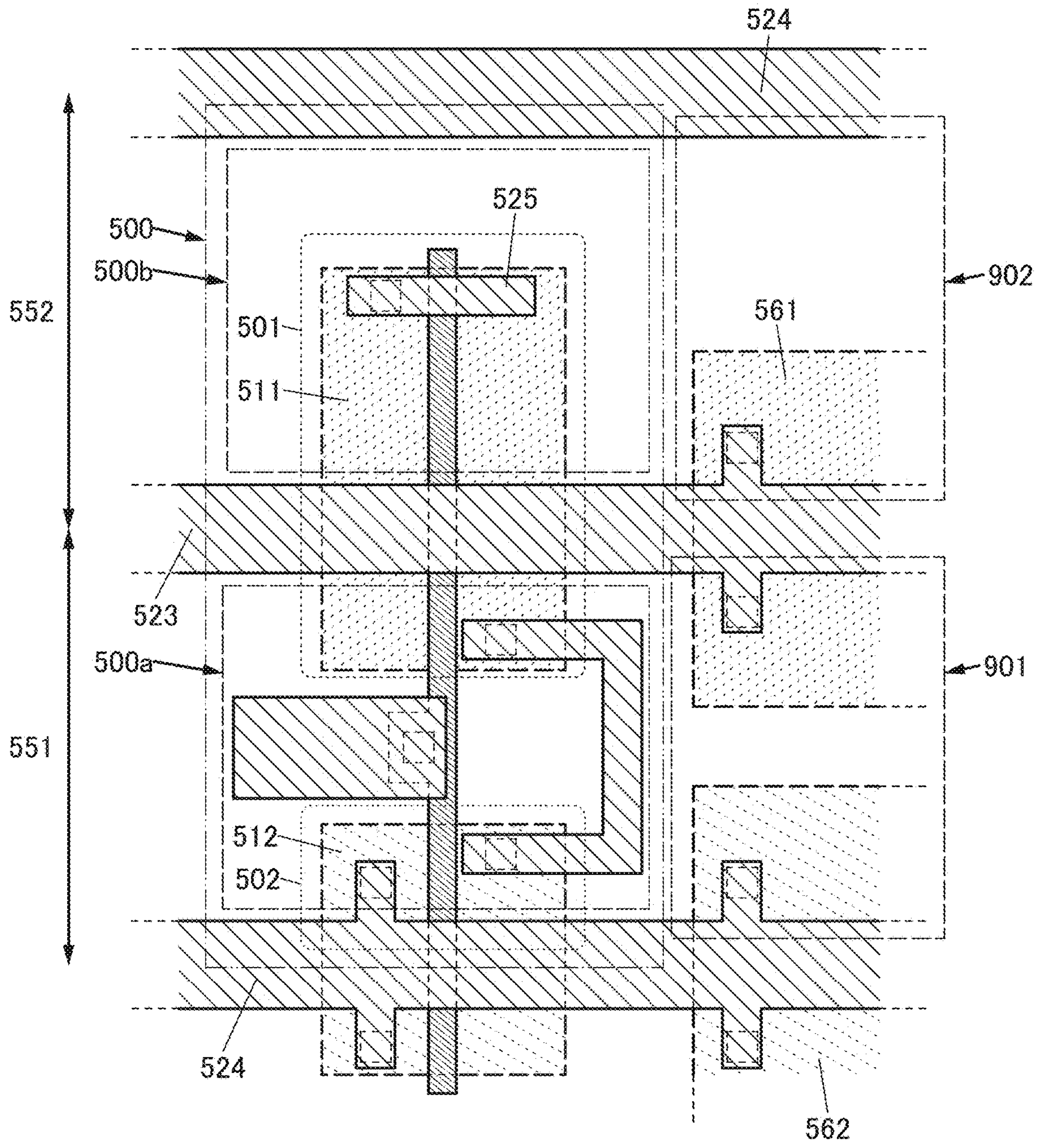
FIG. 13 is a diagram illustrating an example of a circuit layout.

FIG. 13 is a layout diagram including the functional circuit 500 and a region adjacent to the functional circuit. In FIG. 13, the functional circuit 901 and the functional circuit 902 are provided in the region adjacent to the functional circuit 500. The functional circuit 901 includes the element region 561 and the element region 562. The functional circuit 902 includes the element region 561. The element region 561 includes a region included in the functional circuit 901 and a region included in the functional circuit 902 with the wiring 523 therebetween. The element region 561 and the element region 562 are provided in a semiconductor layer. The element region 561 includes a low-resistance region electrically connected to the VDD wiring 523, for example. The element region 562 includes a low-resistance region electrically connected to the VSS wiring 524. For example, a transistor can be provided in each of the element region 561 and the element region 562. Although not illustrated, a gate wiring can be provided to overlap with the element region 561, for example.

The element region 511, the element region 512, the element region 561, and the element region 562 are preferably provided in a layer containing silicon, for example.

The functional circuit 500 can be used as the buffer circuit included in the semiconductor device of one embodiment of the present invention. For example, a structure in which a plurality of stages of functional circuits 500 are connected in series can be used for the buffer circuit included in the semiconductor device of one embodiment of the present invention.

The functional circuit 500 can be formed by using the VDDHS wiring 525 in addition to the VDD wiring 523 and the VSS wiring 524, and the VDDHS wiring 525 can be provided between the VDD wiring 523 and the VSS wiring 524 as illustrated in the top views of FIG. 12 and FIG. 13. Thus, the VDDHS wiring 525 can be easily placed side by side with another standard cell provided between the VDD wiring 523 and the VSS wiring 524 and easily incorporated into a circuit region formed using the standard cell; thus, the layout flexibility can be increased in circuit design.

Figure 14:
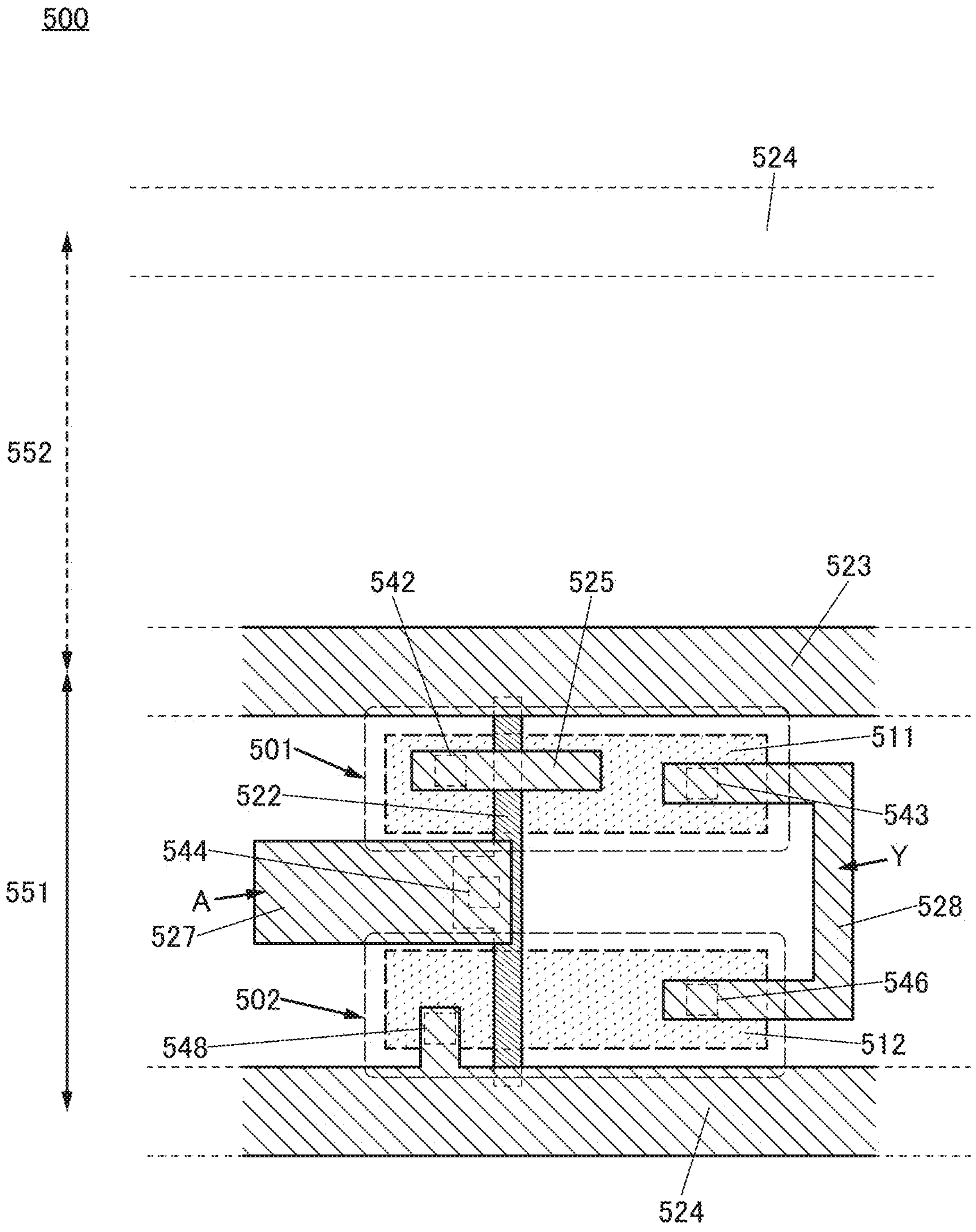
FIG. 14 is a diagram illustrating an example of a circuit layout.

FIG. 14 illustrates a layout different from that in FIG. 12 of the functional circuit 500. The functional circuit 500 illustrated in FIG. 14 is provided in the region 551. Since the functional circuit 500 illustrated in FIG. 14 can be placed only in the region 551, another functional circuit can be provided in the region 552, for example. Alternatively, another functional circuit 500 may be arranged in the region 552 and the two functional circuits 500 are arranged in the vertical direction in FIG. 14. For example, the two functional circuits 500 may be provided in the region 551 and the region 552 with the VDD wiring 523 therebetween. Here, in FIG. 14 and the like, the VDD wiring 523 and the VSS wiring 524 extend in the horizontal direction. Thus, the vertical direction in FIG. 14 is a direction perpendicular to the extending direction of each of the VDD wiring 523 and the VSS wiring 524.

The structure described in this embodiment can be used in an appropriate combination with the structures described in the other embodiments.

Embodiment 3

In this embodiment, a structure example and an operation example of a semiconductor device of one embodiment of the present invention will be described. Note that in this embodiment, the structure examples and the operation examples of the semiconductor device described in the above embodiments can be referred to and combined as appropriate.

Structure Example 4

An example in which the semiconductor device of one embodiment of the present invention has a function of power gating on each block is described below with reference to FIG. 15.

Figure 15:
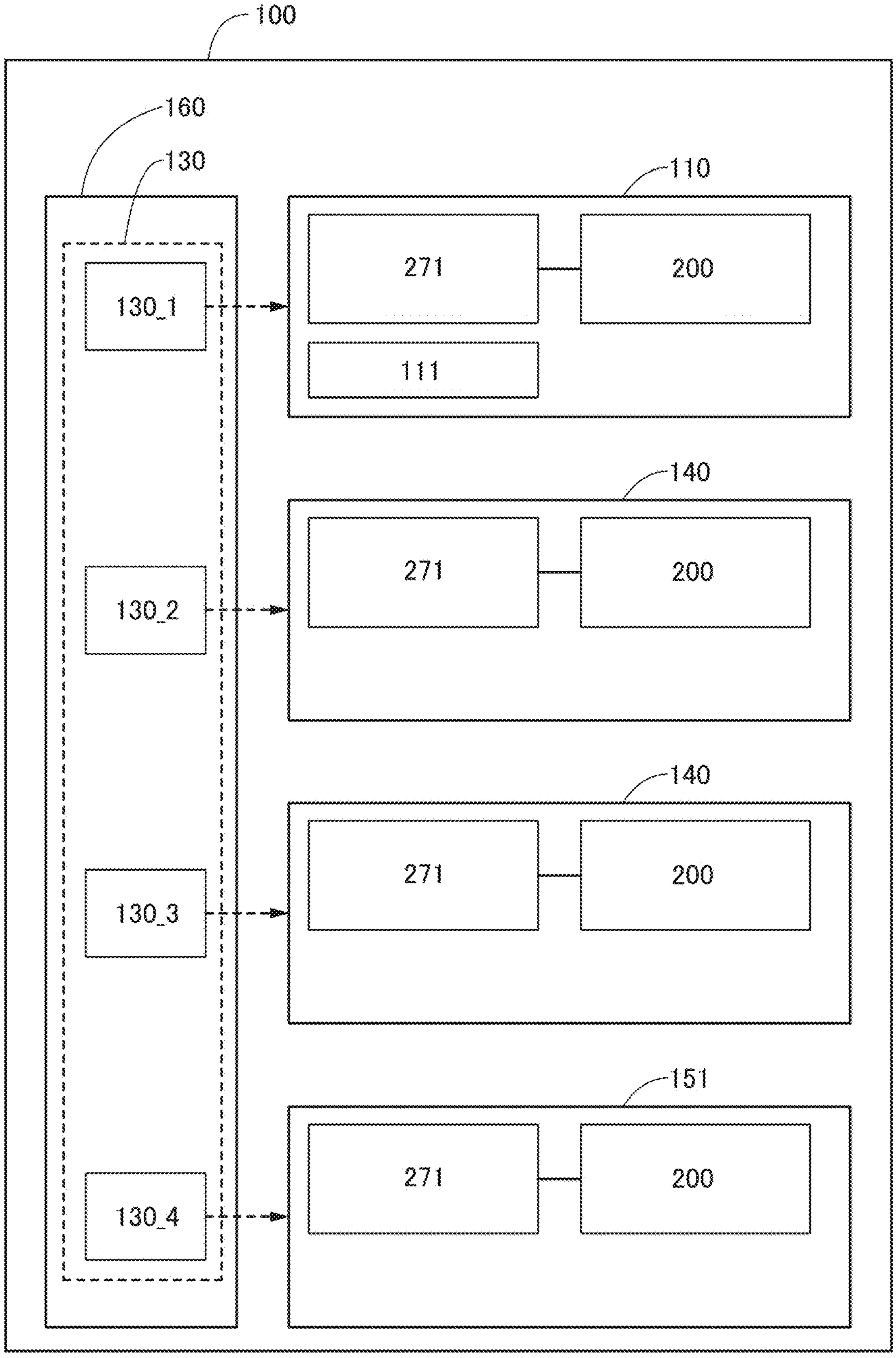
FIG. 15 is a diagram illustrating a structure example of the semiconductor device.

As illustrated in FIG. 15, the semiconductor device 100 preferably has a function of individually power gating on each block (a semiconductor device such as a CPU or a peripheral circuit). Note that each block preferably includes the register group 200 and the signal adjustment portion 271 described above.

FIG. 15 illustrates an example in which the PMU 130 includes a plurality of blocks (four blocks, a PMU block 130_1, a PMU block 130_2, a PMU block 130_3, and a PMU block 130_4) corresponding to each block. FIG. 15 illustrates an example in which the PMU 130_1 supplies a signal to the CPU core 110, the PMU 130_2 and the PMU 130_3 supply signals to the input/output IF 140 (a first input/output IF 140 and a second input/output IF 140), and the PMU 130_4 supplies a signal to a memory 151. Here, the memory 151 may be an external main memory or a memory included in the semiconductor device 100, for example.

As illustrated in FIG. 15, each of the input/output IF 140 (the first input/output IF 140 and the second input/output IF 140) and the memory 151 preferably includes a signal adjustment portion and a register group. For structures, functions, and the like of the signal adjustment portion and the register group included in the input/output IF 140 (the first input/output IF 140 and the second input/output IF 140) and the memory 151, the signal adjustment portion 271 and the register group 200 included in the CPU core 110 can be referred to, respectively, and the same reference numerals as those of the signal adjustment portion 271 and the register group 200 included in the CPU core 110 are used in FIG. 15.

Figure 16:
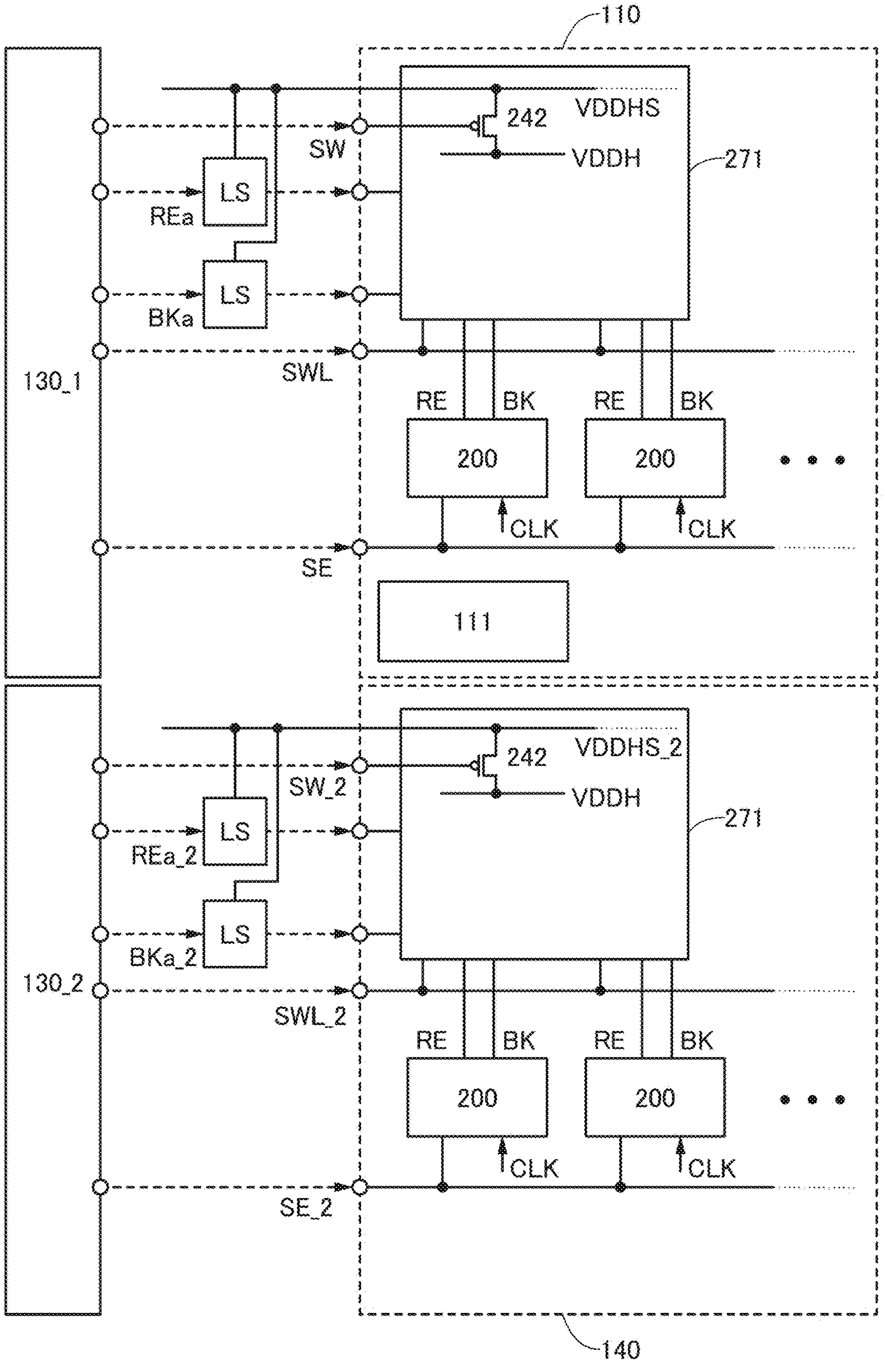
FIG. 16 is a diagram illustrating an example of a structure included in the semiconductor device.

Among the structures illustrated in FIG. 15, FIG. 16 selectively illustrates the CPU core 110, the input/output IF 140 (the first input/output IF 140), and the PMU block 130_1 and the PMU block 130_2 that are connected to the CPU core 110 and the input/output IF 140, respectively. Although not illustrated in FIG. 16, FIG. 3 and the like can be referred to for the structure of the signal adjustment portion 271. FIG. 4 and the like can be referred to for the register group 200.

The signal SW, the signal SWL, and the signal SE are supplied from the PMU block 130_1 to the CPU core 110. Each of the signal REa and the signal BKa is supplied from the PMU block 130_1 to the CPU core 110 through the level shifter LS.

A signal SW_2, a signal SWL_2, and a signal SE_2 are supplied from the PMU block 130_2 to the input/output IF 140 (the first input/output IF 140). Each of a signal REa_2 and a signal BKa_2 is supplied from the PMU block 130_2 to the input/output IF 140 (the first input/output IF 140) through the level shifter LS. The signal adjustment portion 271 included in the input/output IF 140 (the first input/output IF 140) includes the transistor 242, the transistor 243 (not illustrated), the transistor 244 (not illustrated), a plurality of buffer circuits Buf (not illustrated), and the like. A gate of the transistor 242 is electrically connected to at least one of a wiring and a terminal to which the signal SW_2 is supplied. One of a source and a drain of the transistor 242 is electrically connected to at least one of a wiring and a terminal to which the second high power supply potential VDDH is supplied. When the transistor 242 is turned on, a potential corresponding to the second high power supply potential VDDH is supplied as a power supply potential VDDHS_2, and when the transistor 242 is turned off, power supply to the buffer circuit Buf included in the signal adjustment portion 271 and the level shifter LS is stopped.

For the functions, the potentials, electrical connection between the signal adjustment portion 271, the register group 200, and the like of the signal SW_2, the signal SWL_2, the signal SE_2, the signal REa_2, the signal BKa_2, and the power supply potential VDDHS_2, for example, the signal SW, the signal SWL, the signal SE, the signal REa, the signal BKa, and the power supply potential VDDHS can be referred to as appropriate.

Operation Example 2 of Semiconductor Device

Figure 17:
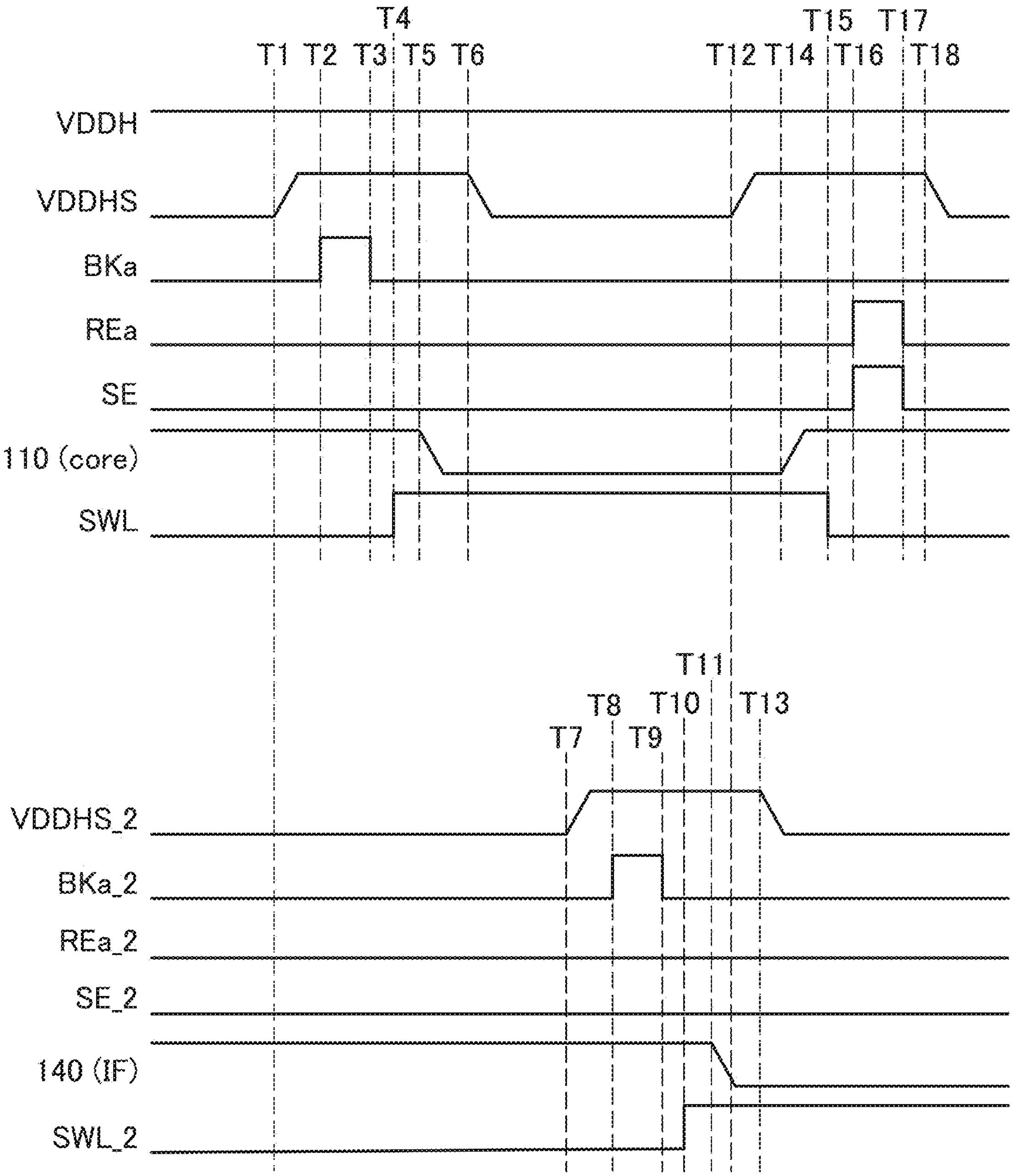
FIG. 17 is a diagram showing an operation example of the semiconductor device.

An operation example of the structure illustrated in FIG. 16 is described with reference to FIG. 17. FIG. 17 is a timing chart showing an operation example of the semiconductor device of one embodiment of the present invention, and the horizontal axis shows the passage of time (Time). In addition, 110 (core) corresponds to the operation of the CPU core 110, and 140 (IF) corresponds to the operation of the input/output IF 140 (the first input/output IF 140).

For Time T1 to Time T6, Time Ta to Tf in FIG. 9A can be referred to.

Next, at Time T7, the signal SW_2 supplied to the gate of the transistor 242 included in the signal adjustment portion 271 of the input/output IF 140 (the first input/output IF 140) is set to a potential at which the transistor 242 is turned on, whereby the power supply potential VDDHS_2 increases from an L level to an H level.

When the power supply potential VDDHS_2 is switched to the H level, power is supplied to the level shifter LS for supplying a signal to the input/output IF 140 (the first input/output IF 140) and the buffer circuit Buf (not illustrated) included in the signal adjustment portion 271 of the input/output IF 140 (the first input/output IF 140).

Next, at Time T8, the signal REa_2 and the signal SE_2 remain at the L level, the signal BKa_2 is set to an H level, and then the signal BKa_2 is set to an L level at Time T9, whereby data retained in the scan flip-flop 220 in each of the plurality of registers 201 included in the register group 200 is saved in the storage circuit 231 in the plurality of register groups 200 included in the input/output IF 140 (the first input/output IF 140).

Time T9 is, for example, time one clock after Time T8.

Subsequently, at Time T10, the signal SWL_2 is set to a potential at which the transistor 243 and the transistor 244 (each of which is not illustrated) included in the signal adjustment portion 271 of the input/output IF 140 (the first input/output IF 140) are turned on. Here, the signal SWL_2 is set to an H level. Accordingly, the signal RE and the signal BK can be retained at the L level even after power supply to the buffer circuit Buf is stopped.

Next, at Time T11, power supply to the input/output IF 140 (the first input/output IF 140) is stopped. Specifically, for example, power supply to the register group 200, the arithmetic portion 111, or the like is stopped.

For Time T12, Time Tg in FIG. 9A can be referred to.

Subsequently, at Time T13, the signal SW supplied to the gate of the transistor 242 included in the signal adjustment portion 271 of the input/output IF 140 (the first input/output IF 140) is set to a potential at which the transistor 242 is turned off, whereby the power supply potential VDDHS decreases from the H level to an L level. Thus, power supply to the level shifter LS and the buffer circuit Buf is stopped.

For Time T14 to Time T18, Time Th to Time Tm in FIG. 9A can be referred to.

The structure described in this embodiment can be used in an appropriate combination with the structures described in the other embodiments.

Embodiment 4

In this embodiment, structure examples of a semiconductor device of embodiments of the present invention will be described.

Figure 18A:
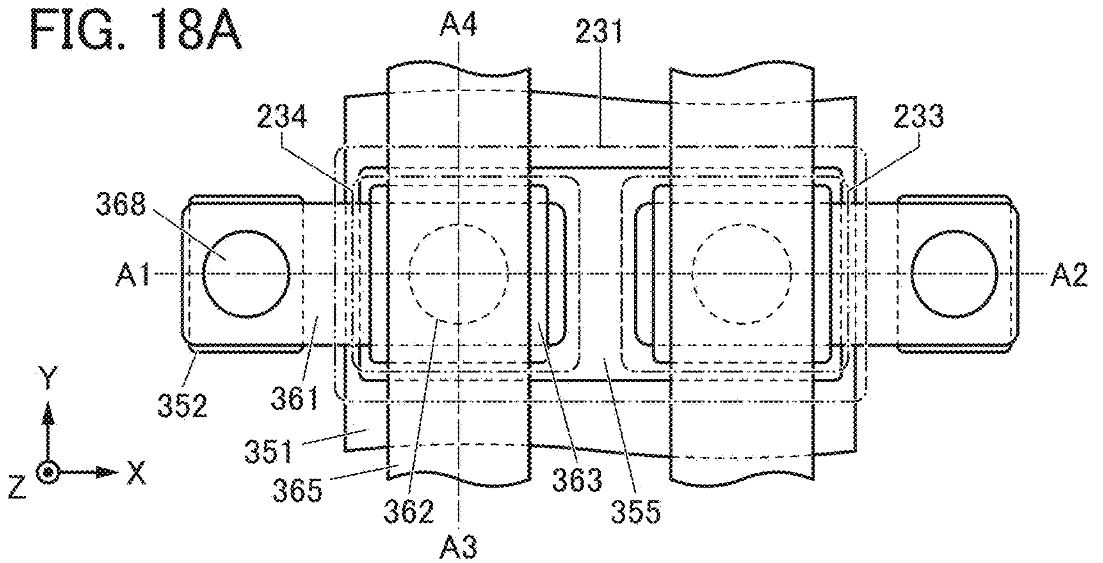
FIG. 18A to FIG. 18C are diagrams illustrating a structure example of the semiconductor device.
Figure 18B:
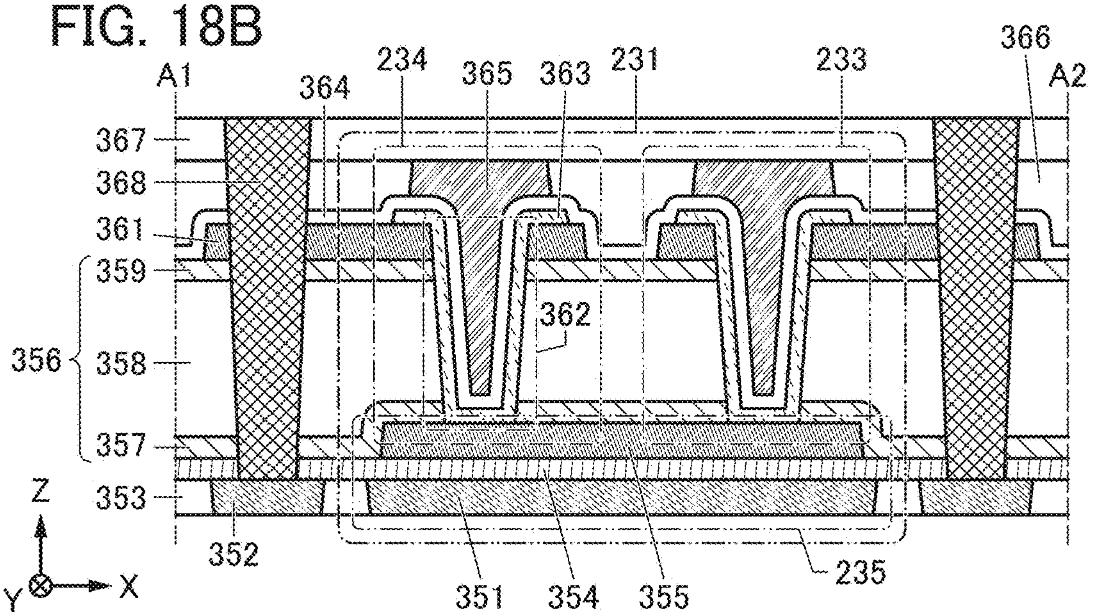
Figure 18C:
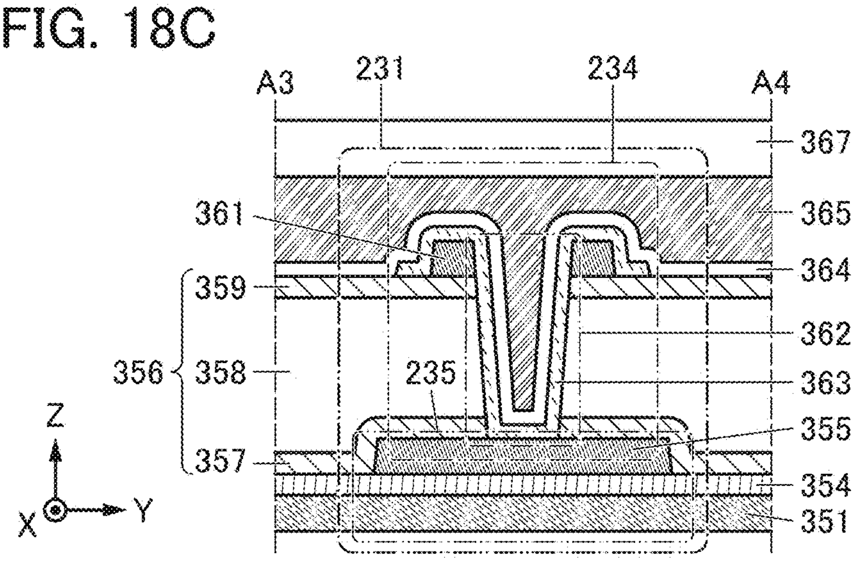

FIG. 18A is a plan view of a structure including the storage circuit 231, which is a type of semiconductor device, seen from the Z direction. FIG. 18B is a cross-sectional view of a portion indicated by the dashed-dotted line A1-A2 in FIG. 18A, which is seen from the Y direction. FIG. 18C is a cross-sectional view of a portion indicated by the dashed-dotted line A3-A4 in FIG. 18A, which is seen from the X direction. Note that for clarity of the drawing, some components are omitted in the top view of FIG. 18A. Note that in this embodiment and the like, the stacking direction of the layers included in the semiconductor device is the Z direction.

The storage circuit 231 includes the transistor 233, the transistor 234, and the capacitor 235.

Each of a conductive layer 361 and a conductive layer 355 functions as one or the other of a source electrode and a drain electrode of the transistor 234. The transistor 233 has a structure similar to that of the transistor 234 and is formed at the same time as the transistor 234. The conductive layer 355 and a conductive layer 351 function as one electrode and the other electrode of the capacitor 235, and an insulating layer 354 functions as a dielectric of the capacitor 235.

The structure illustrated in FIG. 18A to FIG. 18C includes an insulating layer 353 and the conductive layer 351 and a conductive layer 352 that are formed to be embedded in the insulating layer 353. The conductive layer 351 and the conductive layer 352 can be formed at the same time using the same material in the same manufacturing step. A chemical mechanical polishing (CMP) method or the like is preferably performed so that the top surfaces of the insulating layer 353, the conductive layer 351, and the conductive layer 352 are level with or substantially level with one another (in the Z direction). The unevenness of a sample surface is reduced by performing CMP treatment, which increases the coverage with insulating layers and conductive layers that are to be formed later.

The insulating layer 354 is provided over the insulating layer 353, the conductive layer 351, and the conductive layer 352, and the conductive layer 355 is provided over the insulating layer 354. The conductive layer 351 has a region overlapping with the conductive layer 355 with the insulating layer 354 therebetween.

In addition, the conductive layer 351, the conductive layer 355, and the insulating layer 354 are included. A region where the conductive layer 351 and the conductive layer 355 overlap with each other with the insulating layer 354 therebetween functions as the capacitor 235.

A material with a high dielectric constant (also referred to as a "high-k material") may be used for the insulating layer 354 functioning as the dielectric of the capacitor 235. When a high-k material is used for the insulating layer 354, the capacitance needed for the capacitor 235 can be ensured and the insulating layer 354 can have a large thickness. The insulating layer 354 with a large thickness increases the withstand voltage between the conductive layer 351 and the conductive layer 355 to inhibit electrostatic breakdown. As a result, the reliability of the capacitor 235 is improved. Thus, the reliability of the semiconductor device including the capacitor 235 is improved.

A ferroelectric may be used for the insulating layer 354 functioning as the dielectric of the capacitor 235. The ferroelectric has a property of causing internal polarization by application of an electric field from the outside and maintaining the polarization even after the electric field is made zero. Thus, with a capacitor (also referred to as a "ferroelectric capacitor") that includes this material as a dielectric, a nonvolatile storage element can be achieved.

The storage circuit 231 illustrated in FIG. 18A to FIG. 18C includes an insulating layer 357 over the insulating layer 354 and the conductive layer 355, an insulating layer 358 over the insulating layer 357, and an insulating layer 359 over the insulating layer 358. Note that the insulating layer 357, the insulating layer 358, and the insulating layer 359 are collectively referred to as an insulating layer 356 or a spacer layer in some cases. The conductive layer 361 is provided over the insulating layer 359.

In a region overlapping with part of the conductive layer 355, an opening 362 is provided in the conductive layer 361, the insulating layer 359, the insulating layer 358, and the insulating layer 357. The storage circuit 231 illustrated in each of FIG. 18A to FIG. 18C includes a semiconductor layer 363 that covers the opening 362. The semiconductor layer 363 includes a region overlapping with the bottom portion of the opening 362 and a region overlapping with a side surface of the opening 362. That is, the semiconductor layer 363 includes a region in contact with the insulating layer 356. In FIG. 18B and FIG. 18C, the semiconductor layer 363 includes a region in contact with a side surface of the insulating layer 357, a region in contact with a side surface of the insulating layer 358, and a region in contact with a side surface of the insulating layer 359.

The semiconductor layer 363 includes a region in contact with the conductive layer 355 and a region in contact with the conductive layer 361. That is, part of the semiconductor layer 363 is electrically connected to the conductive layer 355, and another part of the semiconductor layer 363 is electrically connected to the conductive layer 361. The semiconductor layer 363 may include a region extending beyond an end portion of the conductive layer 361 (see FIG. 18A and FIG. 18C).

An insulating layer 364 is provided over the insulating layer 359, the conductive layer 361, and the semiconductor layer 363. A conductive layer 365 is provided over the insulating layer 364. In FIG. 18A, the conductive layer 365 extends in the Y direction.

The insulating layer 364 and the conductive layer 365 each include a region overlapping with the opening 362. In the opening 362, the insulating layer 364 includes a region overlapping with a side surface of the conductive layer 361 with the semiconductor layer 363 therebetween and a region overlapping with a side surface of the insulating layer 356 (the insulating layer 359, the insulating layer 358, and the insulating layer 357). In the opening 362, the conductive layer 365 includes a region overlapping with the side surface of the opening 362 (the side surface of the insulating layer 356) with the insulating layer 364 and the semiconductor layer 363 therebetween.

The thickness of the semiconductor layer 363 is preferably greater than or equal to 1 nm, greater than or equal to 3 nm, or greater than or equal to 5 nm and less than or equal to 20 nm, less than or equal to 15 nm, less than or equal to 12 nm, or less than or equal to 10 nm. The thickness of the insulating layer 364 is preferably greater than or equal to 0.5 nm and less than or equal to 15 nm, further preferably greater than or equal to 0.5 nm and less than or equal to 12 nm, still further preferably greater than or equal to 0.5 nm and less than or equal to 10 nm. At least part of the insulating layer 364 may have a region with the above-described thickness.

An insulating layer 366 is provided over the insulating layer 364 (see FIG. 18B). The top surfaces of the conductive layer 365 and the insulating layer 366 are preferably level with or substantially level with each other (in the Z direction). For example, CMP treatment or the like is preferably performed so that the top surfaces of the conductive layer 365 and the insulating layer 366 are level with or substantially level with each other. The top surfaces of the conductive layer 365 and the insulating layer 366 are level with or substantially level with each other, the coverage with insulating layers and conductive layers to be formed later can be increased.

An insulating layer 367 is provided over the conductive layer 365 and the insulating layer 366. In a region overlapping with the conductive layer 352, a conductive layer 368 is provided so as to be embedded in part of each of the insulating layer 367, the insulating layer 366, the insulating layer 364, the conductive layer 361, the insulating layer 359, the insulating layer 358, the insulating layer 357, and the insulating layer 354. The conductive layer 368 is electrically connected to the conductive layer 361 and the conductive layer 352. Each of the conductive layer 368 and the conductive layer 352 functions as a contact plug.

The conductive layer 361 functions as one of the source electrode and the drain electrode of the transistor 234. The conductive layer 355 functions as the other of the source electrode and the drain electrode of the transistor 234. For example, in the case where the conductive layer 361 functions as the drain electrode of the transistor 234, the conductive layer 355 functions as the source electrode of the transistor 234. The transistor 234 is formed in the region overlapping with the conductive layer 355.

The semiconductor layer 363 functions as a semiconductor layer of the transistor 234 where a channel is formed (a semiconductor layer including a channel formation region); the insulating layer 364 functions as a gate insulating layer; and the conductive layer 365 functions as a gate electrode. In other words, the transistor 234 is provided in a region including the opening 362.

The transistor 233 is formed in a region that does not overlap with the transistor 234 and overlaps with the conductive layer 355. The transistor 233 has a structure similar to that of the transistor 234 and is formed at the same time as the transistor 234. Thus, the description of the transistor 233 can be made by replacing the transistor 234 in the description of the transistor 234 with the transistor 233.

The source electrode and the drain electrode of the transistor 234 are placed in the Z direction. That is, the source and the drain of the transistor 234 are placed at different levels. In other words, the source and the drain of the transistor 234 are placed at different positions in the Z direction. Such a transistor is also referred to as a "vertical-channel transistor", a "vertical transistor", or a "VFET (Vertical Field Effect Transistor)".

The source electrode and the drain electrode of the vertical-channel transistor of one embodiment of the present invention are placed in the Z direction. That is, the channel formation region, the source region, and the drain region are placed in the Z direction. The occupation area can be reduced as compared with that occupied by a conventional transistor in which the channel formation region, the source region, and the drain region are provided separately on the X-Y plane.

Thus, when the vertical-channel transistor is used in a semiconductor device, the area occupied by the semiconductor device can be reduced. When the vertical-channel transistor is used in a semiconductor device, high integration of the semiconductor device can be achieved. It is also possible to increase the storage capacity per unit area of a storage device including the semiconductor device.

In a conventional transistor, the channel length is limited by the light exposure limit of photolithography, and it has been difficult to make a channel length smaller than the channel length determined by the light exposure limit. In the vertical-channel transistor of one embodiment of the present invention, the channel length corresponds to the thickness of the insulating layer 356 or the thickness of the insulating layer 358. Thus, the transistor 234 can have an extremely small channel length less than or equal to the light exposure limit of photolithography (e.g., less than or equal to 60 nm, less than or equal to 50 nm, less than or equal to 40 nm, less than or equal to 30 nm, less than or equal to 20 nm, or less than or equal to 10 nm, and greater than or equal to 1 nm or greater than or equal to 5 nm). Accordingly, the transistor 234 can have a higher on-state current and improved frequency characteristics. The use of the vertical-channel transistor enables a semiconductor device with high operation speed to be provided.

Materials Forming Semiconductor Device

Examples of materials that can be used for the semiconductor device of one embodiment of the present invention are described below.

Substrate

In the case where the semiconductor device is provided over a substrate, there is no particular limitation on a material used for the substrate. The material is determined in accordance with the purpose in consideration of whether it has a light-transmitting property, heat resistance high enough to withstand heat treatment, or the like. For example, an insulator substrate, a semiconductor substrate, or a conductor substrate may be used. As the insulator substrate, for example, a glass substrate of barium borosilicate glass, aluminoborosilicate glass, or the like, a ceramic substrate, a quartz substrate, a sapphire substrate, or a stabilized zirconia substrate (e.g., an yttria-stabilized zirconia substrate) can be used. Alternatively, a semiconductor substrate, a flexible substrate, a resin substrate, or the like may be used.

Examples of the semiconductor substrate include a semiconductor substrate using silicon, germanium, or the like as a material and a compound semiconductor substrate using silicon carbide, silicon germanium, gallium arsenide, indium phosphide, zinc oxide, or gallium oxide as a material. Another example is a semiconductor substrate in which an insulator region is included in the semiconductor substrate described above, e.g., an SOI (Silicon On Insulator) substrate. The semiconductor substrate may be a single crystal semiconductor or a polycrystalline semiconductor.

Examples of the conductor substrate include a graphite substrate, a metal substrate, an alloy substrate, and a conductive resin substrate. Other examples include a substrate containing a metal nitride and a substrate containing a metal oxide. Other examples include an insulator substrate provided with a conductor or a semiconductor, a semiconductor substrate provided with a conductor or an insulator, and a conductor substrate provided with a semiconductor or an insulator.

For the materials of the flexible substrate, the resin substrate, or the like, a polyester such as polyethylene terephthalate (PET) or polyethylene naphthalate (PEN), polyacrylonitrile, an acrylic resin, polyimide, polymethyl methacrylate, polycarbonate (PC), polyethersulfone (PES), polyamide (e.g., nylon or aramid), polysiloxane, a cycloolefin resin, polystyrene, polyamide imide, polyurethane, polyvinyl chloride, polyvinylidene chloride, polypropylene, polytetrafluoroethylene (PTFE), an ABS resin, or cellulose nanofiber can be used, for example.

When the above-described material is used for the substrate, a lightweight semiconductor device including the transistor 234 can be provided. Furthermore, when the above-described material is used for the substrate, a shock-resistant semiconductor device can be provided. Moreover, when the above-described material is used for the substrate, a semiconductor device that is less likely to be broken can be provided.

Alternatively, these substrates provided with elements may be used. Examples of the element provided for the substrate include a capacitor, a resistor, a switching element, a light-emitting element, and a storage element.

Insulating Layer

An insulating oxide, an insulating nitride, an insulating oxynitride, an insulating nitride oxide, an insulating metal oxide, an insulating metal oxynitride, an insulating metal nitride oxide, or the like can be used for the insulating layer. For example, a single layer or a stacked layer of a material selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like is used for the insulating layer. Two or more materials selected from an oxide, a nitride, an oxynitride, and a nitride oxide may be used.

Note that in this specification and the like, a nitride oxide refers to a material that contains more nitrogen than oxygen. An oxynitride refers to a material that contains more oxygen than nitrogen. The content of each element can be measured by Rutherford backscattering spectrometry (RBS), for example.

As miniaturization and high integration of transistors progress, a problem such as leakage current may arise because of a thinner gate insulating layer. When a high-k material (a high dielectric constant material or a material with a high relative dielectric constant) is used for an insulating layer functioning as the gate insulating layer, a gate potential during operation of the transistor can be reduced while the physical thickness is maintained. A substance with a high dielectric constant, such as lead zirconate titanate (PZT), strontium titanate ($SrTiO_3$), or $(Ba,Sr)TiO_3$ (BST), can be used for the insulating layer in some cases. By contrast, when a material with a low relative dielectric constant is used for the insulating layer functioning as an interlayer film, parasitic capacitance generated between wirings can be reduced. Thus, a material is preferably selected depending on the function needed for the insulating layer.

Examples of materials with a high relative dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of materials with a low relative dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

There is no particular limitation on the formation method of an insulating material, and a variety of formation methods such as an evaporation method, an atomic layer deposition (ALD) method, a chemical vapor deposition (CVD) method, a sputtering method, and a spin coating method can be employed.

For example, it is preferable that the insulating layer 353 and the insulating layer 367 be formed using an insulating material through which impurities do not easily pass. For example, a single layer or a stacked layer of an insulating material containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used. Examples of insulating materials through which impurities do not easily pass, include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride.

When the insulating material through which impurities do not easily pass is used for the insulating layer 353, impurity diffusion from under the insulating layer 353 can be inhibited, and the reliability of the transistor 234 can be improved. This means that the reliability of the semiconductor device including the transistor 234 can be improved. When the insulating material through which impurities do not easily pass is used for the insulating layer 367, impurity diffusion from above the insulating layer 367 can be inhibited, and the reliability of the transistor 234 can be improved. That is, the reliability of the semiconductor device including the transistor 234 can be improved.

As the insulating layer, an insulating layer capable of functioning as a planarization layer may be used. Examples of materials capable of functioning as the planarization layer include an acrylic resin, polyimide, an epoxy resin, polyamide, polyimide amide, a siloxane resin, a benzocyclobutene resin, a phenol resin, and precursors of these resins. Besides the above organic materials, a low-k material (a low dielectric constant material or a material with a low relative dielectric constant), a siloxane resin, PSG (phosphosilicate glass), BPSG (borophosphosilicate glass), or the like can also be used. Note that a plurality of insulating layers formed of these materials may be stacked.

Note that the siloxane resin corresponds to a resin including a Si—O—Si bond formed using a siloxane-based material as a starting material. The siloxane resin may include an organic group (e.g., an alkyl group or an aryl group) or a fluoro group as a substituent. In addition, the organic group may include a fluoro group.

As the insulating layer 354 functioning as the dielectric of the capacitor 235, a three-layer insulating layer (also referred to as "ZAZ") including aluminum oxide sandwiched between two zirconium oxide layers may be used.

ZAZ is a material with a high relative dielectric constant, and when ZAZ is used as the dielectric of the capacitor 235, the area occupied by the capacitor 235 can be reduced.

As described above, a material that can have ferroelectricity may be used for the insulating layer 354 so that the capacitor 235 function as a ferroelectric capacitor.

As the material that can have ferroelectricity, for example, hafnium oxide is preferably used. Alternatively, as the material that can have ferroelectricity, a metal oxide such as zirconium oxide or $HfZrO_X$ (hereinafter also referred to as "HfZrOx", X is a real number greater than 0) may be used. Alternatively, as the material that can have ferroelectricity, a material in which an element J1 (the element J1 here is one or more selected from zirconium (Zr), silicon (Si), aluminum (Al), gadolinium (Gd), yttrium (Y), lanthanum (La), strontium (Sr), and the like) is added to hafnium oxide may be used.

Here, the atomic ratio of a hafnium atom to the element J1 can be set as appropriate. For example, the atomic ratio of a hafnium atom to a zirconium atom may be 1:1 or in the neighborhood thereof. Alternatively, as the material that can have ferroelectricity, a material in which an element J2 (the element J2 here is one or more selected from hafnium (Hf), silicon (Si), aluminum (Al), gadolinium (Gd), yttrium (Y), lanthanum (La), strontium (Sr), and the like) is added to zirconium oxide, or the like can be used. The atomic ratio of a zirconium atom to the element J2 can be set as appropriate; the atomic ratio of a zirconium atom to the element J2 is, for example, 1:1 or in the neighborhood thereof. As the material that can have ferroelectricity, a piezoelectric ceramic having a perovskite structure, such as lead titanate ($PbTiO_X$), barium strontium titanate (BST), strontium titanate, lead zirconate titanate (PZT), strontium bismuth tantalate (SBT), bismuth ferrite (BFO), or barium titanate, may be used.

As the material that can have ferroelectricity, scandium aluminum nitride ($Al_{1-a}Sc_aN_b$ (a is a real number greater than 0 and less than 0.5, and b is 1 or an approximate value thereof. Hereinafter simply referred to as AlScN)), Al—Ga—Sc nitride, Ga—Sc nitride, or the like can be used.

Conductive Layer

As a conductive material that can be used for conductive layers such as various wirings and electrodes included in the semiconductor device, a metal element selected from aluminum (Al), chromium (Cr), copper (Cu), silver (Ag), gold (Au), platinum (Pt), tantalum (Ta), nickel (Ni), titanium (Ti), molybdenum (Mo), tungsten (W), hafnium (Hf), vanadium (V), niobium (Nb), manganese (Mn), magnesium (Mg), zirconium (Zr), beryllium (Be), and the like; an alloy containing the above metal element as a component; an alloy containing the above metal elements in combination; or the like can be used.

For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are conductive materials that are less likely to be oxidized or materials that retain their conductivity even after absorbing oxygen. A semiconductor having high electrical conductivity, typified by polycrystalline silicon containing an impurity element such as phosphorus, or silicide such as nickel silicide may be used. There is no particular limitation on the formation method of the conductive material, and a variety of formation methods such as an evaporation method, an ALD method, a CVD method, a sputtering method, and a spin coating method can be employed.

A Cu—X alloy (X is Mn, Ni, Cr, Fe, Co, Mo, Ta, or Ti) may be used as the conductive material. A layer formed using a Cu—X alloy can be processed with a wet etching process, resulting in lower manufacturing cost. Alternatively, an aluminum alloy containing one or more elements selected from titanium, tantalum, tungsten, molybdenum, chromium, neodymium, and scandium may be used as the conductive material.

As the conductive material that can be used for the conductive layer, a conductive material containing oxygen, such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, can be used. A conductive material containing nitrogen, such as titanium nitride, tantalum nitride, or tungsten nitride, can also be used. The conductive layer can have a stacked-layer structure with an appropriate combination of a conductive material containing oxygen, a conductive material containing nitrogen, and a material containing the above-described metal element.

For example, the conductive layer can have a single-layer structure of an aluminum layer including silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, or a three-layer structure of a titanium layer, an aluminum layer stacked over the titanium layer, and a titanium layer further stacked thereover.

Furthermore, a plurality of conductive layers formed with the above conductive materials may be stacked and used. For example, the conductive layer may have a stacked-layer structure in which a material containing the above-described metal element is combined with a conductive material containing oxygen. It is also possible to employ a stacked-layer structure in which a material containing the above-described metal element is combined with a conductive material containing nitrogen. It is also possible to employ a stacked-layer structure in which a material containing the above-described metal element is combined with a conductive material containing oxygen and a conductive material containing nitrogen.

For example, the conductive layer may have a three-layer structure in which a conductive layer containing copper is stacked over a conductive layer containing oxygen and at least one of indium and zinc, and a conductive layer containing oxygen and at least one of indium and zinc is stacked thereover. In that case, a side surface of the conductive layer containing copper is preferably covered with the conductive layer containing oxygen and at least one of indium and zinc. Alternatively, a plurality of conductive layers containing oxygen and at least one of indium and zinc may be stacked and used as the conductive layer, for example.

In the case where the capacitor 235 functions as a ferroelectric capacitor, a material that easily causes polarization in the insulating layer 354 is preferably used for the conductive layer 351 and the conductive layer 355, which are in contact with the insulating layer 354 that is a ferroelectric.

For example, titanium nitride is preferably used for the conductive layer 351 and the conductive layer 355.

Semiconductor Layer

For the semiconductor layer 363, a single crystal semiconductor, a polycrystalline semiconductor, a microcrystalline semiconductor, an amorphous semiconductor, or the like can be used alone or in combination. As a semiconductor material, silicon, germanium, or the like can be used, for example. Alternatively, a compound semiconductor such as silicon germanium, silicon carbide, gallium arsenide, or a nitride semiconductor may be used. As the compound semiconductor, an organic substance having semiconductor characteristics or a metal oxide having semiconductor characteristics (also referred to as an oxide semiconductor) can be used. These semiconductor materials may contain an impurity as a dopant.

For the semiconductor layer 363, single crystal silicon, polycrystalline silicon, microcrystalline silicon, and amorphous silicon may be used, for example. As the polycrystalline silicon, for example, low-temperature polysilicon (LTPS) may be used.

The transistor including amorphous silicon in the semiconductor layer 363 can be formed over a large glass substrate, and can be manufactured at low cost. The transistor including polycrystalline silicon in the semiconductor layer 363 has high field-effect mobility and enables high-speed operation. The transistor including microcrystalline silicon in the semiconductor layer 363 has higher field-effect mobility and enables higher speed operation than the transistor including amorphous silicon.

The semiconductor layer 363 may include a layered material functioning as a semiconductor. The layered material generally refers to a group of materials having a layered crystal structure. In the layered crystal structure, layers formed by covalent bonding or ionic bonding are stacked with bonding such as the van der Waals binding, which is weaker than covalent bonding or ionic bonding. The layered material has high electrical conductivity in a unit layer, that is, high two-dimensional electrical conductivity. When a material that functions as a semiconductor and has high two-dimensional electrical conductivity is used for a channel formation region, a transistor having a high on-state current can be provided.

Examples of the layered material include graphene, silicene, and chalcogenide. Chalcogenide is a compound containing chalcogen (an element belonging to Group 16). Examples of chalcogenide include transition metal chalcogenide and chalcogenide of Group 13 elements. Specific examples of the transition metal chalcogenide which can be used for a semiconductor layer of a transistor include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

An oxide semiconductor has a band gap of 2 eV or more; thus, a transistor using an oxide semiconductor, which is a kind of metal oxide, used for a semiconductor layer where a channel is formed (also referred to as an "OS transistor") has an extremely low off-state current. Thus, the power consumption of a semiconductor device including an OS transistor can be reduced. The OS transistor operates stably even in a high-temperature environment and has small change in characteristics. For example, the off-state current hardly increases even in the high-temperature environment. Specifically, the off-state current hardly increases even at an environmental temperature higher than or equal to room temperature and lower than or equal to 200° C. Furthermore, the on-state current is unlikely to decrease even in a high-temperature environment. Therefore, the semiconductor device including the OS transistor can operate stably and have high reliability even in a high-temperature environment.

Note that in this embodiment and the like, an OS transistor is preferably used as each of the transistor 233 and the transistor 234. Since an OS transistor has a high breakdown voltage between the source and the drain, the channel length can be shortened. Thus, the on-state current can be increased. The OS transistor is suitably used as a vertical-channel transistor.

Examples of the metal oxide that can be used for the semiconductor layer of the OS transistor include indium oxide, gallium oxide, and zinc oxide. The metal oxide preferably contains at least indium (In) or zinc (Zn). The metal oxide preferably contains two or three kinds selected from indium, an element M, and zinc. The element M is a metal element or metalloid element that has a high bonding energy with oxygen, such as a metal element or metalloid element whose bonding energy with oxygen is higher than that of indium, for example.

Specific examples of the element M include aluminum, gallium, tin, yttrium, titanium, vanadium, chromium, manganese, iron, cobalt, nickel, zirconium, molybdenum, hafnium, tantalum, tungsten, lanthanum, cerium, neodymium, magnesium, calcium, strontium, barium, boron, silicon, germanium, and antimony. The element M contained in the metal oxide is preferably one or more kinds of the above elements, further preferably one or more kinds selected from aluminum, gallium, tin, and yttrium, and still further preferably gallium. Note that in this specification and the like, a metal element and a metalloid element may be collectively referred to as a "metal element", and a "metal element" in this specification and the like may refer to a metalloid element.

For example, it is possible to use indium zinc oxide (In—Zn oxide), indium tin oxide (In—Sn oxide), indium titanium oxide (In—Ti oxide), indium gallium oxide (In—Ga oxide), indium gallium aluminum oxide (In—Ga—Al oxide), indium gallium tin oxide (In—Ga—Sn oxide), gallium zinc oxide (Ga—Zn oxide, also referred to as "GZO"), aluminum zinc oxide (Al—Zn oxide, also referred to as AZO), indium aluminum zinc oxide (In—Al—Zn oxide, also referred to as "IAZO"), indium tin zinc oxide (In—Sn—Zn oxide), indium titanium zinc oxide (In—Ti—Zn oxide), indium gallium zinc oxide (In—Ga—Zn oxide, also referred to as "IGZO"), indium gallium tin zinc oxide (In—Ga—Sn—Zn oxide, also referred to as "IGZTO"), or indium gallium aluminum zinc oxide (In—Ga—Al—Zn oxide, also referred to as "IGAZO" or "IAGZO"). Alternatively, indium tin oxide containing silicon, gallium tin oxide (Ga—Sn oxide), aluminum tin oxide (Al—Sn oxide), or the like can be used.

When the proportion of the number of indium atoms in the total number of atoms of all the metal elements contained in the metal oxide is increased, the field-effect mobility of the transistor can be increased.

Note that the metal oxide may contain, instead of indium, one or more kinds of metal elements with large period numbers. Alternatively, the metal oxide may contain, in addition to indium, one or more kinds of metal elements with large period numbers. The larger the overlap between orbits of metal elements is, the more likely it is that the metal oxide will have high carrier conductivity. Thus, a transistor containing a metal element with a large period number can have high field-effect mobility in some cases. Examples of the metal element with a large period number include metal elements belonging to Period 5 and metal elements belonging to Period 6. Specific examples of the metal element include yttrium, zirconium, silver, cadmium, tin, antimony, barium, lead, bismuth, lanthanum, cerium, praseodymium, neodymium, promethium, samarium, and europium. Note that lanthanum, cerium, praseodymium, neodymium, promethium, samarium, and europium are called light rare-earth elements.

The metal oxide may contain one or more kinds of nonmetallic elements. A transistor including the metal oxide containing a nonmetallic element can have high field-effect mobility in some cases. Examples of the nonmetallic element include carbon, nitrogen, phosphorus, sulfur, selenium, fluorine, chlorine, bromine, and hydrogen.

By increasing the proportion of the number of zinc atoms in the total number of atoms of metal elements in the main constituent elements contained in the metal oxide, the metal oxide has high crystallinity, so that diffusion of impurities in the metal oxide can be inhibited. Consequently, a change in electrical characteristics of the transistor can be inhibited, and the reliability of the transistor can be improved.

By increasing the proportion of the number of atoms of the element M in the total number of atoms of metal elements in the main constituent elements contained in the metal oxide, oxygen vacancies can be inhibited from being formed in the metal oxide. Accordingly, generation of carriers due to oxygen vacancies is inhibited, which makes the off-state current of the transistor low. Furthermore, a change in electrical characteristics of the transistor can be inhibited, and the reliability of the transistor can be improved.

Electrical characteristics and reliability of a transistor vary depending on the composition of the metal oxide used for the semiconductor layer. Therefore, by changing the composition of the metal oxide in accordance with the electrical characteristics and reliability required for the transistor, the semiconductor device can have both excellent electrical characteristics and high reliability.

In the case where In—Zn oxide is used for the semiconductor layer of the OS transistor, a metal oxide in which the atomic ratio of indium is higher than or equal to the atomic ratio of zinc may be used. For example, a metal oxide in which the atomic ratio of metal elements is In:Zn=1:1, In:Zn=2:1, In:Zn=3:1, In:Zn=4:1, In:Zn=5:1, In:Zn=7:1, or In:Zn=10:1, or in the neighborhood thereof may be used.

In the case where In—Sn oxide is used for the semiconductor layer of the OS transistor, a metal oxide in which the atomic ratio of indium is higher than or equal to the atomic ratio of tin may be used. For example, a metal oxide in which the atomic ratio of metal elements is In:Sn=1:1, In:Sn=2:1, In:Sn=3:1, In:Sn=4:1, In:Sn=5:1, In:Sn=7:1, or In:Sn=10:1, or in the neighborhood thereof may be used.

In the case where In—Sn—Zn oxide is used for the semiconductor layer of the OS transistor, a metal oxide in which the atomic ratio of indium is higher than the atomic ratio of tin may be used. It is further preferable to use a metal oxide in which the atomic ratio of zinc is higher than the atomic ratio of tin. For example, a metal oxide in which the atomic ratio of metal elements is In:Sn:Zn=2:1:3, In:Sn:Zn=3:1:2, In:Sn:Zn=4:2:3, In:Sn:Zn=4:2:4.1, In:Sn:Zn=5:1:3, In:Sn:Zn=5:1:6, In:Sn:Zn=5:1:7, In:Sn:Zn=5:1:8, In:Sn:Zn=6:1:6, In:Sn:Zn=10:1:3, In:Sn:Zn=10:1:6, In:Sn:Zn=10:1:7, In:Sn:Zn=10:1:8, In:Sn:Zn=5:2:5, In:Sn:Zn=10:1:10, In:Sn:Zn=20:1:10, or In:Sn:Zn=40:1:10, or in the neighborhood thereof may be used.

In the case where In—Al—Zn oxide is used for the semiconductor layer of the OS transistor, a metal oxide in which the atomic ratio of indium is higher than the atomic ratio of aluminum may be used. It is further preferable to use a metal oxide in which the atomic ratio of zinc is higher than the atomic ratio of aluminum. For example, a metal oxide in which the atomic ratio of metal elements is In:Al:Zn=2:1:3, In:Al:Zn=3:1:2, In:Al:Zn=4:2:3, In:Al:Zn=4:2:4.1, In:Al:Zn=5:1:3, In:Al:Zn=5:1:6, In:Al:Zn=5:1:7, In:Al:Zn=5:1:8, In:Al:Zn=6:1:6, In:Al:Zn=10:1:3, In:Al:Zn=10:1:6, In:Al:Zn=10:1:7, In:Al:Zn=10:1:8, In:Al:Zn=5:2:5, In:Al:Zn=10:1:10, In:Al:Zn=20:1:10, or In:Al:Zn=40:1:10, or in the neighborhood thereof may be used.

In the case where In—Ga—Zn oxide is used for the semiconductor layer of the OS transistor, a metal oxide in which the atomic ratio of indium in the number of atoms of the metal elements is higher than the atomic ratio of gallium may be used. It is further preferable to use a metal oxide in which the atomic ratio of zinc is higher than the atomic ratio of gallium. For example, a metal oxide in which the atomic ratio of metal elements is In:Ga:Zn=2:1:3, In:Ga:Zn=3:1:2, In:Ga:Zn=4:2:3, In:Ga:Zn=4:2:4.1, In:Ga:Zn=5:1:3, In:Ga:Zn=5:1:6, In:Ga:Zn=5:1:7, In:Ga:Zn=5:1:8, In:Ga:Zn=6:1:6, In:Ga:Zn=10:1:3, In:Ga:Zn=10:1:6, In:Ga:Zn=10:1:7, In:Ga:Zn=10:1:8, In:Ga:Zn=5:2:5, In:Ga:Zn=10:1:10, In:Ga:Zn=20:1:10, In:Ga:Zn=40:1:10, or in the neighborhood thereof may be used in the semiconductor layer.

In the case where In-M-Zn oxide is used for the semiconductor layer of the OS transistor, a metal oxide in which the atomic ratio of indium in the number of atoms of the metal elements is higher than the atomic ratio of the element M may be used. It is further preferable to use a metal oxide in which the atomic ratio of zinc is higher than the atomic ratio of the element M. For example, a metal oxide in which the atomic ratio of metal elements is In:M:Zn=2:1:3, In:M:Zn=3:1:2, In:M:Zn=4:2:3, In:M:Zn=4:2:4.1, In:M:Zn=5:1:3, In:M:Zn=5:1:6, In:M:Zn=5:1:7, In:M:Zn=5:1:8, In:M:Zn=6:1:6, In:M:Zn=10:1:3, In:M:Zn=10:1:6, In:M:Zn=10:1:7, In:M:Zn=10:1:8, In:M:Zn=5:2:5, In:M:Zn=10:1:10, In:M:Zn=20:1:10, In:M:Zn=40:1:10, or in the neighborhood thereof may be used in the semiconductor layer.

In the case where In-M-Zn oxide is used for the semiconductor layer, a metal oxide in which the atomic ratio of metal elements is In:M:Zn=1:3:2 [atomic ratio] or in the neighborhood thereof, In:M:Zn=1:3:4 [atomic ratio] or in the neighborhood thereof, In:M:Zn=1:1:0.5 [atomic ratio] or in the neighborhood thereof, In:M:Zn=1:1:1 [atomic ratio] or in the neighborhood thereof, In:M:Zn=1:1:1.2 [atomic ratio] or in the neighborhood thereof, In:M:Zn=1:1:2 [atomic ratio] or in the neighborhood thereof, or In:M:Zn=4:2:3 [atomic ratio] or in the neighborhood thereof may be used. Note that a composition in the neighborhood includes the range of ±30% of an intended atomic ratio. Gallium is preferably used as the element M.

In the case where a plurality of metal elements are contained as the element M, the sum of the atomic ratios of the metal elements can be the atomic ratio of the element M. In the case of In—Ga—Al—Zn oxide in which gallium and aluminum are contained as the element M, for example, the sum of the atomic ratio of gallium and the atomic ratio of aluminum can be the atomic ratio of the element M. The atomic ratio of indium, the element M, and zinc is preferably within the ranges given above.

It is preferable to use a metal oxide in which the proportion of the number of indium atoms in the total number of atoms of metal elements in the main constituent elements contained in the metal oxide is higher than or equal to 30 atomic % and lower than or equal to 100 atomic %, preferably higher than or equal to 30 atomic % and lower than or equal to 95 atomic %, further preferably higher than or equal to 35 atomic % and lower than or equal to 95 atomic %, further preferably higher than or equal to 35 atomic % and lower than or equal to 90 atomic %, further preferably higher than or equal to 40 atomic % and lower than or equal to 90 atomic %, further preferably higher than or equal to 45 atomic % and lower than or equal to 90 atomic %, further preferably higher than or equal to 50 atomic % and lower than or equal to 80 atomic %, further preferably higher than or equal to 60 atomic % and lower than or equal to 80 atomic %, further preferably higher than or equal to 70 atomic % and lower than or equal to 80 atomic %. For example, in the case where In-M-Zn oxide is used for the semiconductor layer, the proportion of the number of indium atoms in the sum of the numbers of atoms of indium, the element M, and zinc is preferably within the ranges given above.

As described above, by increasing the proportion of the number of indium atoms in the total number of atoms of metal elements in the main constituent elements contained in the metal oxide, the field-effect mobility of the transistor can be increased. With the use of such a transistor, a circuit capable of high-speed operation can be formed. Furthermore, the area occupied by the circuit can be reduced.

As an analysis method of the composition of a metal oxide, for example, energy dispersive X-ray spectroscopy (EDX), X-ray photoelectron spectrometry (XPS), inductively coupled plasma-mass spectrometry (ICP-MS), or inductively coupled plasma-atomic emission spectrometry (ICP-AES) can be used. Alternatively, such kinds of analysis methods may be performed in combination. Note that as for an element whose content percentage is low, the actual content percentage may be different from the content percentage obtained by analysis because of the influence of the analysis accuracy. In the case where the content percentage of the element M is low, for example, the content percentage of the element M obtained by analysis may be lower than the actual content percentage.

A sputtering method or an ALD method can be suitably used to form the metal oxide. Note that in the case where the metal oxide is formed by a sputtering method, the atomic ratio of a target may be different from the atomic ratio of the metal oxide. In particular, the atomic ratio of zinc in the metal oxide is lower than the atomic ratio of zinc in the target in some cases. Specifically, the atomic ratio of zinc contained in the metal oxide may be approximately higher than or equal to 40% and lower than or equal to 90% of the atomic ratio of zinc contained in the target.

Note that when a film of the metal oxide is formed by a sputtering method, the above atomic ratio is not limited to the atomic ratio of the formed metal oxide and may be the atomic ratio of a sputtering target used for forming the film of the metal oxide.

Here, the reliability of a transistor is described. One of indicators of evaluating the reliability of a transistor is a GBT (Gate Bias Temperature) stress test in which a state of applying an electric field to a gate is maintained. Among GBTs, a test in which a state where a positive potential (positive bias) relative to a source potential and a drain potential is supplied to a gate is maintained at high temperatures is referred to as a PBTS (Positive Bias Temperature Stress) test, and a test in which a state where a negative potential (negative bias) is supplied to a gate is maintained at high temperatures is referred to as an NBTS (Negative Bias Temperature Stress) test. The PBTS test and the NBTS test conducted in a state where light irradiation is performed are respectively referred to as a PBTIS (Positive Bias Temperature Illumination Stress) test and an NBTIS (Negative Bias Temperature Illumination Stress) test.

In an n-channel transistor, a positive potential is supplied to a gate in putting the transistor in an on state; thus, the amount of change in threshold voltage in the PBTS test is one important item to be focused on as an indicator of the reliability of the transistor.

With use of a metal oxide that does not contain gallium or has a low gallium content percentage in the semiconductor layer, the transistor can be highly reliable against positive bias application. In other words, the amount of change in the threshold voltage of the transistor in the PBTS test can be small. Meanwhile, with use of a metal oxide that contains gallium, the gallium content percentage is preferably lower than the indium content percentage. Thus, a highly reliable transistor can be achieved.

One of the factors in change in the threshold voltage in the PBTS test is a defect state at the interface between a semiconductor layer and a gate insulating layer or in the vicinity of the interface. As the density of defect states increases, degradation in the PBTS test becomes significant. Generation of the defect states can be inhibited by reducing the gallium content percentage in a region of the semiconductor layer that is in contact with the gate insulating layer.

The following can be given as an example of the reason why the amount of change in the threshold voltage in the PBTS test can be reduced when a metal oxide that does not contain gallium or has a low gallium content percentage is used for the semiconductor layer. Gallium contained in the metal oxide has a property of attracting oxygen more easily than another metal element (e.g., indium or zinc) does. Thus, at the interface between a metal oxide containing a large amount of gallium and the gate insulating layer, gallium is bonded to excess oxygen in the gate insulating layer, which probably generates trap sites of carriers (here, electrons) easily. This might cause the change in the threshold voltage when a positive potential is supplied to a gate and carriers are trapped at the interface between the semiconductor layer and the gate insulating layer.

More specifically, in the case where In—Ga—Zn oxide is used for the semiconductor layer, a metal oxide in which the atomic ratio of indium is higher than the atomic ratio of gallium can be used for the semiconductor layer. It is further preferable to use a metal oxide in which the atomic ratio of zinc is higher than the atomic ratio of gallium. In other words, a metal oxide in which the atomic ratios of metal elements satisfy In>Ga and Zn>Ga is preferably used for the semiconductor layer.

The semiconductor layer of the OS transistor is preferably formed using a metal oxide having the following compositions: the proportion of the number of gallium atoms in the number of atoms of the contained metal elements is higher than 0 atomic % and lower than or equal to 50 atomic %, preferably higher than or equal to 0.1 atomic % and lower than or equal to 40 atomic %, further preferably higher than or equal to 0.1 atomic % and lower than or equal to 35 atomic %, further preferably higher than or equal to 0.1 atomic % and lower than or equal to 30 atomic %, further preferably higher than or equal to 0.1 atomic % and lower than or equal to 25 atomic %, further preferably higher than or equal to 0.1 atomic % and lower than or equal to 20 atomic %, further preferably higher than or equal to 0.1 atomic % and lower than or equal to 15 atomic %, further preferably higher than or equal to 0.1 atomic % and lower than or equal to 10 atomic %. The reduction in the gallium content percentage in the semiconductor layer enables the transistor to be highly resistant to the PBTS test. Note that oxygen vacancy (Vo) is less likely to be generated in the metal oxide when the metal oxide contains gallium.

A metal oxide not containing gallium may be used for the semiconductor layer of the OS transistor. For example, In—Zn oxide can be used for the semiconductor layer. In this case, when the ratio of the number of indium atoms in the number of atoms of the metal elements contained in the metal oxide is increased, the field-effect mobility of the transistor can be increased. By contrast, when the ratio of the number of zinc atoms in the number of atoms of the metal elements contained in the metal oxide is increased, the metal oxide has high crystallinity; thus, a change in the electrical characteristics of the transistor can be inhibited and the reliability can be increased. Alternatively, a metal oxide that contains neither gallium nor zinc, such as indium oxide, can be used for the semiconductor layer. The use of a metal oxide not containing gallium can make a change in the threshold voltage particularly in the PBTS test extremely small.

For example, an oxide containing indium and zinc can be used for the semiconductor layer. In that case, for example, a metal oxide where the atomic ratio of metal elements is In:Zn=2:3, In:Zn=4:1, or the neighborhood thereof can be used.

Although the case of using gallium is described as a typical example, the same applies to the case where the element M is used instead of gallium. A metal oxide in which the atomic ratio of indium is higher than the atomic ratio of the element M is preferably used for the semiconductor layer. Furthermore, a metal oxide in which the atomic ratio of zinc is higher than the atomic ratio of the element M is preferably used.

The use of a metal oxide having a low content percentage of the element M for the semiconductor layer achieves the transistor that is highly reliable against positive bias application. With use of the transistor as a transistor that is required to have high reliability against positive bias application, a highly reliable semiconductor device can be achieved.

The semiconductor layer may have a stacked-layer structure including two or more metal oxide layers. The two or more metal oxide layers included in the semiconductor layer may have the same composition or substantially the same compositions. Employing a stacked-layer structure of metal oxide layers having the same composition can reduce the manufacturing cost because the metal oxide layers can be formed using the same sputtering target.

The two or more metal oxide layers included in the semiconductor layer may have different compositions. For example, a stacked-layer structure of a first metal oxide layer having a composition of In:M:Zn=1:3:4 [atomic ratio] or in the neighborhood thereof and a second metal oxide layer having a composition of In:M:Zn=1:1:1 [atomic ratio] or in the neighborhood thereof and being provided over the first metal oxide layer can be suitably employed. In particular, gallium or aluminum is preferably used as the element M. A stacked-layer structure of any one selected from indium oxide, indium gallium oxide, and IGZO and any one selected from IAZO, IAGZO, and ITZO (registered trademark) may be employed, for example.

For example, a stacked-layer structure of a first metal oxide layer having a composition of In:M:Zn=1:1:1 [atomic ratio] or in the neighborhood thereof and a second metal oxide layer having a composition of In:Zn=4:1 [atomic ratio] or in the neighborhood thereof and being provided over the first metal oxide layer may be used.

It is preferable to use a metal oxide layer having crystallinity as the semiconductor layer. For example, a metal oxide layer having a CAAC (c-axis aligned crystal) structure, a polycrystalline structure, a nano-crystal (nc) structure, or the like can be used. With use of a metal oxide layer having crystallinity as the semiconductor layer, the density of defect states in the semiconductor layer can be reduced, which achieves the highly reliable display device.

The higher the crystallinity of the metal oxide layer used as the semiconductor layer is, the lower the density of defect states in the semiconductor layer can be. By contrast, the use of a metal oxide layer having low crystallinity achieves a transistor through which a large amount of current can flow.

In the case where a metal oxide layer is formed by a sputtering method, the metal oxide layer with higher crystallinity can be formed as the substrate temperature (the stage temperature) in formation is increased. The metal oxide layer with higher crystallinity can be formed as the proportion of a flow rate of an oxygen gas to the whole gas (also referred to as oxygen flow rate ratio) used in film formation is increased.

The semiconductor layer of the OS transistor may have a stacked-layer structure of two or more metal oxide layers having different crystallinities. For example, in a stacked-layer structure of a first metal oxide layer and a second metal oxide layer provided over the first metal oxide layer, the second metal oxide layer can include a region having higher crystallinity than the first metal oxide layer. Alternatively, the second metal oxide layer can include a region having lower crystallinity than the first metal oxide layer. The two or more metal oxide layers included in the semiconductor layer may have the same composition or substantially the same compositions. Employing a stacked-layer structure of metal oxide layers having the same composition can reduce the manufacturing cost because the metal oxide layers can be formed using the same sputtering target. For example, with use of the same sputtering target and different oxygen flow rate ratios, a stacked-layer structure of two or more metal oxide layers having different crystallinities can be formed. The two or more metal oxide layers included in the semiconductor layer may have different compositions.

In the case where an oxide semiconductor is used for the semiconductor layer 363, a material containing hydrogen is preferably used for the insulating layer 357 and the insulating layer 359. When the insulating layer containing hydrogen is in contact with the oxide semiconductor, the oxide semiconductor in a region in contact with the insulating layer becomes an n-type semiconductor and can function as a source region or a drain region. For example, a material containing silicon, nitrogen, and hydrogen may be used for the insulating layer. Specifically, silicon nitride containing hydrogen, silicon nitride oxide containing hydrogen, or the like may be used.

The thickness of each of the insulating layer 357 and the insulating layer 359 is preferably greater than or equal to 1 nm and less than or equal to 15 nm, further preferably greater than or equal to 2 nm and less than or equal to 10 nm, still further preferably greater than or equal to 3 nm and less than or equal to 7 nm, yet still further preferably greater than or equal to 3 nm and less than or equal to 5 nm. In the case where an oxide semiconductor is used for the semiconductor layer 363, the region of the semiconductor layer 363 that is in contact with the insulating layer 357 containing hydrogen and the region of the semiconductor layer 363 that is in contact with the insulating layer 359 containing hydrogen function as a source region and a drain region. The sizes of the source region and the drain region formed in the semiconductor layer 363 can be controlled by adjusting the thicknesses of the insulating layer 357 and the insulating layer 359.

The thickness of the insulating layer 358 is preferably greater than or equal to 1 nm and less than or equal to 50 nm, further preferably greater than or equal to 2 nm and less than or equal to 30 nm, still further preferably greater than or equal to 3 nm and less than or equal to 2 nm. The size of a channel formation region of the semiconductor layer 363 can be controlled by adjusting the thickness of the insulating layer 358.

The thicknesses of the insulating layer 357, the insulating layer 358, and the insulating layer 359 may be set as appropriate in accordance with the characteristics required for the transistor 234.

The insulating layer 357, the insulating layer 358, and the insulating layer 359 are preferably formed successively without exposure to the atmospheric environment. When the insulating layer 357, the insulating layer 358, and the insulating layer 359 are successively formed without exposure to the atmospheric environment, impurities or moisture in the atmospheric environment can be prevented from being attached to the interface between the insulating layer 357 and the insulating layer 358 and the vicinity thereof and the interface between the insulating layer 358 and the insulating layer 359 and the vicinity thereof.

In the case where an oxide semiconductor is used for the semiconductor layer 363, a conductive material that makes the oxide semiconductor an n-type semiconductor is preferably used for the conductive layer 355 in contact with the semiconductor layer 363 and the conductive layer 361 in contact with the semiconductor layer 363. For example, a conductive material containing nitrogen may be used. For example, a conductive material containing nitrogen and titanium or tantalum may be used. Another conductive material may be provided so as to overlap with the conductive material containing nitrogen.

Meanwhile, for the insulating layer 358, a material which includes oxygen and a reduced amount of hydrogen is preferably used. For example, a material containing silicon and oxygen may be used. Specifically, silicon oxide, silicon oxynitride, or the like may be used. Since hydrogen is an impurity element in an oxide semiconductor, when the semiconductor layer 363, which is an oxide semiconductor, and the insulating layer 358, which includes a reduced amount of hydrogen, are in contact with each other, the semiconductor layer 363 is less likely to become an n-type layer. Furthermore, when the semiconductor layer 363, which is an oxide semiconductor, and the insulating layer 358 containing oxygen are in contact with each other, oxygen vacancies in the semiconductor layer 363 are reduced and the transistor 234 has stable characteristics and improved reliability.

When an oxide semiconductor is used for the semiconductor layer 363, the insulating layer 358 preferably contains excess oxygen. In this specification and the like, excess oxygen refers to oxygen that is released by heating. In the case where a material containing excess oxygen is used for the insulating layer 358, a material through which oxygen is less likely to pass is preferably used for the insulating layer 357 and the insulating layer 359. Examples of the material through which oxygen is less likely to pass include a nitride of silicon and an oxide containing one or both of aluminum and hafnium. When the material through which oxygen is less likely to pass is used for the insulating layer 357 and the insulating layer 359, excess oxygen contained in the insulating layer 358 is less likely to be released to a lower layer or an upper layer. Thus, a sufficient amount of oxygen can be supplied to the oxide semiconductor. For example, it is possible to use a structure in which an insulating layer containing silicon and oxygen (the insulating layer 358) is provided between two insulating layers containing silicon and nitrogen (the insulating layer 357 and the insulating layer 359).

When an oxide semiconductor is used for the semiconductor layer 363 and a material containing hydrogen is used for the insulating layer 357 and the insulating layer 359, the region of the semiconductor layer 363 that is in contact with the insulating layer 357 and the region of the semiconductor layer 363 that is in contact with the insulating layer 359 are supplied with hydrogen and become n-type regions. Thus, the region of the semiconductor layer 363 that is in contact with the conductive layer 361 and the region of the semiconductor layer 363 that is in contact with the insulating layer 359 function as one of a source (a source region) and a drain (a drain region). The region of the semiconductor layer 363 that is in contact with the conductive layer 355 and the region of the semiconductor layer 363 that is in contact with the insulating layer 357 function as the other of the source (the source region) and the drain (the drain region).

Figure 19A:
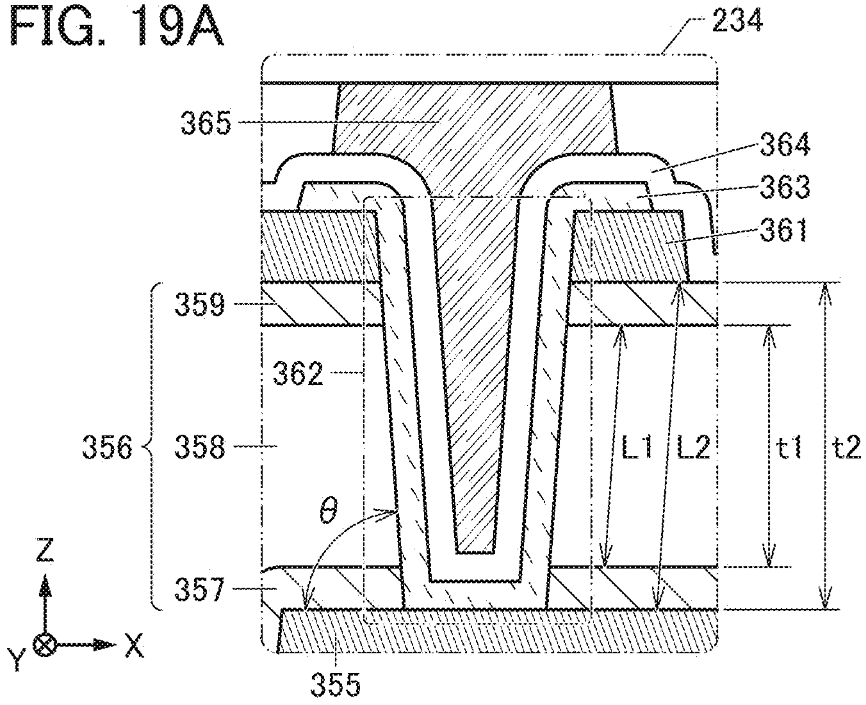
FIG. 19A to FIG. 19E are diagrams illustrating structure examples of the semiconductor device.

FIG. 19A is an enlarged view of a cross section of the transistor 234 illustrated in FIG. 18B. In the transistor 234, which is a VFET having the above structure, the length of the side surface of the insulating layer 358 seen from the X direction or the Y direction is the channel length L (channel length L1) (see FIG. 19A). Hence, the channel length L of the transistor 234 is determined in accordance with the thickness t1 of the insulating layer 358.

A material that includes no hydrogen or an extremely small amount of hydrogen may be used for the insulating layer 357 and the insulating layer 359. For example, silicon nitride that includes an extremely small amount of hydrogen or silicon nitride oxide that includes an extremely small amount of hydrogen may be used. In that case, the region of the semiconductor layer 363 that is in contact with the insulating layer 357 and the region of the semiconductor layer 363 that is in contact with the insulating layer 359 are not become n-type regions. Thus, the region of the semiconductor layer 363 that is in contact with the conductive layer 361 functions as one of the source (the source region) and the drain (the drain region). The region of the semiconductor layer 363 that is in contact with the conductive layer 355 functions as the other of the source (the source region) and the drain (the drain region). The region of the semiconductor layer 363 that is in contact with the insulating layer 358 functions as the channel formation region.

In that case, the channel length L (channel length L2) is the sum of the lengths of side surfaces of the insulating layer 357, the insulating layer 358, and the insulating layer 359 seen from the X direction or the Y direction. Hence, the channel length L of the transistor 234 is determined in accordance with the thickness t2, which is the sum of the thicknesses of the insulating layer 357, the insulating layer 358, and the insulating layer 359.

Figure 21A:
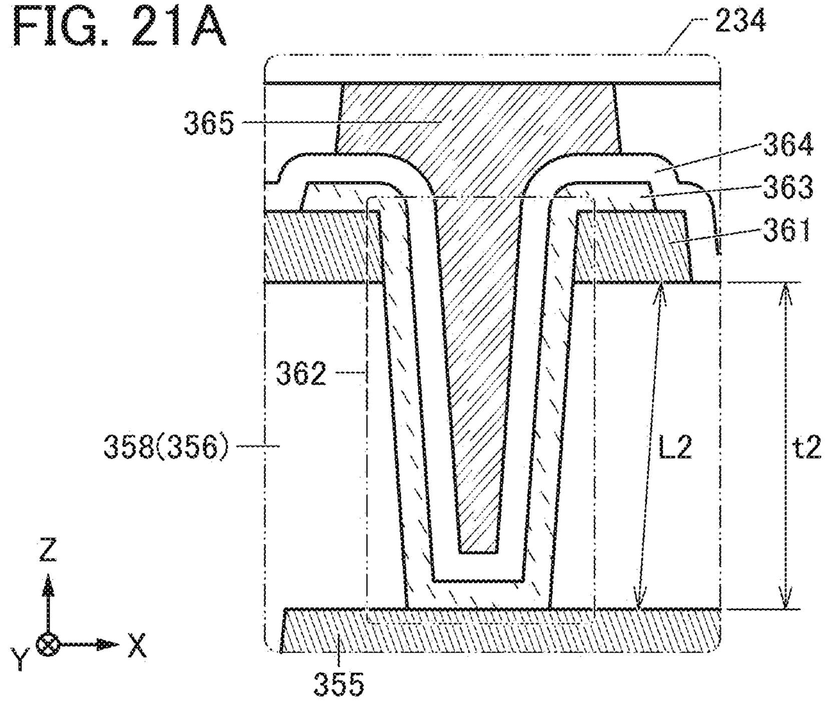
FIG. 21A and FIG. 21B are diagrams illustrating structure examples of the semiconductor device.
Figure 21B:
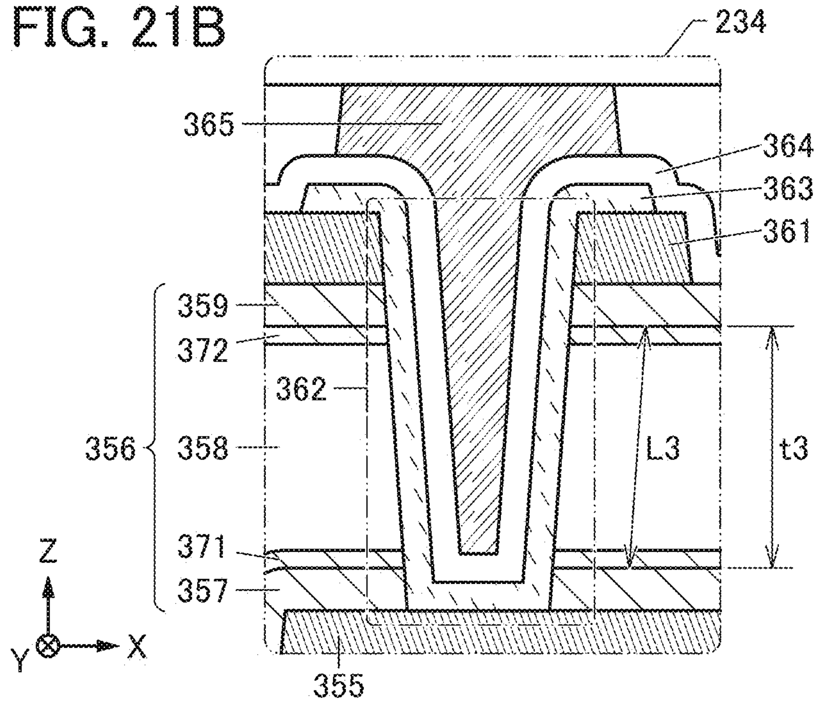

FIG. 21A and FIG. 21B illustrate variation examples of FIG. 19A. For example, it is also possible to use a structure in which the insulating layer 357 and the insulating layer 359 are not provided and only the insulating layer 358 is provided to be in contact with the conductive layer 355 and the conductive layer 361 (see FIG. 21A). In that case, the length of the side surface of the insulating layer 358 seen from the X direction or the Y direction is the channel length L. Hence, the channel length L of the transistor 234 is determined in accordance with the thickness t of the insulating layer 358. In the case of the structure illustrated in FIG. 21A, the insulating layer 358 is referred to as the insulating layer 356 in some cases. Note that the channel length L2 illustrated in FIG. 21A can be rephrased as the channel length L2 illustrated in FIG. 19A, and the thickness t2 illustrated in FIG. 21A can be rephrased as the thickness t2 illustrated in FIG. 19A.

When an oxide semiconductor is used for the semiconductor layer 363, a material containing hydrogen is used for the insulating layer 357 and the insulating layer 359, and a material containing excess oxygen is used for the insulating layer 358, hydrogen contained in the insulating layer 357 and the insulating layer 359 is bonded to excess oxygen contained in the insulating layer 358, whereby the region of the semiconductor layer 363 that is in contact with the insulating layer 357 and the region of the semiconductor layer 363 that is in contact with the insulating layer 359 are not supplied with a sufficient amount of hydrogen and are less likely to become n-type regions. Likewise, the region of the semiconductor layer 363 that is in contact with the insulating layer 358 is not supplied with a sufficient amount of oxygen.

In order solve such a problem, an insulating layer 371 through which oxygen and nitrogen are less likely to pass may be provided between the insulating layer 357 and the insulating layer 358, and an insulating layer 372 through which oxygen and nitrogen are less likely to pass may be provided between the insulating layer 359 and the insulating layer 358 (see FIG. 21B). A material through which oxygen and nitrogen are less likely to pass can be achieved by using, for example, a nitride of silicon. Note that in the case of the structure illustrated in FIG. 21B, the insulating layer 357, the insulating layer 371, the insulating layer 358, the insulating layer 372, and the insulating layer 359 are collectively referred to as the insulating layer 356 in some cases.

When the material through which oxygen is less likely to pass is used for the insulating layer 371 and the insulating layer 372, bonding of hydrogen contained in the insulating layer 357 and the insulating layer 359 to excess oxygen contained in the insulating layer 358 is hindered. Accordingly, a sufficient amount of hydrogen is supplied to the region of the semiconductor layer 363 that is in contact with the insulating layer 357 and the region of the semiconductor layer 363 that is in contact with the insulating layer 359. Likewise, a sufficient amount of oxygen is supplied to the region of the semiconductor layer 363 that is in contact with the insulating layer 358.

In that case, the channel length L3 is the sum of the lengths of side surfaces of the insulating layer 371, the insulating layer 358, and the insulating layer 372 seen from the X direction or the Y direction. Hence, the channel length L3 of the transistor 234 is determined in accordance with the thickness t3, which is the sum of the thicknesses of the insulating layer 371, the insulating layer 358, and the insulating layer 372.

The channel length L of the transistor 234 of one embodiment of the present invention is determined in accordance with the thickness of the insulating layer provided between the conductive layer 361 and the conductive layer 355. As a result, the transistor with a short channel length L can be formed with high accuracy. Furthermore, variations in characteristics among a plurality of transistors 234 are also reduced. Accordingly, the operation of the semiconductor device including the transistor 234 can be stabilized and the reliability thereof can be improved. The reduced variations in characteristics increases the circuit design flexibility, thereby reducing the maximum operation voltage. Thus, the power consumption of the semiconductor device can be reduced.

Although this embodiment illustrates the structure including three insulating layers (the insulating layer 357, the insulating layer 358, and the insulating layer 359) or five insulating layers (the insulating layer 357, the insulating layer 358, the insulating layer 359, the insulating layer 371, and the insulating layer 372) between the conductive layer 355 and the conductive layer 361, the number of insulating layers between the conductive layer 355 and the conductive layer 361 is not limited thereto. The number of insulating layers between the conductive layer 355 and the conductive layer 361 may be one, two, four, six, or more.

Figure 20:
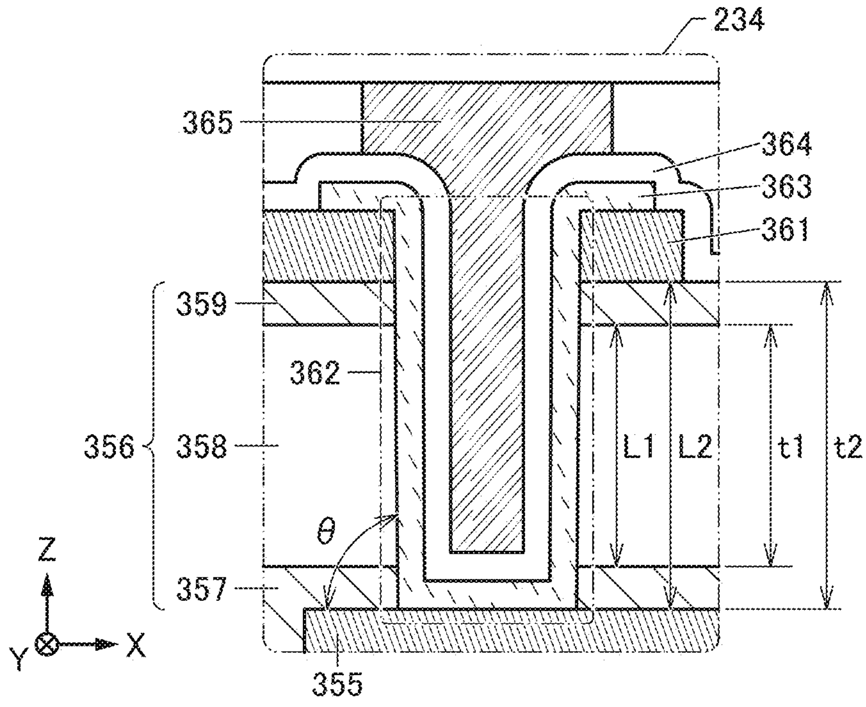
FIG. 20 is a diagram illustrating a structure example of the semiconductor device.

In order to improve the coverage with the semiconductor layer 363, the insulating layer 364, and the conductive layer 365 formed in the opening 362, the taper angle θ of the side surface of the opening 362, i.e., the taper angle θ of the side surface of each of the insulating layer 357, the insulating layer 358, and the insulating layer 359 is greater than or equal to 45° and less than or equal to 90°, preferably greater than or equal to 50° and less than or equal to 75°. Note that the taper angle θ of the side surface of the layer (the insulating layer, the conductive layer, or the semiconductor layer) refers to the angle formed between the bottom surface and the side surface of the layer (see FIG. 19A). FIG. 20 illustrates an example of a cross section in the case where the taper angle θ is 90° and the side surface of the opening 362 is perpendicular to the top surface of the conductive layer 355. When the side surface of the opening 362 is perpendicular or approximately perpendicular to the top surface of the conductive layer 355, the area of the transistor can be reduced and the integration degree of the semiconductor device can be increased. Moreover, the transistor can be easily processed, and variations in characteristics is reduced in some cases between a plurality of transistors provided in the plane.

Figure 19B:
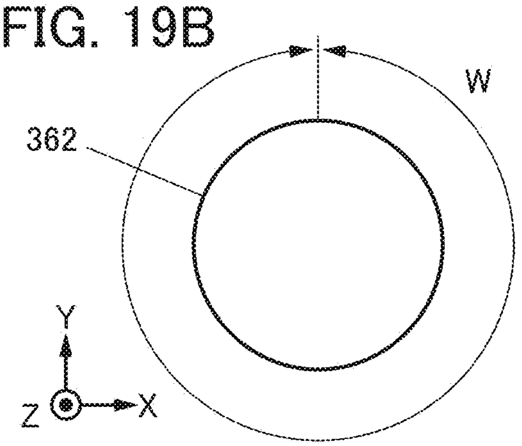

Since the semiconductor layer 363 is provided in the opening 362, the circumference of the opening 362 seen from the Z direction is the channel width W of the transistor 234 (see FIG. 19B). The circumference is determined, for example, at the position of half of the thickness t1 of the insulating layer 358 or at the position of half of the thickness t2 of the insulating layer 358. Note that the circumference of the opening 362 at an arbitrary position may be regarded as the channel width W as necessary. For example, the circumference at the lowest portion of the opening 362 may be regarded as the channel width W, or the circumference at the uppermost portion of the opening 362 may be regarded as the channel width W.

In the storage device of one embodiment of the present invention, the channel length L is preferably shorter than at least the channel width W. In one embodiment of the present invention, the channel length L is greater than or equal to 0.1 times and less than or equal to 0.99 times, preferably greater than or equal to 0.5 times and less than or equal to 0.8 times the channel width W.

Figure 19C:
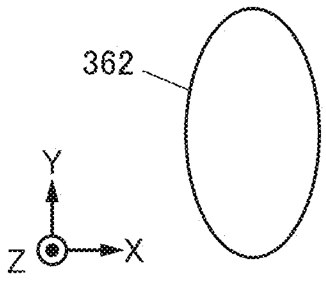
Figure 19D:
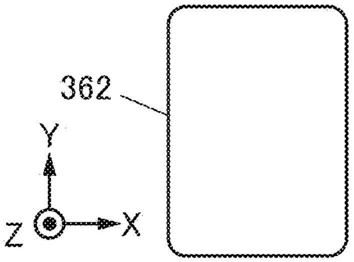
Figure 19E:
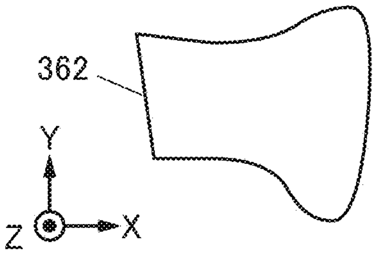

Although the outline (the planar shape) of the opening 362 seen from the Z direction is circular in FIG. 19B, the outline is not limited to this. For example, the outline of the opening 362 seen from the Z direction may be elliptical (see FIG. 19C) or rectangular (see FIG. 19D). Note that FIG. 19D illustrates a rectangular shape having rounded corner portions. For another example, the outline of the opening 362 seen from the Z direction may have a shape including one or both of a straight portion and a curved portion (see FIG. 19E).

Note that the opening 362 preferably has a minute size. For example, the maximum width of the opening 362 (the maximum diameter in the case where the opening 362 is circular) seen from the Z direction is preferably less than or equal to 60 nm, further preferably less than or equal to 50 nm, still further preferably less than or equal to 40 nm, yet still further preferably less than or equal to 30 nm. The maximum width of the opening 362 seen from the Z direction may be less than or equal to 20 nm. Note that the minimum width of the opening 362 (the diameter in the case where the opening 362 is circular) seen from the Z direction is preferably greater than or equal to 1 nm, further preferably greater than or equal to 5 nm. Such a minute opening 362 is preferably formed by a lithography method using an electron beam or short-wavelength light such as EUV (extreme ultraviolet) light.

Stacked-Layer Structure Example 1 of Semiconductor Device

FIG. 22 illustrates a stacked-layer structure example of the register 201, which is a type of semiconductor device. The register 201 illustrated in FIG. 22 includes the layer 20 including the storage circuit 231 above the layer 10. As described in FIG. 8A and the like, the scan flip-flop 220 can be formed in the layer 10. A transistor 400 is illustrated as an example of the transistor included in the scan flip-flop 220 in the layer 10 in FIG. 22. To reduce repeated description, the detailed description of the storage circuit 231 is omitted here.

The transistor 400 is provided on a substrate 311 and includes a conductive layer 316 functioning as a gate, an insulating layer 315 functioning as a gate insulator, a semiconductor region 313 formed of part of the substrate 311, and a low-resistance region 314*a* and a low-resistance region 314*b* functioning as a source region and a drain region. The transistor 400 may be either a p-channel transistor or an n-channel transistor. As the substrate 311, a single crystal silicon substrate can be used, for example.

In the transistor 400 illustrated in FIG. 22, the semiconductor region 313 (part of the substrate 311) where a channel is formed has a projecting shape. In addition, the conductive layer 316 is provided to cover a side surface and the top surface of the semiconductor region 313 with the insulating layer 315 therebetween. Note that a material adjusting the work function may be used for the conductive layer 316. Such a transistor 400 is also referred to as a FIN-type transistor because it utilizes a protruding portion of a semiconductor substrate. Note that an insulator functioning as a mask for forming the protruding portion may be included in contact with an upper portion of the protruding portion. Although the case where the protruding portion is formed by processing part of the semiconductor substrate is described here, a semiconductor film having a protruding shape may be formed by processing an SOI substrate.

Note that the transistor 400 illustrated in FIG. 22 is an example and the structure is not limited thereto; an appropriate transistor can be used in accordance with a circuit structure or a driving method.

Wiring layers provided with an interlayer film, a wiring, a plug, and the like may be provided between components. A plurality of wiring layers can be provided in accordance with design. In this specification and the like, a wiring and a plug electrically connected to the wiring may be a single component. That is, part of a conductor functions as a wiring in some cases and part of a conductor functions as a plug in other cases.

For example, an insulating layer 320, an insulating layer 322, an insulating layer 324, and an insulating layer 326 are provided to be sequentially stacked over the transistor 400 as interlayer films. A conductive layer 328, a conductive layer 330, and the like that are electrically connected to the conductive layer 352 are embedded in the insulating layer 320, the insulating layer 322, the insulating layer 324, and the insulating layer 326. Note that the conductive layer 328 and the conductive layer 330 function as a contact plug or a wiring.

Insulators functioning as interlayer films may also function as planarization films that cover uneven shapes therebelow. For example, the top surface of the insulating layer 322 may be subjected to CMP treatment or the like to have improved planarity.

A wiring layer may be provided over the insulating layer 326 and the conductive layer 330. For example, in FIG. 22, an insulating layer 350, an insulating layer 382, and an insulating layer 384 are provided to be stacked sequentially over the insulating layer 326 and the conductive layer 330. A conductive layer 386 is formed in the insulating layer 350, the insulating layer 382, and the insulating layer 384. The conductive layer 386 functions as a contact plug or a wiring. The conductive layer 386 is electrically connected to the conductive layer 352.

Stacked-Layer Structure Example 2 of Semiconductor Device

A stacked-layer structure example corresponding to the layout illustrated in FIG. 12 described above is described with reference to FIG. 23A and FIG. 23B.

Figure 23A:
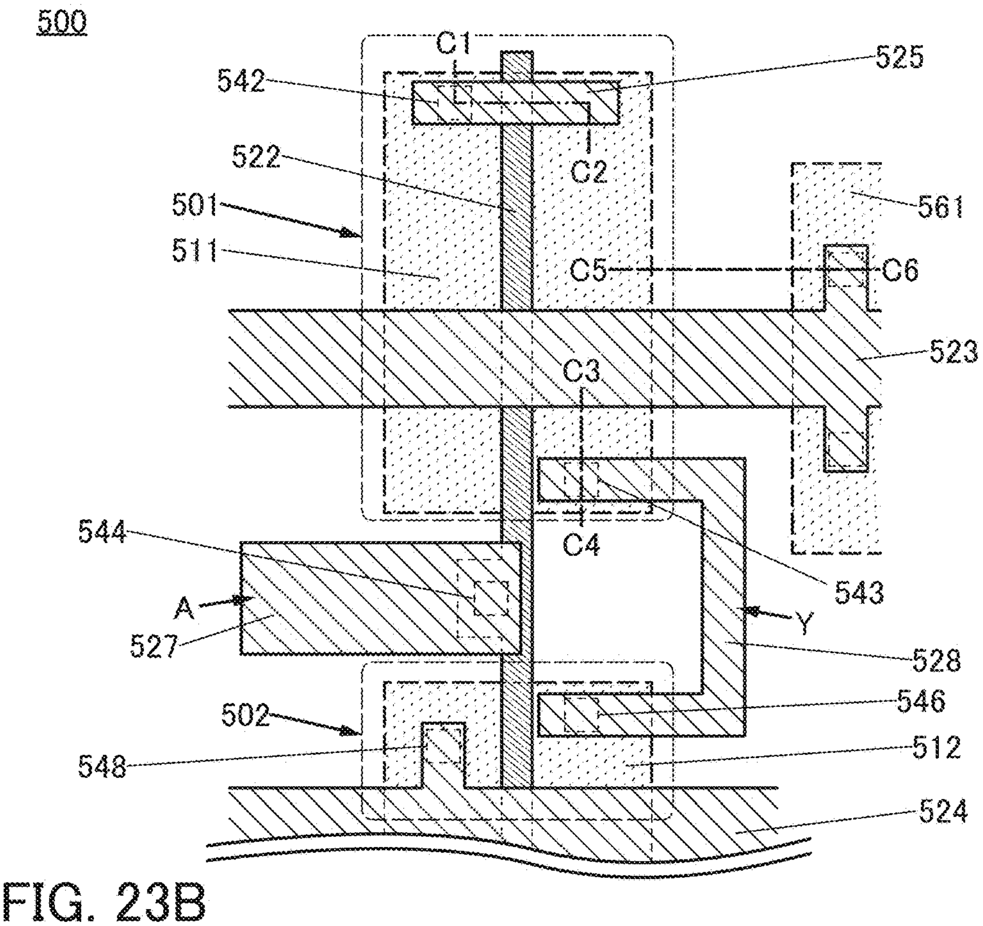
FIG. 23A is a diagram illustrating an example of a circuit layout.
Figure 23B:
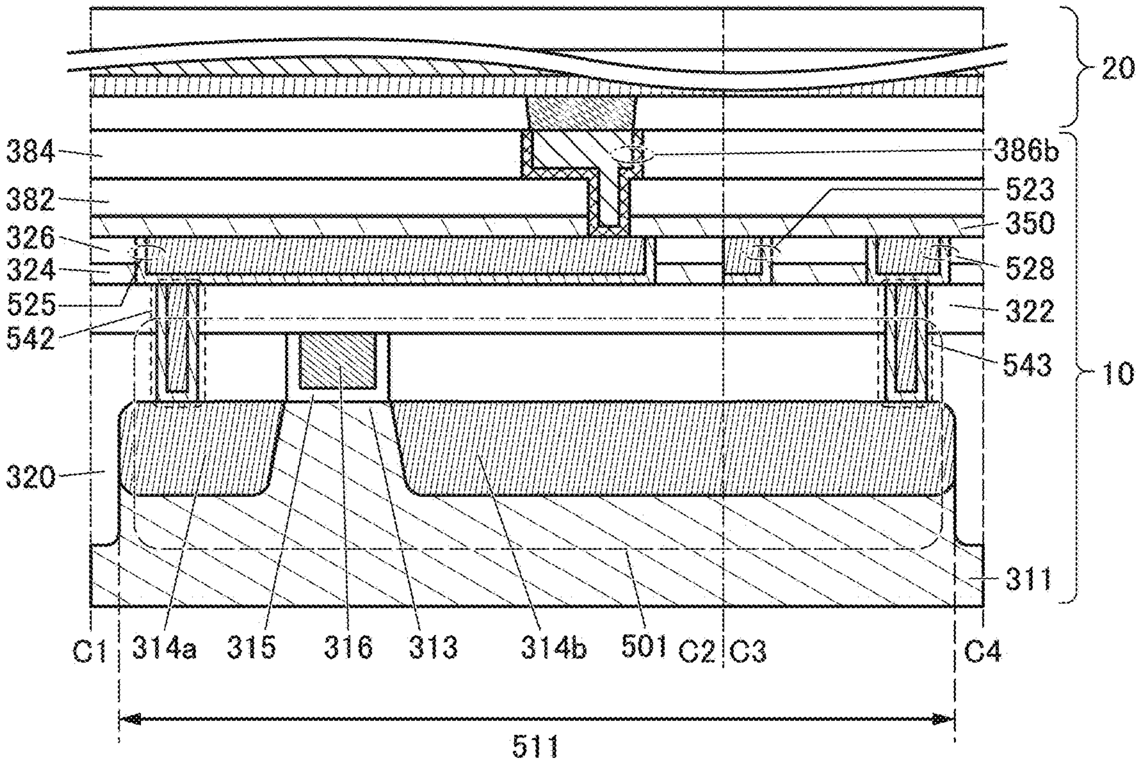
FIG. 23B is a cross-sectional view illustrating a circuit structure example.
Figure 24:
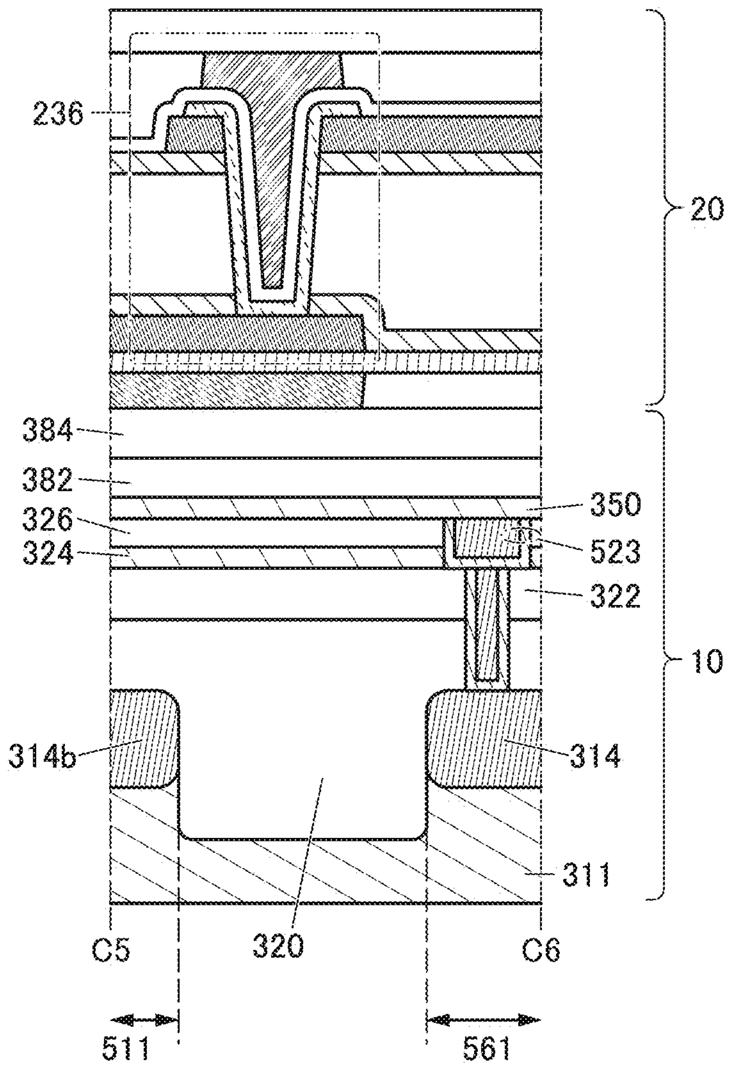
FIG. 24 is a cross-sectional view illustrating a circuit structure example.

FIG. 23A selectively illustrates part of the layout illustrated in FIG. 12 again. In FIG. 23A, a dashed double-dotted line C1-C2, a dashed double-dotted line C3-C4, and a dashed double-dotted line C5-C6 are added to the layout illustrated in FIG. 12. FIG. 23B is a cross-sectional view taken along the dashed double-dotted line C1-C2 in FIG. 23A and a cross-sectional view taken along the dashed dotted line C3-C4 in FIG. 23A. FIG. 24 is a cross-sectional view taken along the dashed double-dotted line C5-C6.

FIG. 23B illustrates an example in which the transistor 501 is provided in the layer 10. Although not illustrated, the transistor 502 illustrated in FIG. 12 can also be provided in the layer 10.

Element regions such as the element region 511 and the element region 512 can be provided in the substrate 311. The element region is, for example, a protruding portion of the semiconductor substrate, and the substrate 311 has a concave and the insulating layer 320 is formed to be embedded in the concave between adjacent element regions. As described in FIG. 12 and FIG. 23A, the transistor 501 is provided in the element region 511, and the transistor 502 is provided in the element region 512, for example.

In FIG. 23B, the transistor 501 is provided in the element region 511. The transistor 400 illustrated in FIG. 22 can be referred to for the transistor 501. The gate wiring 522 can be used for the conductive layer 316 functioning as a gate electrode.

A plug provided in the opening 542 of the insulating layer 322 or the like is provided over the low-resistance region 314*a* of the transistor 501. A plug provided in the opening 543 of the insulating layer 322 or the like is provided over the low-resistance region 314*b*. The conductive layer 328 can be referred to for the plug provided in the opening 542 and the plug provided in the opening 543.

The VDDHS wiring 525, the VDD wiring 523, and the wiring 528 are embedded in the insulating layer 324 and the insulating layer 326. For the VDDHS wiring 525, the VDD wiring 523, and the wiring 528, the conductive layer 330 can be referred to. The VDDHS wiring 525 overlaps with the low-resistance region 314*a* of the transistor 501. The wiring 528 overlaps with the low-resistance region 314*b* of the transistor 501.

As illustrated in FIG. 23B, a conductive layer 386*b* may be formed over the VDDHS wiring 525. The conductive layer 386*b* is provided in the insulating layer 350, the insulating layer 382, and the insulating layer 384. For the conductive layer 386*b*, the conductive layer 386 can be referred to. The conductive layer 386 may be electrically connected to a conductive layer provided in the layer 20. The VDDHS wiring 525 is electrically connected to, for example, a wiring or the like for supplying the power supply potential VDDHS through the conductive layer 386*b* or the like.

Although not illustrated in FIG. 23B and the like, the structure of the transistor 501 can be employed for the transistor 502. For a plug in the opening provided in the insulating layer between the low-resistance region and the conductive layer (e.g., the VSS wiring 524, the wiring 528, or the like) of the transistor 502, the structure of the plug in the opening 542 can be used, for example.

For example, the transistor 502 includes a channel formation region, a first low-resistance region functioning as one of a source and a drain, and a second low-resistance region functioning as the other of the source and the drain. The channel formation region of the transistor 502 is at least part of a region overlapping with the gate wiring 522 in the element region 512, for example. The wiring 528 overlaps with the first low-resistance region. A plug provided in an opening of the insulating layer 322 or the like is provided over the first low-resistance region, and the first low-resistance region and the wiring 528 are electrically connected to each other through the plug. The VSS wiring 524 overlaps with the second low-resistance region. A plug provided in the opening of the insulating layer 322 or the like is placed over the second low-resistance region, and the second low-resistance region and the VSS wiring 524 are electrically connected to each other through the plug.

As illustrated in FIG. 24, the element region 561 is electrically connected to the VDD wiring 523 through the plug provided in the opening of the insulating layer 322 or the like. The element region 561 includes a low-resistance region 314. The low-resistance region 314 can function as a low-resistance region of a Si transistor, for example. Although not illustrated, the element region 562 is electrically connected to the VSS wiring 524 through the plug provided in the opening of the insulating layer 322 or the like, for example.

In FIG. 23B and FIG. 24, an OS transistor can be provided in the layer 20. The OS transistor in the layer 20 can also be provided to overlap with the Si transistor in the layer 10.

FIG. 24 illustrates an example in which a transistor 236, which is an OS transistor, is provided in the layer 20. For a structure and the like of the transistor 236, the transistor 233, the transistor 234, and the like illustrated in FIG. 18B can be referred to, for example. The transistor 236 may be used as the transistor included in the register 201.

The structure described in this embodiment can be used in an appropriate combination with the structures described in the other embodiments.

Embodiment 5

In this embodiment, application examples of the semiconductor device of one embodiment of the present invention will be described.

The semiconductor device of one embodiment of the present invention can be used for a variety of electronic components in addition to a CPU. For example, the semiconductor device can be applied to a register of a microprocessor such as a DSP (Digital Signal Processor) or a GPU (Graphics Processing Unit). Note that the microprocessor may be constructed with a PLD (Programmable Logic Device) such as an FPGA (Field Programmable Gate Array) or an FPAA (Field Programmable Analog Array).

Thus, the semiconductor device of one embodiment of the present invention can be applied to, for example, a variety of electronic devices (e.g., information terminals, computers, smartphones, e-book readers, digital still cameras, video cameras, video recording/reproducing devices, navigation systems, game machines, and the like). In addition, the semiconductor device can also be used for image sensors, IoT (Internet of Things), healthcare-related devices, and the like. Note that here, the computers refer not only to tablet computers, laptop computers, and desktop computers, but also to large computers such as server systems.

An example of an electronic device including the semiconductor device of one embodiment of the present invention is described. Note that FIG. 25A to FIG. 25J each illustrate a state where an electronic component 700 including the semiconductor device, is included in an electronic device.

Cellular Phone

Figure 25A:
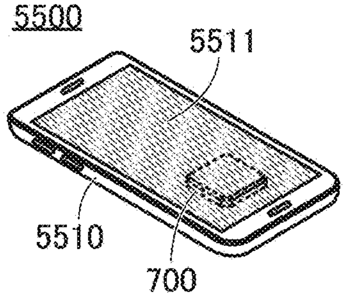
FIG. 25A to FIG. 25J are diagrams illustrating examples of electronic devices.

An information terminal 5500 illustrated in FIG. 25A is a cellular phone (smartphone), which is a type of information terminal. The information terminal 5500 includes a housing 5510 and a display portion 5511, and as input interfaces, a touch panel is provided in the display portion 5511 and a button is provided in the housing 5510.

The information terminal 5500 including the semiconductor device of one embodiment of the present invention can respond quickly to interrupt processing or the like that occurs at the time of executing an application.

Wearable Terminal

Figure 25B:
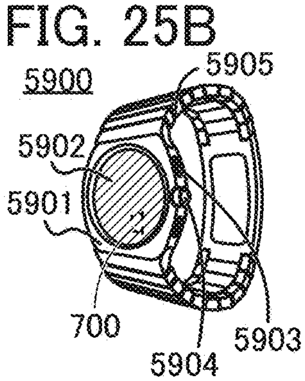

FIG. 25B illustrates an information terminal 5900 that is an example of a wearable terminal. The information terminal 5900 includes a housing 5901, a display portion 5902, an operation switch 5903, an operation switch 5904, a band 5905, and the like.

Like the information terminal 5500 described above, the wearable terminal can respond quickly to interrupt processing or the like that occurs at the time of executing an application by applying the semiconductor device of one embodiment of the present invention to the wearable terminal.

Information Terminal

Figure 25C:
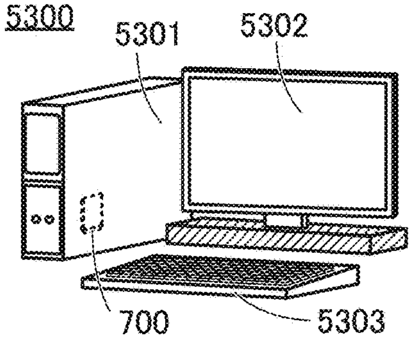

FIG. 25C illustrates a desktop information terminal 5300. The desktop information terminal 5300 includes a main body 5301 of the information terminal, a display portion 5302, and a keyboard 5303.

Like the information terminal 5500 or the like described above, the desktop information terminal 5300 can respond quickly to interrupt processing or the like that occurs at the time of executing an application by applying the semiconductor device of one embodiment of the present invention to the desktop information terminal 5300.

Note that although the smartphone, the wearable terminal, and the desktop information terminal are respectively illustrated in FIG. 25A to FIG. 25C as examples of the electronic device, one embodiment of the present invention can be applied to an information terminal other than a smartphone, a wearable terminal, and a desktop information terminal. Examples of information terminals other than a smartphone, a wearable terminal, and a desktop information terminal include a PDA (Personal Digital Assistant), a laptop information terminal, and a workstation.

Household Appliance

Figure 25D:
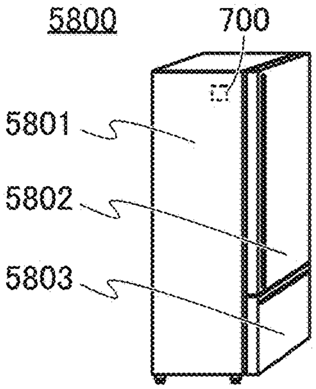

FIG. 25D illustrates an electric refrigerator-freezer 5800 as an example of a household appliance. The electric refrigerator-freezer 5800 includes a housing 5801, a refrigerator door 5802, a freezer door 5803, and the like. For example, the electric refrigerator-freezer 5800 is an electric refrigerator-freezer that is compatible with IoT (Internet of Things).

The semiconductor device of one embodiment of the present invention can be applied to the electric refrigerator-freezer 5800. The electric refrigerator-freezer 5800 can transmit and receive information on food stored in the electric refrigerator-freezer 5800 and food expiration dates, for example, to and from an information terminal or the like via the Internet or the like.

Like the information terminal 5500 or the like described above, the electric refrigerator-freezer 5800 can respond quickly to interrupt processing or the like that occurs at the time of executing an application by applying the semiconductor device of one embodiment of the present invention to the electric refrigerator-freezer 5800.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audiovisual appliance.

Game Machine

Figure 25E:
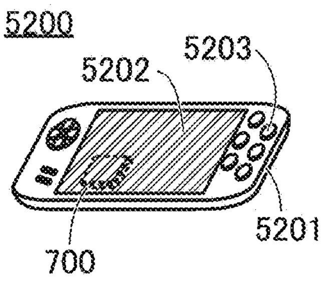

FIG. 25E illustrates a portable game machine 5200 as an example of a game machine. The portable game machine 5200 includes a housing 5201, a display portion 5202, a button 5203, and the like.

Figure 25F:
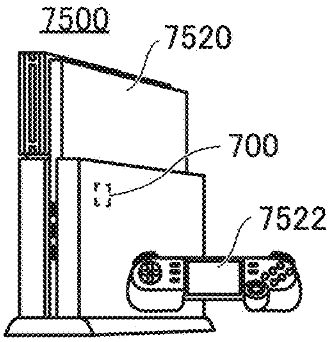

FIG. 25F illustrates a stationary game machine 7500 as another example of a game machine. The stationary game machine 7500 includes a main body 7520 and a controller 7522. Note that the controller 7522 can be connected to the main body 7520 with or without a wire. Although not illustrated in FIG. 25F, the controller 7522 can include a display portion that displays a game image, and an input interface besides a button, such as a touch panel, a stick, a rotating knob, and a sliding knob, for example. Moreover, the shape of the controller 7522 is not limited to that illustrated in FIG. 25F, and the shape of the controller 7522 may be changed in various ways in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary game machine may include a camera, a depth sensor, a microphone, and the like so that the game player can play a game using a gesture or a voice instead of a controller.

In addition, videos displayed on the game machine can be output with a display device such as a television device, a personal computer display, a game display, or a head-mounted display.

The semiconductor device described in the above embodiment is employed for the portable game machine 5200 or the stationary game machine 7500, so that the portable game machine 5200 with low power consumption or the stationary game machine 7500 with low power consumption can be achieved. Moreover, heat generation from a circuit can be reduced owing to low power consumption; thus, the influence of heat generation on the circuit itself, a peripheral circuit, and a module can be reduced.

Moreover, the semiconductor device described in the above embodiment is employed for the portable game machine 5200 or the stationary game machine 7500, so that it is possible to respond quickly to interrupt processing or the like that occurs during game play.

As an example of a game machine, FIG. 25E illustrates a portable game machine. In addition, FIG. 25F illustrates a home-use stationary game machine. Note that an electronic device of one embodiment of the present invention is not limited thereto. Examples of the electronic device of one embodiment of the present invention include an arcade game machine installed in entertainment facilities (a game center, an amusement park, and the like), a throwing machine for batting practice installed in sports facilities, and the like.

Moving Vehicle

The semiconductor device described in the above embodiment can be used for a motor vehicle, which is a moving vehicle, and around the driver's seat in a motor vehicle.

Figure 25G:
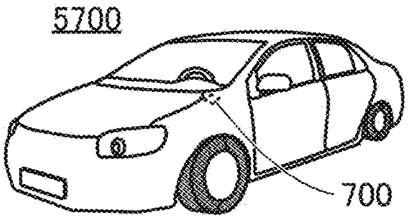

FIG. 25G illustrates a motor vehicle 5700 as an example of a moving vehicle.

An instrument panel that provides various kinds of information by displaying a speedometer, a tachometer, a mileage, a fuel meter, a gearshift state, air-conditioning settings, and the like is provided around the driver's seat in the motor vehicle 5700. In addition, a display device showing the above information may be provided around the driver's seat.

In particular, the display device can compensate for the view obstructed by a pillar or the like, blind areas for the driver's seat, and the like by displaying a video from an image capturing device (not illustrated) provided for the motor vehicle 5700, which can increase safety. That is, display of an image from an image capturing device provided on the outside of the motor vehicle 5700 can fill in blind areas and increase safety.

The semiconductor device of one embodiment of one embodiment of the present invention is employed for a moving vehicle, so that it is possible to respond quickly to interrupt processing or the like that occurs at the time of running a moving vehicle such as emergency stop treatment.

Note that although a motor vehicle is described above as an example of a moving vehicle, the moving vehicle is not limited to a motor vehicle. Examples of moving vehicles include a train, a monorail train, a ship, and a flying object (a helicopter, an unmanned aircraft (a drone), an airplane, and a rocket).

Camera

The semiconductor device described in the above embodiment can be employed for a camera.

Figure 25H:
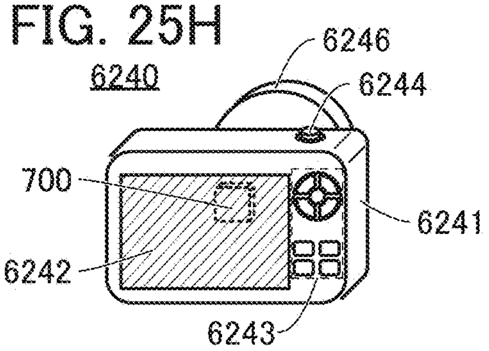

FIG. 25H illustrates a digital camera 6240 as an example of an image capturing device. The digital camera 6240 includes a housing 6241, a display portion 6242, operation switches 6243, a shutter button 6244, and the like, and a detachable lens 6246 is attached to the digital camera 6240. Note that here, although the digital camera 6240 is configured such that the lens 6246 is detachable from the housing 6241 for replacement, the lens 6246 may be integrated with the housing 6241. In addition, the digital camera 6240 can be additionally equipped with a stroboscope, a viewfinder, or the like.

When the semiconductor device described in the above embodiment is employed for the digital camera 6240, the digital camera 6240 with low power consumption can be achieved. Moreover, heat generation from a circuit can be reduced owing to low power consumption; thus, the influence of heat generation on the circuit itself, a peripheral circuit, and a module can be reduced.

Video Camera

The semiconductor device described in the above embodiment can be employed for a video camera.

Figure 25I:
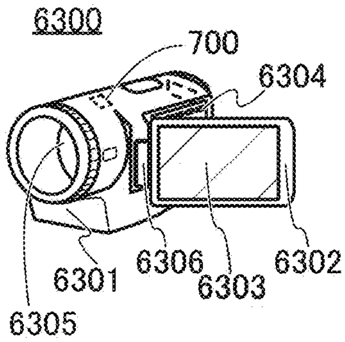

FIG. 25I illustrates a video camera 6300 as an example of an image capturing device. The video camera 6300 includes a first housing 6301, a second housing 6302, a display portion 6303, operation switches 6304, a lens 6305, a joint 6306, and the like. The operation switches 6304 and the lens 6305 are provided in the first housing 6301, and the display portion 6303 is provided in the second housing 6302. The first housing 6301 and the second housing 6302 are connected to each other with the joint 6306, and an angle between the first housing 6301 and the second housing 6302 can be changed with the joint 6306. Images displayed on the display portion 6303 may be changed in accordance with the angle at the joint 6306 between the first housing 6301 and the second housing 6302.

The semiconductor device described in the above embodiment is employed for the video camera 6300, whereby the video camera 6300 can have low power consumption. Furthermore, the imaging time can be extended owing to low power consumption. Moreover, heat generation from a circuit can be reduced owing to low power consumption; thus, the influence of heat generation on the circuit itself, a peripheral circuit, and a module can be reduced.

ICD

The semiconductor device described in the above embodiment can be employed for an implantable cardioverter-defibrillator (ICD).

Figure 25J:
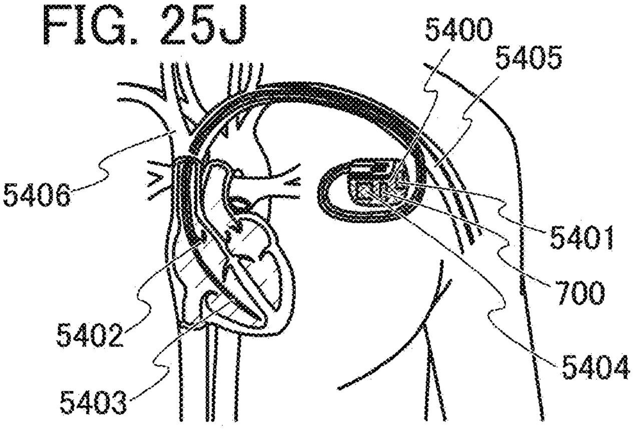

FIG. 25J is a schematic cross-sectional view showing an example of an ICD. An ICD main unit 5400 includes at least a battery 5401, the electronic component 700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with an end of one of the wires placed in the right ventricle and an end of the other wire placed in the right atrium.

The ICD main unit 5400 functions as a pacemaker and paces the heart when the heart rate is not within a predetermined range. In addition, when the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In addition, in the ICD main unit 5400, data on the heart rate obtained by the sensor or the like, the number of times the treatment with pacing is performed, and the time taken for the treatment, for example, can be stored in the electronic component 700.

The antenna 5404 can receive electric power, and the battery 5401 is charged with the electric power. Furthermore, when the ICD main unit 5400 includes a plurality of batteries, safety can be increased. Specifically, even when some of the batteries in the ICD main unit 5400 are dead, the other batteries can work properly; thus, the batteries also function as an auxiliary power source.

In addition to the antenna 5404 capable of receiving electric power, an antenna that can transmit physiological signals may be included to construct, for example, a system that monitors cardiac activity by checking physiological signals such as a pulse, a respiratory rate, a heart rate, and body temperature with an external monitoring device.

The semiconductor device described in the above embodiment is employed for the ICD main unit 5400, whereby the ICD main unit 5400 can have low power consumption. Furthermore, the size and weight of a storage battery can be reduced owing to low power consumption. Moreover, heat generation of the ICD main unit 5400 can be reduced owing to low power consumption; thus, a load on the human body can be reduced.

Computer

Figure 26A:
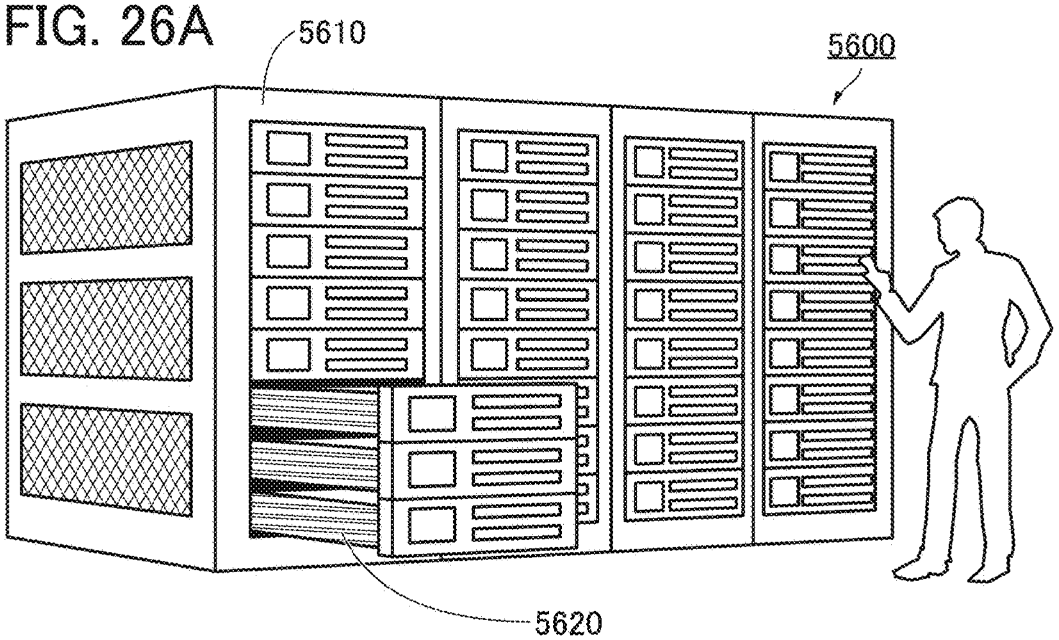
FIG. 26A to FIG. 26C are diagrams illustrating examples of electronic devices.

A computer 5600 illustrated in FIG. 26A is an example of a large computer (a supercomputer) mainly used for scientific computation. In scientific computation, an enormous amount of arithmetic operation needs to be processed at high speed; hence, power consumption is high and chips generate a large amount of heat. For example, a data center including a plurality of supercomputers uses an enormous amount of digital data. Specifically, the amount of digital data in the world is expected to exceed $10^{24}$ (yota) bytes or $10^{30}$ (quetta) bytes.

When the semiconductor device of one embodiment of the present invention is employed for the computer 5600, a supercomputer with low power consumption can be achieved. Moreover, heat generation from a circuit can be reduced owing to low power consumption; thus, the influence of heat generation on the circuit itself, a peripheral circuit, and a module can be reduced. When the semiconductor device of one embodiment of the present invention is employed, a supercomputer with low power consumption can be achieved. This can be expected to reduce the amount of digital data in the world to make a significant contribution to the fight against global warming.

Figure 26B:
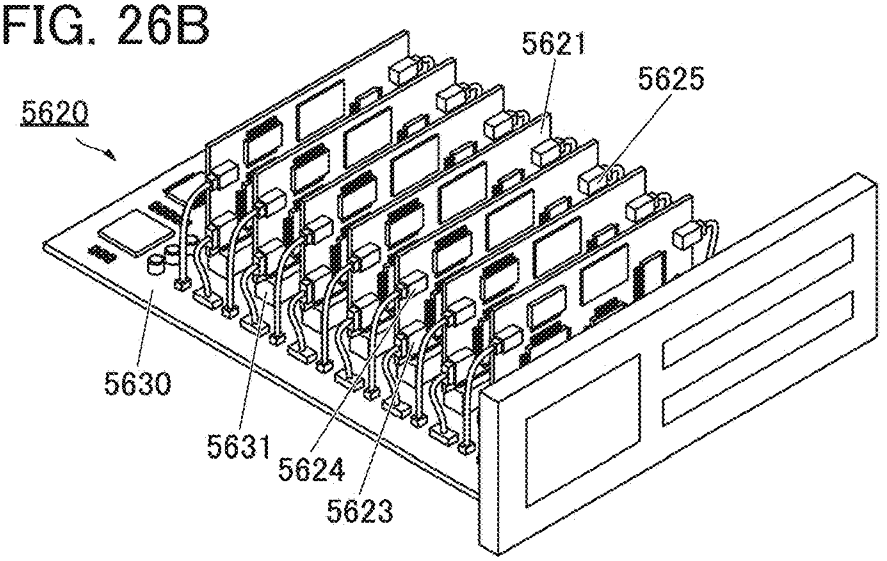

In the computer 5600, a plurality of rack mount computers 5620 are stored in a rack 5610. The computer 5620 can have a structure in a perspective view illustrated in FIG. 26B, for example. In FIG. 26B, the computer 5620 includes a motherboard 5630, and the motherboard 5630 includes a plurality of slots 5631 and a plurality of connection terminals. A PC card 5621 is inserted in the slot 5631. In addition, the PC card 5621 includes a connection terminal 5623, a connection terminal 5624, and a connection terminal 5625, each of which is connected to the motherboard 5630.

Figure 26C:
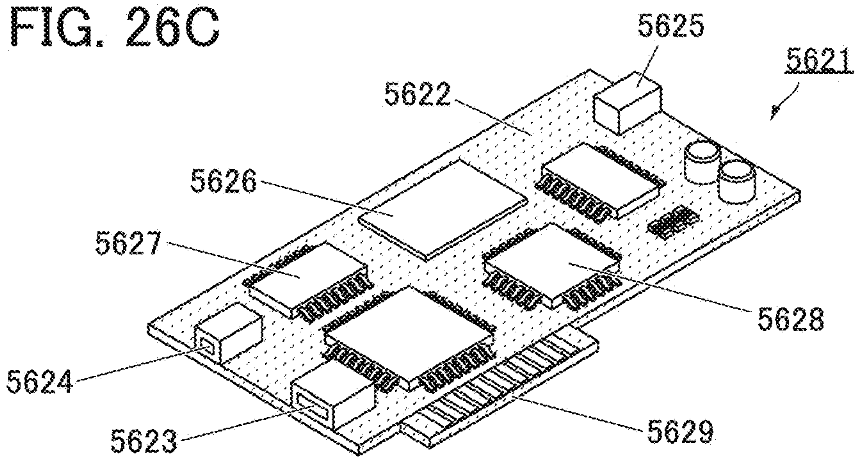

The PC card 5621 illustrated in FIG. 26C is an example of a processing board provided with a CPU, a GPU, a storage device, and the like. The PC card 5621 includes a board 5622. In addition, the board 5622 includes a connection terminal 5623, a connection terminal 5624, a connection terminal 5625, a semiconductor device 5626, a semiconductor device 5627, a semiconductor device 5628, and a connection terminal 5629. Note that FIG. 26C also illustrates semiconductor devices other than the semiconductor device 5626, the semiconductor device 5627, and the semiconductor device 5628, the following description of the semiconductor device 5626, the semiconductor device 5627, and the semiconductor device 5628 is referred to for these semiconductor devices.

The connection terminal 5629 has a shape with which the connection terminal 5629 can be inserted in the slot 5631 of the motherboard 5630, and the connection terminal 5629 functions as an interface for connecting the PC card 5621 and the motherboard 5630. An example of the standard for the connection terminal 5629 is PCIe.

The connection terminal 5623, the connection terminal 5624, and the connection terminal 5625 can serve as, for example, an interface for performing power supply, signal input, or the like to the PC card 5621. As another example, they can serve as an interface for outputting a signal calculated by the PC card 5621. Examples of the standard for each of the connection terminal 5623, the connection terminal 5624, and the connection terminal 5625 include USB (Universal Serial Bus), SATA (Serial ATA), and SCSI (Small Computer System Interface). In the case where video signals are output from the connection terminal 5623, the connection terminal 5624, and the connection terminal 5625, an example of the standard therefor is HDMI (registered trademark).

The semiconductor device 5626 includes a terminal (not illustrated) for inputting and outputting signals, and when the terminal is inserted in a socket (not illustrated) of the board 5622, the semiconductor device 5626 and the board 5622 can be electrically connected to each other.

The semiconductor device 5627 includes a plurality of terminals, and when the terminals are reflow-soldered, for example, to wirings of the board 5622, the semiconductor device 5627 and the board 5622 can be electrically connected to each other. Examples of the semiconductor device 5627 include an FPGA (Field Programmable Gate Array), a GPU, and a CPU. As the semiconductor device 5627, the electronic component 700 can be used, for example.

The semiconductor device 5628 includes a plurality of terminals, and when the terminals are reflow-soldered, for example, to wirings of the board 5622, the semiconductor device 5628 and the board 5622 can be electrically connected to each other. An example of the semiconductor device 5628 is a storage device.

The computer 5600 can also function as a parallel computer. When the computer 5600 is used as a parallel computer, large-scale computation necessary for artificial intelligence learning and inference can be performed, for example.

When the semiconductor device of one embodiment of the present invention is used in a variety of electronic devices and the like described above, it is possible to respond quickly to interrupt processing or the like that occurs at the time of executing an application. With the use of the semiconductor device of one embodiment of the present invention, a reduction in power consumption of the electronic device can be achieved. Heat generation from a circuit can be reduced owing to low power consumption; thus, the adverse influence on the circuit itself, a peripheral circuit, and a module can be reduced. Furthermore, the use of the semiconductor device of one embodiment of the present invention can achieve an electronic device that operates stably even in a high temperature environment. Thus, the reliability of the electronic device can be increased.

The structure described in this embodiment can be used in an appropriate combination with the structures described in the other embodiments.

Embodiment 6

The semiconductor device of one embodiment of the present invention includes an OS transistor. A change in electrical characteristics of the OS transistor due to radiation irradiation is small. That is, the OS transistor is highly resistant to radiation, and thus can be suitably used in an environment where radiation can enter. For example, the OS transistor can be suitably used in outer space. In this embodiment, a specific example of using the semiconductor device of one embodiment of the present invention in a device for space will be described with reference to FIG. 27.

Figure 27:
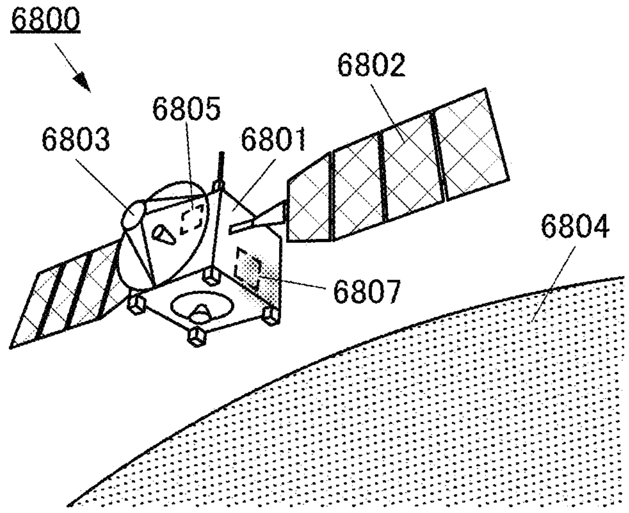
FIG. 27 is a diagram illustrating an example of a device for space.

FIG. 27 illustrates an artificial satellite 6800 as an example of a device for space. The artificial satellite 6800 includes a body 6801, a solar panel 6802, an antenna 6803, a secondary battery 6805, and a control device 6807. In FIG. 27, a planet 6804 in outer space is illustrated as an example. Note that outer space refers to, for example, space at an altitude greater than or equal to 100 km, and outer space described in this specification may include thermosphere, mesosphere, and stratosphere.

The amount of radiation in outer space is 100 or more times that on the ground. Examples of radiation include electromagnetic waves (electromagnetic radiation) typified by X-rays and gamma rays and particle radiation typified by alpha rays, beta rays, neutron beam, proton beam, heavy-ion beams, and meson beams.

When the solar panel 6802 is irradiated with sunlight, electric power required for operation of the artificial satellite 6800 is generated. However, for example, in the situation where the solar panel is not irradiated with sunlight or the situation where the amount of sunlight with which the solar panel is irradiated is small, the amount of generated electric power is small. Accordingly, a sufficient amount of electric power required for operation of the artificial satellite 6800 might not be generated. In order to operate the artificial satellite 6800 even with a small amount of generated electric power, the artificial satellite 6800 is preferably provided with the secondary battery 6805. Note that a solar panel is referred to as a solar cell module in some cases.

The artificial satellite 6800 can generate a signal. The signal is transmitted through the antenna 6803, and the signal can be received by a ground-based receiver or another artificial satellite, for example. When the signal transmitted by the artificial satellite 6800 is received, the position of a receiver that receives the signal can be measured. Thus, the artificial satellite 6800 can construct a satellite positioning system.

The control device 6807 has a function of controlling the artificial satellite 6800. The control device 6807 is formed with one or more selected from a CPU, a GPU, and a storage device, for example. Note that the semiconductor device that is one embodiment of the present invention and includes an OS transistor is suitably used for the control device 6807. A change in electrical characteristics due to radiation irradiation is smaller in an OS transistor than in a Si transistor. That is, the OS transistor has high reliability and thus can be suitably used even in an environment where radiation can enter.

The artificial satellite 6800 can be configured to include a sensor. For example, when configured to include a visible light sensor, the artificial satellite 6800 can have a function of sensing sunlight reflected by a ground-based object. Alternatively, when configured to include a thermal infrared sensor, the artificial satellite 6800 can have a function of sensing thermal infrared rays emitted from the surface of the earth. Thus, the artificial satellite 6800 can have a function of an earth observing satellite, for example.

Although the artificial satellite is described as an example of a device for space in this embodiment, one embodiment of the present invention is not limited thereto. The semiconductor device of one embodiment of the present invention can be suitably used for a device for space such as a spacecraft, a space capsule, or a space probe, for example.

The structure described in this embodiment can be used in an appropriate combination with the structures described in the other embodiments.

REFERENCE NUMERALS

10: layer, 20: layer, 100: semiconductor device, 110: CPU core, 111: arithmetic portion, 130: PMU, 130_1: PMU block, 130_2: PMU block, 130_3: PMU block, 130_4: PMU block, 140: input/output IF, 150: cache memory, 160: state control portion, 200: register group, 201: register, 220: scan flip-flop, 221: selector, 222: flip-flop, 231: storage circuit, 232: transistor, 233: transistor, 234: transistor, 235: capacitor, 242: transistor, 243: transistor, 244: transistor, 245: transistor, 271: signal adjustment portion, 311: substrate, 313: semiconductor region, 314*a*: low-resistance region, 314*b*: low-resistance region, 314: low-resistance region, 315: insulating layer, 316: conductive layer, 320: insulating layer, 322: insulating layer, 324: insulating layer, 326: insulating layer, 328: conductive layer, 330: conductive layer, 350: insulating layer, 351: conductive layer, 352: conductive layer, 353: insulating layer, 354: insulating layer, 355: conductive layer, 356: insulating layer, 357: insulating layer, 358: insulating layer, 359: insulating layer, 361: conductive layer, 362: opening, 363: semiconductor layer, 364: insulating layer, 365: conductive layer, 366: insulating layer, 367: insulating layer, 368: conductive layer, 371: insulating layer, 372: insulating layer, 382: insulating layer, 384: insulating layer, 386: conductive layer, 386*b*: conductive layer, 400: transistor, 500: functional circuit, 500_1: functional circuit, 500_2: functional circuit, 500*a*: region, 500*b*: region, 501: transistor, 502: transistor, 510: region, 511: element region, 512: element region, 522: gate wiring, 523: VDD wiring, 524: VSS wiring, 525: VDDHS wiring, 527: wiring, 528: wiring, 542: opening, 543: opening, 544: opening, 546: opening, 548: opening, 551: region, 552: region, 561: element region, 562: element region, 700: electronic component, 901: functional circuit, 902: functional circuit, 5200: portable game machine, 5201: housing, 5202: display portion, 5203: button, 5300: desktop information terminal, 5301: main body, 5302: display portion, 5303: keyboard, 5400: ICD main body, 5401: battery, 5402: wire, 5403: wire, 5404: antenna, 5405: subclavian vein, 5406: superior vena cava, 5500: information terminal, 5510: housing, 5511: display portion, 5600: computer, 5610: rack, 5620: computer, 5621: PC card, 5622: board, 5623: connection terminal, 5624: connection terminal, 5625: connection terminal, 5626: semiconductor device, 5627: semiconductor device, 5628: semiconductor device, 5629: connection terminal, 5630: motherboard, 5631: slot, 5700: motor vehicle, 5800: electric refrigerator-freezer, 5801: housing, 5802: refrigerator door, 5803: freezer door, 5900: information terminal, 5901: housing, 5902: display portion, 5903: operation switch, 5904: operation switch, 5905: band, 6240: digital camera, 6241: housing, 6242: display portion, 6243: operation switch, 6244: shutter button, 6246: lens, 6300: video camera, 6301: first housing, 6302: second housing, 6303: display portion, 6304: operation switch, 6305: lens, 6306: joint, 6800: artificial satellite, 6801: body, 6802: solar panel, 6803: antenna, 6804: planet, 6805: secondary battery, 6807: control device, 7500: stationary game machine, 7520: main body, 7522: controller This application is based on Japanese Patent Application Serial No. 2022-177161 filed on Nov. 4, 2022, and Japanese Patent Application Serial No. 2023-007017 filed on Jan. 20, 2023, the entire contents of each are hereby incorporated herein by reference.

The invention claimed is:

1. A semiconductor device comprising:

a level shifter, a signal adjustment portion, a first register group comprising a plurality of first registers, and a second register group comprising a plurality of second registers, wherein the signal adjustment portion comprises a first buffer circuit and a second buffer circuit, wherein each of the plurality of first registers comprises a first scan flip-flop and a first storage circuit, wherein each of the plurality of second registers comprises a second scan flip-flop and a second storage circuit, wherein an output terminal of the level shifter is electrically connected to an input terminal of the first buffer circuit, wherein an output terminal of the first buffer circuit is electrically connected to an input terminal of the second buffer circuit and the first register group, wherein an output terminal of the second buffer circuit is electrically connected to the second register group, wherein the level shifter is configured to generate a second signal by boosting a first signal and to output the second signal, wherein the first buffer circuit is configured to generate and to output a third signal using the second signal, wherein the first register group is configured to save, in the first storage circuit, first data retained in the first scan flip-flop in each of the plurality of first registers using the third signal, wherein the second buffer circuit is configured to generate and to output a fourth signal using the third signal, and wherein the second register group is configured to save, in the second storage circuit, second data retained in the second scan flip-flop in each of the plurality of second registers using the fourth signal.

2. The semiconductor device according to claim 1, wherein in each of the plurality of first registers, the first storage circuit comprises a first transistor comprising an oxide semiconductor in a semiconductor layer, wherein in each of the plurality of second registers, the second storage circuit comprises a second transistor comprising an oxide semiconductor in a semiconductor layer, wherein the output terminal of the first buffer circuit is electrically connected to a gate of the first transistor in each of the plurality of first registers, and wherein the output terminal of the second buffer circuit is electrically connected to a gate of the second transistor in each of the plurality of second registers.

3. A method for operating a semiconductor device comprising:

a power management unit, a signal adjustment portion, and a register group comprising a plurality of registers, wherein the signal adjustment portion comprises a buffer circuit, a first transistor, and a second transistor, and wherein each of the plurality of registers comprises a scan flip-flop and a storage circuit, the method for operating the semiconductor device comprising:

a first step of turning on the first transistor and stating power supply to the buffer circuit;

a second step of outputting a first signal to the register group by the power management unit through the buffer circuit and saving, in the storage circuit, data retained in the scan flip-flop in each of the plurality of registers;

a third step of turning on the second transistor and supplying a second signal that is a low-potential level, in each of the plurality of registers included in the register group, to the storage circuit; and a fourth step of turning off the first transistor and stopping power supply to the buffer circuit.

4. The method for operating the semiconductor device according to claim 3, wherein in each of the plurality of registers, the storage circuit comprises a third transistor comprising an oxide semiconductor in a semiconductor layer, and wherein in the third step, in each of the plurality of registers, the second signal is supplied to a gate of the third transistor included in the storage circuit.

5. The method for operating the semiconductor device according to claim 3, wherein one of a source and a drain of the second transistor is electrically connected to an output terminal of the buffer circuit, and wherein the other of the source and the drain of the second transistor is supplied with a potential that is a low-potential level in the first step to the fourth step.

6. A method for operating a semiconductor device comprising:

a power management unit, a signal adjustment portion, and a register group comprising a plurality of registers, wherein the signal adjustment portion comprises a buffer circuit, a first transistor, and a second transistor, and wherein each of the plurality of registers comprises a scan flip-flop and a storage circuit, the method for operating the semiconductor device comprising:

a first step of turning on the first transistor and starting power supply to the buffer circuit;

a second step of outputting a first signal to the register group by the power management unit through the buffer circuit and saving, in the storage circuit, data retained in the scan flip-flop in each of the plurality of registers included in the register group;

a third step of turning on the second transistor and supplying a second signal that is a low-potential level, in each of the plurality of registers included in the register group, to the storage circuit;

a fourth step of turning off the first transistor and stopping power supply to the buffer circuit;

a fifth step of turning on the first transistor and starting power supply to the buffer circuit;

a sixth step of turning off the second transistor;

a seventh step of outputting a third signal to the register group by the power management unit through the buffer circuit and reading out the data saved in the storage circuit to the scan flip-flop in each of the plurality of registers included in the register group; and an eighth step of turning off the first transistor and stopping power supply to the buffer circuit.

7. The method for operating the semiconductor device according to claim 6, wherein in each of the plurality of registers included in the register group, the storage circuit comprises a third transistor comprising an oxide semiconductor in a semiconductor layer, a fourth transistor comprising an oxide semiconductor in a semiconductor layer, and a capacitor, wherein one electrode of the capacitor is electrically connected to one of a source and a drain of the third transistor and one of a source and a drain of the fourth transistor, wherein in the third step, the first signal is supplied to a gate of the third transistor included in the storage circuit in each of the plurality of registers, and wherein in the seventh step, the third signal is supplied to a gate of the fourth transistor included in the storage circuit in each of the plurality of registers included in the register group.

8. The method for operating the semiconductor device according to claim 6, wherein one of a source and a drain of the second transistor is electrically connected to an output terminal of the buffer circuit, and wherein the other of the source and the drain of the second transistor is supplied with a potential that is a low-potential level in the first step to the eighth step.

9. A semiconductor device comprising:

a first layer and a second layer stacked over the first layer, wherein the first layer comprises a functional circuit comprising a first region, a first wiring comprising a region extending in a first direction, and a second wiring comprising a region extending in the first direction, wherein the functional circuit comprises a first transistor and a second transistor each comprising silicon in a semiconductor layer and a third wiring, wherein the first region is between the first wiring and the second wiring in a top view, wherein the first transistor comprises a first channel formation region and a first low-resistance region functioning as one of a source and a drain, wherein the second transistor comprises a second channel formation region, wherein the first low-resistance region overlaps with the third wiring, wherein one or more of the first channel formation region and the second channel formation region are in the first region, wherein the second layer comprises a storage circuit, wherein the storage circuit comprises a third transistor comprising an oxide semiconductor in a semiconductor layer, wherein the first layer or the second layer comprises a fourth transistor, wherein a gate of the first transistor is electrically connected to a gate of the second transistor, wherein the one of the source and the drain of the first transistor is electrically connected to the third wiring, wherein one of a source and a drain of the second transistor is electrically connected to the second wiring, wherein the other of the source and the drain of the first transistor, the other of the source and the drain of the second transistor, and a gate of the third transistor are electrically connected to one another, wherein one of a source and a drain of the fourth transistor is electrically connected to the third wiring, and wherein a first high power supply potential is supplied to the first wiring, a low power supply potential is supplied to the second wiring, and a second high power supply potential higher than the first high power supply potential is supplied to the other of the source and the drain of the fourth transistor.

10. The semiconductor device according to claim 9, wherein a first insulating layer is over the first low-resistance region, wherein the third wiring is over the first insulating layer, and wherein the first low-resistance region is electrically connected to the third wiring through a first plug provided in a first opening of the first insulating layer in a region overlapping with the third wiring.

11. The semiconductor device according to claim 9, wherein the first layer comprises a second functional circuit, wherein the second functional circuit comprises a second region placed between the first wiring and the second wiring in the top view, wherein the first region and the second region are adjacent to each other, wherein the second functional circuit comprises an element region, and wherein the element region is electrically connected to the first wiring.

* * * * *